United States Patent
Nakanotani et al.

(10) Patent No.: US 10,490,750 B2
(45) Date of Patent: Nov. 26, 2019

(54) ORGANIC ELECTROLUMINESCENT DEVICE, DEVICE ARRAY, METHOD FOR PRODUCING ORGANIC ELECTROLUMINESCENT DEVICE, METHOD FOR CONTROLLING EMISSION WAVELENGTH OF ORGANIC ELECTROLUMINESCENT DEVICE

(71) Applicant: KYUSHU UNIVERSITY, NATIONAL UNIVERSITY CORPORATION, Fukuoka-shi, Fukuoka (JP)

(72) Inventors: Hajime Nakanotani, Fukuoka (JP); Taro Furukawa, Fukuoka (JP); Chihaya Adachi, Fukuoka (JP)

(73) Assignee: KYUSHU UNIVERSITY, NATIONAL UNIVERSITY CORPORATION, Fukuoka-Shi, Fukuoka (JP)

( * ) Notice: Subject to any disclaimer, the term of this patent is extended or adjusted under 35 U.S.C. 154(b) by 0 days.

(21) Appl. No.: 16/069,305

(22) PCT Filed: Dec. 16, 2016

(86) PCT No.: PCT/JP2016/087494
§ 371 (c)(1),
(2) Date: Jul. 11, 2018

(87) PCT Pub. No.: WO2017/122492
PCT Pub. Date: Jul. 20, 2017

(65) Prior Publication Data
US 2019/0036033 A1    Jan. 31, 2019

(30) Foreign Application Priority Data

Jan. 14, 2016  (JP) .................... 2016-005044

(51) Int. Cl.
*H01L 51/00* (2006.01)
*H01L 51/50* (2006.01)
(Continued)

(52) U.S. Cl.
CPC ...... *H01L 51/0059* (2013.01); *H01L 51/0067* (2013.01); *H01L 51/0072* (2013.01);
(Continued)

(58) Field of Classification Search
CPC ............ H01L 51/0059; H01L 51/0067; H01L 51/0072
See application file for complete search history.

(56) References Cited

U.S. PATENT DOCUMENTS

2005/0242346 A1  11/2005  Forrest
2009/0242877 A1*  10/2009  Kondakov .......... H01L 51/0052
                                                                257/40

FOREIGN PATENT DOCUMENTS

CN      104916780 A     9/2015
EP      1672962 A       6/2006
(Continued)

OTHER PUBLICATIONS

Japanese and English version of International Preliminary Report on Patentability of Chapter I, i.e., International Search Opinion dated Mar. 21, 2017, in corresponding PCT International appl. No. PCT/JP2016/087494.
(Continued)

*Primary Examiner* — Yu-Hsi D Sun
(74) *Attorney, Agent, or Firm* — Browdy and Neimark, PLLC

(57) ABSTRACT

An organic electroluminescent device having a donor layer containing a donor compound, a spacer layer containing a spacer compound, and an acceptor layer containing an acceptor compound in that order, wherein the donor com-
(Continued)

pound and the acceptor compound are compounds to form an exciplex to radiate delayed fluorescence, and the excited triplet energy of the spacer compound is higher than the excited triplet energy of the exciplex, can be controlled to have different emission wavelengths not requiring change of the combination of the donor compound and the acceptor compound therein.

21 Claims, 10 Drawing Sheets

(51) Int. Cl.
  H05B 33/10 (2006.01)
  H01L 51/52 (2006.01)
  H01L 51/56 (2006.01)
(52) U.S. Cl.
  CPC .......... *H01L 51/50* (2013.01); *H01L 51/5004* (2013.01); *H01L 51/5016* (2013.01); *H01L 51/5044* (2013.01); *H01L 51/5092* (2013.01); *H01L 51/5096* (2013.01); *H01L 51/5206* (2013.01); *H01L 51/5221* (2013.01); *H01L 51/56* (2013.01); *H05B 33/10* (2013.01); *H01L 51/5056* (2013.01); *H01L 51/5072* (2013.01)

(56) References Cited

FOREIGN PATENT DOCUMENTS

| JP | 2005530320 A | 10/2005 |
|---|---|---|
| JP | 2012193352 A | 10/2012 |
| WO | 03/107452 A1 | 12/2003 |
| WO | 2008/143791 A1 | 11/2008 |
| WO | 2010/019499 A1 | 2/2010 |
| WO | 2015041157 A1 | 3/2015 |

OTHER PUBLICATIONS

International Search Report and Search Opinion, dated Mar. 22, 2017, in corresponding PCT International appl. No. PCT/JP2016/087494.

Sajoto et al., Blue and near-UV phosphorescence fromIridium complexes with cyclomeatlated pyrazolyl or N-heterocyclic carbene ligands, Inorg. Chem, 44(22):7992-8003 (2005).

Yin et al., current-voltage characteristics of organic heterostructure devices with insulating spacer layers, Organic Electronics, 24:26-29 (2015).

Yue et al., Optical simulation and optimization of weak-microcavity tandem white organic light-emitting diodes, Jormal of Applied Physics, 116:153102-153102-8 (2014).

Zhou et al., Host to guest energy transfer mechanism in phosphorescent ad fluorescent organic light-emitting devices utilizing exciplex-forming host, The Journal of Physical Chemistry, 118:24006-24012 (2014).

Extended European Search Report dated Aug. 5, 2019 issued in the corresponding European patent application No. 16885094.9.

Sebastian Reineke et al., "Room temperature triplet state spectroscopy of organic semiconductors", University Library, Oline Library Cornell University Ithaca,14853, (Oct. 11, 2013), XP081342996.

Yan Fei et al., "Organic light emitting diodes with a spacer enhanced exciplex emission", Applied Physics Letters, A I P Publishing LLC, vol. 4, No. 15 (Apr. 14, 2014), XP012184658.

Office Action dated May 17, 2019 issued in the corresponding Chinese patent application No. 201680078849.8 with its English Machine Translation.

Yan Fei et al., "Organic light emitting diodes with a spacer enhanced exciplex emission", Applied Physics Letters, A I P Publishing LLC, vol. 4, No. 15 (Apr. 4, 2014), XP012184658.

\* cited by examiner (a)

(b)

ORGANIC ELECTROLUMINESCENT DEVICE, DEVICE ARRAY, METHOD FOR PRODUCING ORGANIC ELECTROLUMINESCENT DEVICE, METHOD FOR CONTROLLING EMISSION WAVELENGTH OF ORGANIC ELECTROLUMINESCENT DEVICE

TECHNICAL FIELD

The present invention relates to an organic electroluminescent device capable of readily controlling emission wavelength, a device array using the organic electroluminescent device, a method for producing an organic electroluminescent device, and a method for controlling the emission wavelength of an organic electroluminescent device.

BACKGROUND ART

Studies for enhancing emission efficiency of an organic electroluminescent device (organic EL device) are made actively. In particular, studies of development of new light-emitting materials for efficient emission are made variously. Among them, a light-emitting material using an exciplex formed of a combination of an acceptor compound and a donor compound has a possibility dial, by combining a suitable acceptor compound and a suitable donor compound, the energy difference $\Delta E_{st}$ between an excited triplet energy level and an excited singlet energy level can be reduced as compared with a light-emitting material having an acceptor and a donor in one and the same molecule, and use of the exciplex as a delayed fluorescent material is now under investigation.

For example, PTL 1 proposes a delayed fluorescent material containing a mixture of an acceptor compound and a donor compound in which the degree and the relationship of the excited triplet energy $T_1^A$ and $|LUMO^A|$ of the acceptor compound, the excited triplet energy $T_1^D$ and $|HOMO^D|$ of the donor compound, and the excited singlet energy $S_1$ of the exciplex are specifically defined. This patent reference confirms high emission efficiency of the light-emitting device using the delayed fluorescent material.

CITATION LIST

Patent Literature

PTL 1: JP-2012-193352A

SUMMARY OF INVENTION

Technical Problem

As described in PTL 1, the conventional light-emitting material to form an exciplex is composed of a mixture of a donor compound and an acceptor compound, and in the case where it is applied to a light-emitting device, a donor compound and an acceptor compound are made to exist in one and the same layer for light emission. This is because of the common knowledge that, for forming an exciplex between a donor compound and an acceptor compound, the compounds are needed to be physically near to each other. However, for controlling the emission wavelength (color tone) in the light-emitting device having the constitution, there is not any other way than that of changing the combination of the donor compound and the acceptor compound, and specifically, repeated investigations of obtaining or synthesizing a large variety of compounds, producing light-emitting devices under the conditions suitable for those compounds, and measuring the emission wavelength are needed, and therefore enormous time and labor are needed. In addition, the combination of compounds capable of forming an exciplex is limited, and therefore, even though such investigations could be made, it would be still difficult to adjust a desired color tone.

Given the situation, for solving such prior-art problems, the present inventors have further made assiduous studies for the purpose of providing an organic electroluminescent device capable of obtaining high emission efficiency and capable of adjusting different emission wavelengths even though the combination of a donor compound and an acceptor compound therein is not changed.

Solution to Problem

For solving the above-mentioned problems, the present inventors have made for the first time investigations of an innovative layer configuration of a device with an unconventional idea. As a result of such investigations, the present inventors have obtained a finding not anticipatable from any conventional common knowledge, which is such that even though a donor compound and an acceptor compound are made to exist in different layers, an exciplex can be formed, and additionally have found that delayed fluorescence can be efficiently radiated from the resultant laminate. Further, the inventors have tried arranging a spacer layer between the layer containing a donor compound and the layer containing an acceptor compound and changing the thickness of the spacer layer, and have reached a surprising finding that the emission wavelength varies depending on the thickness, and even though the combination of the donor compound and the acceptor compound is not changed, the emission wavelength can be controlled by adjusting the thickness of the spacer layer. The present invention has been proposed on the basis of these findings, and specifically has the following constitution.

[1] An organic electroluminescent device having a donor layer containing a donor compound, a spacer layer containing a spacer compound, and an acceptor layer containing an acceptor compound in that order, wherein the donor compound and the acceptor compound are compounds to form an exciplex to radiate delayed fluorescence, and the excited triplet energy of the spacer compound is higher than the excited triplet energy of the exciplex.

[2] The organic electroluminescent device according to [1], wherein the thickness of the spacer layer is 10 nm or less.

[3] The organic electroluminescent device according to [1] or [2], wherein the acceptor compound and the donor compound satisfy the requirements represented by the following expressions (1) to (4);

$$T_1^A - S_1 > 0.2 \text{ eV} \qquad \text{Expression (1)}$$

$$T_1^D - S_1 \geq 0.2 \text{ eV} \qquad \text{Expression (2)}$$

$$|LUMO^A| > 2.0 \text{ eV} \qquad \text{Expression (3)}$$

$$|HOMO^D| \leq 5.3 \text{ eV} \qquad \text{Expression (4)}$$

[In the above expressions, $T_1^A$ represents an excited triplet energy defined by the peak wavelength on the short wavelength side in the phosphorescence spectrum of the acceptor compound; $T_1^D$ represents an excited triplet energy defined by the peak wavelength on the short wavelength side in the phosphorescence spectrum of the donor compound; $S_1$ represents an excited singlet energy of the exciplex defined by the peak wavelength in exciplex emission observed in the layer containing the acceptor compound and the donor compound in a molar ratio of 1/1; $LUMO^A$ represents an energy level of LUMO of the acceptor compound; and $HOMO^D$ represents an energy level of HOMO of the donor compound.]

[4] The organic electroluminescent device according to any one of [1] to [3], wherein, when the excited triplet energy of the exciplex defined by the peak wavelength on the short wavelength side in the phosphorescence spectrum of exciplex emission observed in the layer containing the acceptor compound and the donor compound in a molar ratio of 1/1 is represented by $T_1$, and when the excited triplet energy defined by the peak wavelength on the short wavelength side in the phosphorescence spectrum of the spacer compound is represented by $T_1^S$, the excited triplet energy difference $(T_1-T_1^S)$ is −0.01 to −0.5 eV.

[5] The organic electroluminescent device according to any one of [1] to [4], wherein the difference between the excited singlet energy $S_1$ and the excited triplet energy $T_1$ of the exciplex, $\Delta E_{st}$ is 0.01 to 0.3 eV.

[6] The organic electroluminescent device according to any one of [1] to [5], wherein the HOMO level of the spacer compound is lower than the HOMO level of the donor compound, and the LUMO level of the spacer compound is higher than the LUMO level of the acceptor compound.

[7] The organic electroluminescent device according to any one of [1] to [6], wherein the donor compound is a compound represented by the following formula (1) or a derivative of the compound represented by the following formula (1), and the acceptor compound is a compound represented by the following formula (2) or a derivative of the compound represented by the following formula (2), and wherein the derivative is a concept that includes compounds having the same skeleton where the hydrogen atom is substituted with a substituent, preferably a concept that includes compounds substituted with a non-reactive substituent, and more preferably a concept that include only compounds whose molecular weight is not more than 2 times that of the original compound:

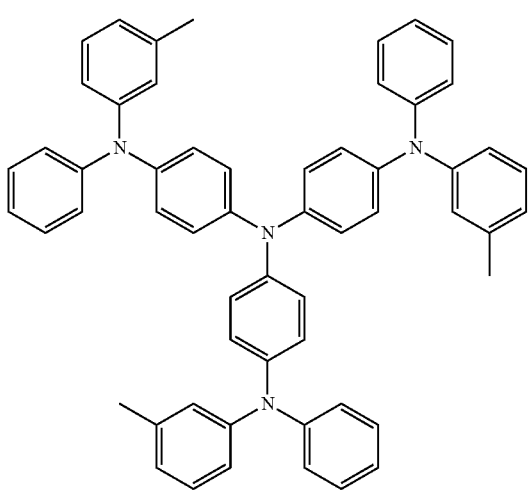

(1)

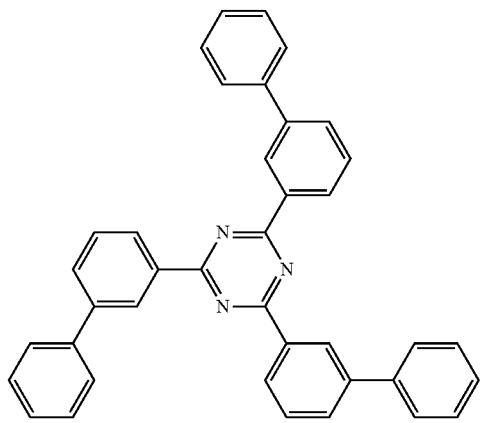

(2)

[8] The organic electroluminescent device according to any one of [1] to [7], wherein the spacer compound is a compound represented by the following formula (3) or a derivative of the compound represented by the following formula (3):

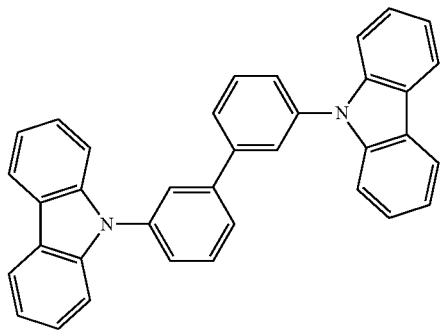

(3)

[9] The organic electroluminescent device according to any one of [1] to [8], wherein the spacer layer has a multilayer structure.

[10] The organic electroluminescent device according to any one of [1] to [9], wherein the spacer layer contains a light-emitting layer, and the light-emitting layer emits light.

[11] The organic electroluminescent device according to any one of [1] to [9], wherein, by changing the thickness of the spacer layer, the emission wavelength varies.

[12] The organic electroluminescent device according to any one of [1] to [9], wherein, by changing the thickness of the spacer layer, the emission wavelength varies at least within a range of 5 to 100 nm.

[13] The organic electroluminescent device according to any one of [1] to [12], wherein the external quantum efficiency at 50 cd/m² is larger than that of an organic electroluminescent device having the same configuration but not having a spacer layer.

[14] A device array containing two or more kinds of organic electroluminescent devices each having a donor layer containing a donor compound, a spacer layer containing a spacer compound, and an acceptor layer containing an acceptor compound in that order, wherein the donor compound and the acceptor compound are compounds to form an exciplex to radiate delayed fluorescence, and the excited triplet energy of the spacer compound is higher than the excited triplet energy of the exciplex, and wherein the two or more kinds of organic electroluminescent devices differ from each other in the thickness of the spacer layer therein.

[15] The device array according to [14], wherein the donor compounds used in the two or more kinds of electroluminescent devices are the same.

[16] The device array according to [14] or [15], wherein the acceptor compounds used in the two or more kinds of electroluminescent devices are the same.

[17] The device array according to any one of [14] to [16], wherein the spacer compounds used in the two or more kinds of electroluminescent devices are the same.

[18] The device array according to any one of [14] to [17], wherein the two or more, kinds of electroluminescent devices are entirely the same in the configuration of the donor layer, the spacer layer and the acceptor layer except for the thickness of the spacer layer.

[19] The device array according to any one of [14] to [18], wherein the two or more kinds of organic electroluminescent devices differ from each other in the emission wavelength.

[20] The device array according to any one of [14] to [19], further having a substrate to support the two or more kinds of organic electroluminescent devices and wherein the two or more kinds of organic electroluminescent devices are arranged on the same substrate.

[21] The device array according to any one of [14] to [19], wherein the two or more kinds of organic electroluminescent devices each are individualized.

[22] A method for producing an organic electroluminescent device including layering a donor layer containing a donor compound, a spacer layer containing a spacer compound and an acceptor layer containing an acceptor compound in that order, wherein the donor compound and the acceptor compound are compounds to form an exciplex to radiate delayed fluorescence, and the excited triplet energy of the spacer compound is higher titan the excited triplet energy of the exciplex.

[23] The method for producing an organic electroluminescent device according to [22], wherein the thickness of the spacer layer is adjusted depending on the preset emission wavelength.

[24] An emission wavelength controlling method of controlling the wavelength emission of an organic electroluminescent device having a donor layer containing a donor compound, a spacer layer containing a spacer compound, and an acceptor layer containing an acceptor compound in that order, wherein the donor compound and the acceptor compound are compounds to form an exciplex to radiate delayed fluorescence, and the excited triplet energy of the spacer compound is higher than the excited triplet energy of the exciplex, and wherein the thickness of the spacer layer is adjusted to control the emission wavelength of the organic electroluminescent device.

[25] The emission wavelength controlling method according to [24], wherein the thickness of the spacer layer is adjusted within a range of 10 nm or less.

Advantageous Effects of Invention

The organic electroluminescent device of the present invention has a donor layer containing a donor compound, a spacer layer containing a spacer compound, and an acceptor layer containing an acceptor compound in that order, in which the donor compound, the spacer compound and the acceptor compound satisfy specific requirements, and therefore, the device can have a high emission efficiency, and can control the emission wavelength in a broad wavelength range merely by controlling the thickness of the spacer layer even though the combination of the donor compound and the acceptor compound is not changed. The device array of the present invention has two or more kinds of such organic electroluminescent devices, in which the thickness of the spacer layer differs in the different devices, and therefore the device array can emit two or more kinds of light differing in color tone, and can give various kinds of emission colors.

DESCRIPTION OF EMBODIMENTS

The contents of the present invention will be described in detail below. The constitutional elements may be described below with reference to representative embodiments and specific examples of the present invention, but the present invention is not limited to the embodiments and the examples. In the description, a numerical value range expressed using "to" denotes a range including numerical values before and after "to" as a minimum value and a maximum value, respectively.

<Organic Electroluminescent Device>

The organic electroluminescent device of the present invention has a donor layer containing a donor compound, a spacer layer containing a spacer compound, and an acceptor layer containing an acceptor compound in that order, wherein the donor compound and the acceptor compound are compounds to form an exciplex to radiate delayed fluorescence, and the excited triplet energy of the spacer compound is higher than the excited triplet energy of the exciplex.

In the organic electroluminescent device of the present invention, the donor compound and the acceptor compound are compounds to form an exciplex to radiate delayed fluorescence, and the excited triplet energy of the spacer compound is higher than the excited triplet energy of the exciplex, and therefore in the exciplex formed between the donor compound and the acceptor compound in this, there occurs reverse intersystem crossing from the excited triplet state to the excited singlet state at a high degree of probability. Consequently, the organic electroluminescent device can efficiently emit delayed fluorescence and can attain a high emission efficiency. In addition, a spacer layer exists between the donor compound and the acceptor compound that form the exciplex, and therefore, depending on the thickness of the spacer layer, the emission wavelength varies in a broad wavelength range. Consequently, the organic electroluminescent device can readily control the emission wavelength merely by controlling the thickness of the spacer layer even though the combination of the donor compound and the acceptor compound is not changed.

Hereinunder the constituent layers of the organic electroluminescent device are described.

[Donor Layer and Acceptor Layer]

Figure 1:
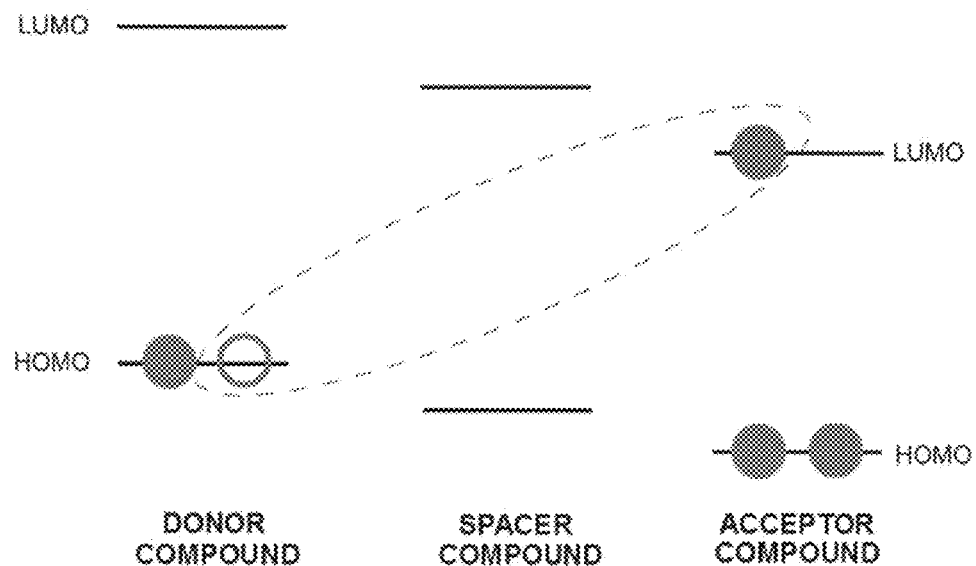
FIG. 1 This is a schematic view showing an image of interaction of a hole injected into a donor compound and an electron injected into an acceptor compound via a spacer layer, in the organic electroluminescent device of the present invention.

The donor layer is a layer containing a donor compound, and the acceptor layer is a layer containing an acceptor compound. The donor compound and the acceptor compound are compounds to form an exciplex to radiate delayed fluorescence. In the organic electroluminescent device of the present invention, when a hole is injected into HOMO of a donor compound and an electron is injected into LUMO of an acceptor compound, the hole and the electron move to the side of the spacer layer, as shown in FIG. 1. With that, it is considered that, owing to the energy blocking by the spacer layer, holes (radical cations) may accumulate in the interface between the donor layer and the spacer layer while electrons (radical anions) may accumulate in the interface between the acceptor layer and the spacer layer, and the holes and electrons accumulated in each interface may interact via the spacer to form an exciplex. At the exciplex, there occurs reverse intersystem crossing from the excited triplet state to the excited singlet state, and in restoring from the excited singlet state to the ground state, delayed fluorescence is radiated.

The donor compound and the acceptor compound are compounds that form an exciplex to radiate delayed fluorescence, and are preferably those satisfying the requirements expressed by the following expressions (1) to (4).

$T_1^A - S_1 > 0.2$ eV   Expression (1)

$T_1^D - S_1 \geq 0.2$ eV   Expression (2)

$|LUMO^A| > 2.0$ eV   Expression (3)

$|HOMO^D| \leq 5.3$ eV   Expression (4)

[In the above expressions, $T_1^A$ represents an excited triplet energy defined by the peak wavelength on the short wavelength side in the phosphorescence spectrum of the acceptor compound; $T_1^D$ represents an excited triplet energy defined by the peak wavelength on the short wavelength side in the phosphorescence spectrum of the donor compound; $S_1$ represents an excited singlet energy of the exciplex defined by the peak wavelength in exciplex emission observed in the layer containing the acceptor compound and the donor compound in a molar ratio of 1/1; $LUMO^A$ represents an energy level of LUMO (lowest unoccupied molecular orbital) of the acceptor compound; and $HOMO^D$ represents an energy level of HOMO (highest occupied molecular orbital) of the donor compound.]

(Acceptor Compound)

As described above, the acceptor compound to constitute the exciplex in the present invention is a compound satisfying the requirements of the expression (1) and the expression (3). Specifically, it is preferable that the excited triplet energy ($T_1^A$) defined by the peak wavelength on the short wavelength side in the phosphorescence spectrum of the acceptor compound is larger than the excited singlet energy ($S_1$) of the exciplex defined by the peak wavelength of exciplex emission, and that the difference therebetween is more than 0.2 eV. Preferably, the difference between the excited triplet energy ($T_1^A$) of the acceptor compound and the excited singlet energy ($S_1$) of the exciplex is more than 0.3 eV, more preferably more than 0.4 eV. The energy level of LUMO ($|LUMO^A|$) of the acceptor compound need to be more than 2.0 eV, and is preferably more than 2.5 eV. even more preferably more than 3.0 eV.

$$T_1^A - S > 0.2 \text{ eV} \qquad \text{Expression (1)}$$

$$|LUMO^A| \times 1.9 \text{ eV} \qquad \text{Expression (3)}$$

Preferred examples of the acceptor compound are compounds represented by the following general formulae [1] to [4].

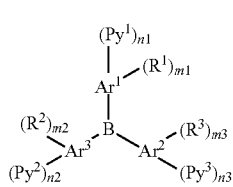

General Formula [1]

In the general formula [1], $Ar^1$, $Ar^2$ and $Ar^3$ each independently represents an aromatic hydrocarbon ring. $Ar^1$, $Ar^2$ and $Ar^3$ may be the same as or different from each other, but are preferably the same. The aromatic hydrocarbon ring that $Ar^1$, $Ar^2$ and $Ar^3$ may represent preferably has 1 to 22 carbon atoms, more preferably 1 to 14 carbon atoms, even more preferably 1 to 10 carbon atoms. For example, the ring includes a benzene ring, a naphthalene ring, an anthracene ring and a phenanthrene ring; a benzene ring and a naphthalene ring are preferred; and a benzene ring is more preferred.

In the general formula [1], $R^1$, $R^2$ and $R^3$ each independently represent a substituted or unsubstituted alkyl group, or a substituted or unsubstituted alkoxy group. $R^1$, $R^2$ and $R^3$ may be the same as or different from each other, but are preferably the same. $R^1$, $R^2$ and $R^3$ each bond to the aromatic hydrocarbon ring of $Ar^1$, $Ar^2$ and $Ar^3$ as a substituent to the ring.

The alkyl group that $R^1$, $R^2$ and $R^3$ may represent may be linear, branched or cyclic. A linear or branched alkyl group is preferred. The carbon number of the alkyl group is preferably 1 to 20, more preferably 1 to 12, even more preferably 1 to 6, further more preferably 1 to 3 (that is, a methyl group, an ethyl group, an n-propyl group, an isopropyl group). Examples of the cyclic alkyl group include a cyclopentyl group, a cyclohexyl group, and a cycloheptyl group. The alkyl group that $R^1$, $R^2$ and $R^3$ may represent may be substituted, and in that case, the substituent includes an alkoxy group, an aryl group and an aryloxy group. For the explanation and the preferred range of the alkoxy group as referred to herein, those described below for the alkoxy group that $R^1$, $R^2$ and $R^3$ may represent may be referred to. The aryl group referred to herein may be formed of one aromatic ring, or may have a condensed structure of two or more aromatic rings. The carbon number of the aryl group is preferably 6 to 22, more preferably 6 to 18, even more preferably 6 to 14, farther more preferably 6 to 10 (that is, 3 phenyl group, a 1-naphthyl group, a 2-naphthyl group). The aryloxy group as referred to herein may be formed of one aromatic ring, or may have a condensed structure of 2 or more aromatic rings. The carbon number of the aryloxy group is preferably 6 to 22, more preferably 6 to 18, even more preferably 6 to 14, further more preferably 6 to 10 (that is, a phenyloxy group, a 1-naphthyloxy group, a 2-naphthyloxy group).

The alkoxy group that $R^1$, $R^2$ and $R^3$ may represent may be linear, branched or cyclic. A linear or branched alkoxy group is preferred. The carbon number of the alkoxy group is preferably 1 to 20, more preferably 1 to 12, even more preferably 1 to 6, and further more preferably 1 to 3 (that is, a methoxy group, an ethoxy group, an n-propoxy group, an isopropoxy group). Examples of the cyclic alkoxy group include a cyclopentyloxy group, a cyclohexyloxy group, and a cycloheptyloxy group. The alkoxy group that $R^1$, $R^2$ and $R^3$ may represent may be substituted, and in the case, the substituent includes an alkoxy group, an aryl group and an aryloxy group. For the description and the preferred range of the alkoxy group, the aryl group and the aryloxy group, those given hereinabove may be referred to.

In the general formula [1], m1, m2 and m3 each independently represent an integer of 0 to 4. preferably an integer of 0 to 3. For example, when $Ar^1$, $Ar^2$ and $Ar^3$ each are a benzene ring, examples thereof include a tri-substituted form at the 2, 4 and 6-positions, a di-substituted form at the 3 and 5-positions, a mono substituted form at the 2-position, a mono-substituted form at 3-position, and a mono-substituted form at the 4-position, m1, m2 and m3 may be the same or different, but are preferably the same. When m1 is 2 or more, plural $R^1$'s existing in the molecule may be the same as or different from each other. The same shall apply to m2 and m3.

In the general formula [1], $Py^1$, $Py^2$ and $Py^3$ each independently represent a substituted or unsubstituted pyridyl group. $Py^1$, $Py^2$ and $Py^3$ may be the same or different, but are preferably the same. $Py^1$, $Py^2$ and $Py^3$ each bond to the aromatic hydrocarbon rings of $Ar^1$, $Ar^2$ and $Ar^3$, respectively, as a substituent bonding to the ring. The pyridyl group that $Py^1$, $Py^2$ and $Py^3$ may represent includes a 2-pyridyl group, a 3-pyridyl group and a 4-pyridyl group, and any of these are preferred, but above all, a 3-pyridyl group is more preferred. The pyridyl group may be further substituted or may not be substituted. In the case where the pyridyl group is substituted, examples of the substituent include an alkyl group and an alkoxy group, and for the description and the preferred range thereof, the corresponding description of $R^1$, $R^2$ and $R^3$ may be referred to.

In the general formula [1], n1, n2 and n3 each independently represent an integer of 1 to 3, preferably 1 or 2. For example, when $Ar^1$, $Ar^2$ and $Ar^3$ each are a benzene ring, examples thereof include a mono substituted form at the 3-position, and a di-substituted form at the 3 and 5-positions, n1, n2 and n3 may be the same or different, but are preferably the same. When n1 is 2 or more, plural $Py^1$'s existing in the molecule may be the same as or different from each other. The same shall apply to n2 and n3.

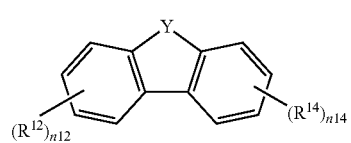

General Formula [2]

In the general formula [2], Y represents

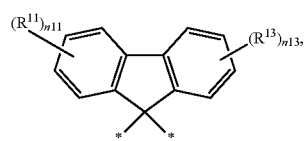

S (sulfur atom) or $SO_2$ (sulfonyl group). The mark * indicates the bonding position. Specifically, the general formula [2] includes three structures of the following general formulae [2-1], [2-2] and [2-3]. The structure represented by the general formula [2-2] is preferred.

General Formula [2-1]

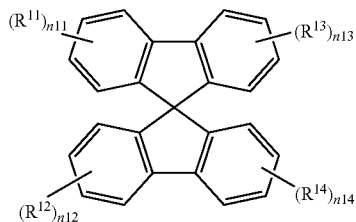

General Formula [2-2]

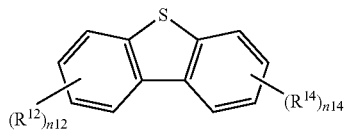

General Formula [2-3]

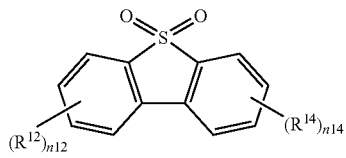

$R^{11}$, $R^{12}$, $R^{13}$ and $R^{14}$ each independently represent

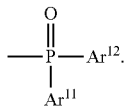

$Ar^{11}$ and $Ar^{12}$ each independently represent a substituted or unsubstituted aryl group. $Ar^{11}$ and $Ar^{12}$ may be the same or different, but are preferably the same. For the description and the preferred range of the substituted or unsubstituted aryl group, the corresponding description given to the general formula [1] may be referred to. A preferred example of $Ar^{11}$ and $Ar^{12}$ is a phenyl group. $R^{11}$, $R^{12}$, $R^{13}$ and $R^{14}$ may be the same or different, but are preferably the same.

In the general formula [2], n11, n12, n13 and n14 each independently represent an integer of 0 to 2, preferably 0 or 1. The total of n11, n12, n13 and n14 is 1 or more, preferably 1 to 4, more preferably 1 or 2. When the total is 2 or more, plural groups of

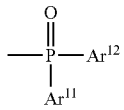

existing in the molecule may be the same or different, but are preferably the same.

$Z^{21}$—$(L^{21}$-$Py^{21})_{n21}$    General Formula [3]

In the general formula [3], $Z^{21}$ represents any of the following structures:

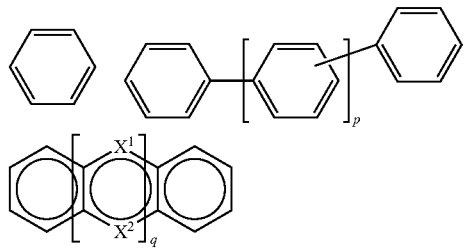

$X^1$ and $X^2$ are both —CH═, or $X^1$ is a single bond and $X^2$ is —CH═CH—, or $X^1$ is —CH═CH— and $X^2$ is a single bond. The ring skeleton containing $X^1$ and $X^2$ forms a benzene ring, p represents an integer of 0 to 3, and may be, for example, 0 or 1. q represents an integer of 0 to 3, and may be, for example, 0 or 1.

In the general formula [3], $L^{21}$ represents a substituted or unsubstituted arylene group. The arylene group referred to herein may be a group of one aromatic ring, or may have a condensed structure of 2 or more aromatic rings. The carbon number of the arylene group is preferably 6 to 22, more preferably 6 to 18, even more preferably 6 to 14, and further more preferably 6 to 10. More preferably, the group is a 1,3-phenylene group, a 1,4-phenylene group, a 1,5-naphthylene group, or a 2,6-naphthylene group, and especially preferably a 1,3-phenylene group or a 1,4-phenylene group. In the case where the arylene group is substituted, the substituent includes an alkyl group, an alkoxy group, an aryl group, and an aryloxy group. For the description and the preferred range of these groups, the corresponding description given to the general formula [1] may be referred to.

In the general formula [3], $Py^{21}$ represents a substituted or unsubstituted pyridyl group. For the description and the preferred range of the substituted or unsubstituted pyridyl group as referred to herein, the corresponding description given to the general formula [1] may be referred to.

In the general formula [3], n21 represents an integer of 2 to 6, preferably an integer of 2 to 4, more preferably 3 or 4. Plural ($L^{21}$-$Py^{21}$)'s existing in the molecule may be the same as or different from each other, but are preferably the same.

General Formula [4]

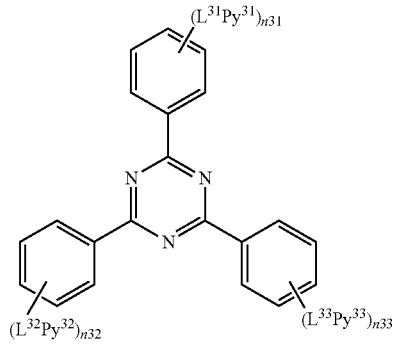

In the general formula [4], $L^{31}$, $L^{32}$ and $L^{33}$ each independently represent a single bond, or a substituted or unsubstituted arylene group. $L^{31}$, $L^{32}$ and $L^{33}$ may be the same or different, but are preferably the same. For the description and the preferred range of the substituted or unsubstituted arylene group as referred to herein, the corresponding description given to the general formula [3] may be referred to. For example, a 1,3-phenylene group may be employed.

In the general formula [4], $Py^{31}$, $Py^{32}$ and $Py^{33}$ each independently represent a substituted or unsubstituted pyridyl group. $Py^{31}$, $Py^{32}$ and $Py^{33}$ may be the same or different, but are preferably the same. For the description and the preferred range of the substituted or unsubstituted pyridyl group as referred to herein, the corresponding description given to the general formula [1] may be referred to.

In the general formula [4], n31, n32 and n33 each independently represent an integer of 1 to 3, preferably 1 or 2. Examples include a tri-substituted form at the 2, 4 and 6-positions, a di-substituted form at the 3 and 5-positions, a mono-substituted form at the 3-position, and a mono-substituted form at the 4-position. n31, n32 and n33 may be the same or different, but are preferably the same. When n31 is 2 or more, plural ($L^{31}$-$Py^{31}$)'s existing in the molecule may be the same as or different from each other, but are preferably the same. The same shall apply to n32 and n33.

The acceptor compound for use in the present invention is commercially available, or may be synthesized by adequately combining known synthesis methods.

Preferred examples of compounds that may be used as the acceptor compound in the present invention are shown below. Among the exemplified compounds given below, the compound 1, the compound 2, the compound 3, the compound 3', the compound 4, the compound 7 and the compound 8 are more preferred, the compound 1, the compound 2, the compound 3 and the compound 3' are even more preferred, the compound 1, the compound 3 and the compound 3' are further more preferred, and the compound 3' is most preferred. The range of the acceptor compound usable in the present invention should not be limitatively interpreted by the following specific examples.

1.

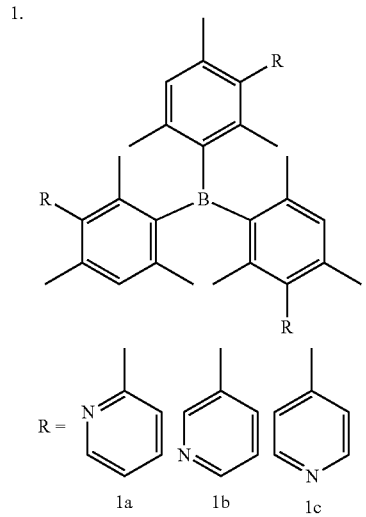

2.

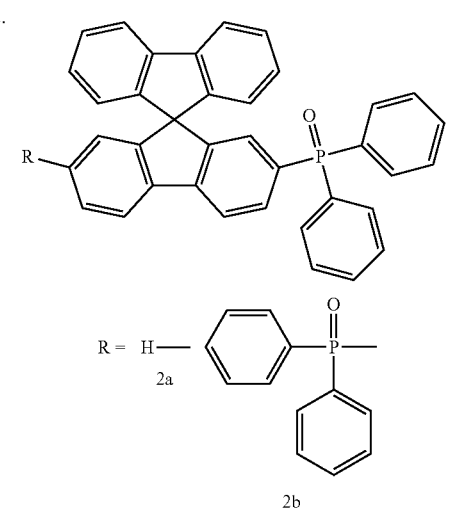

3.

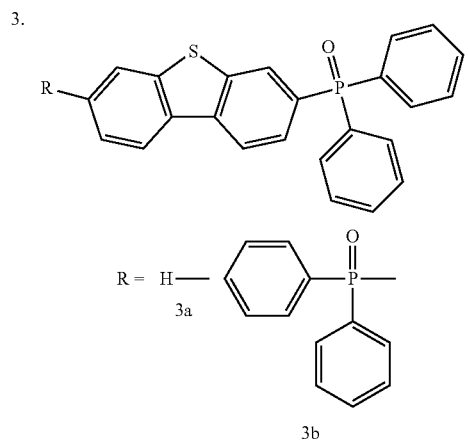

3'.

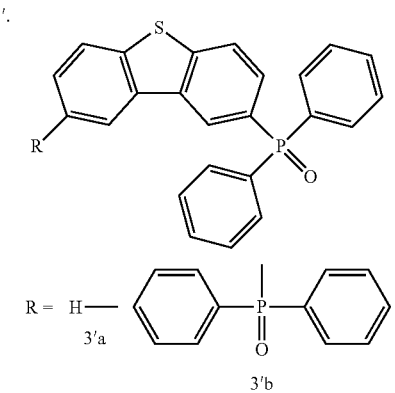

4.
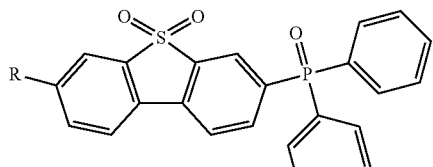
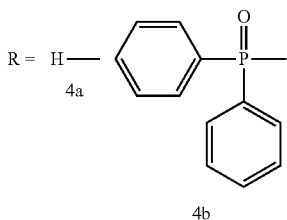
5.
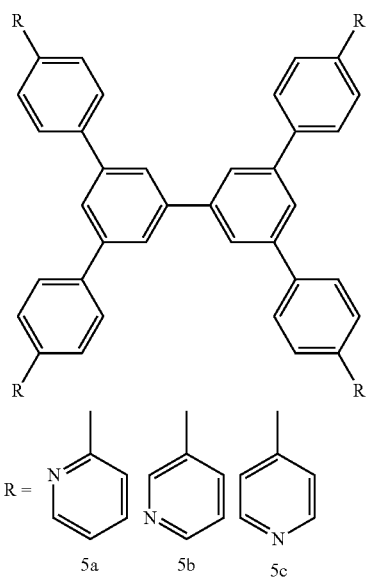
6.
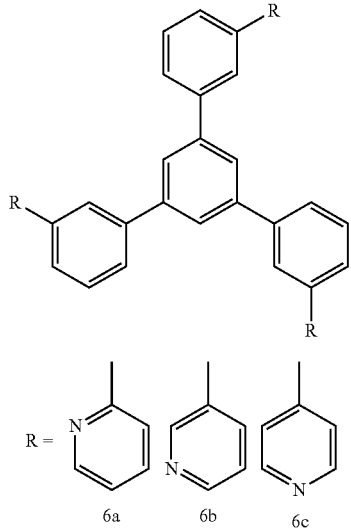
7.
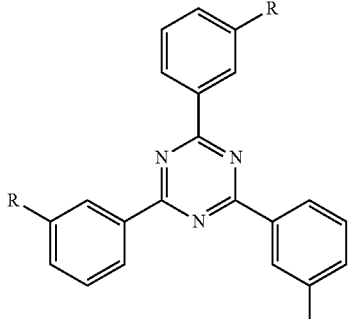
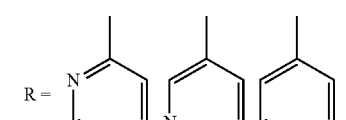
8.
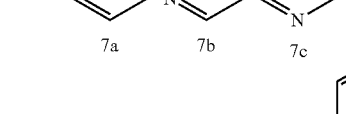
In addition to the compounds represented by the general formulae [1] to [4], the following compound is also preferably used as the acceptor compound.
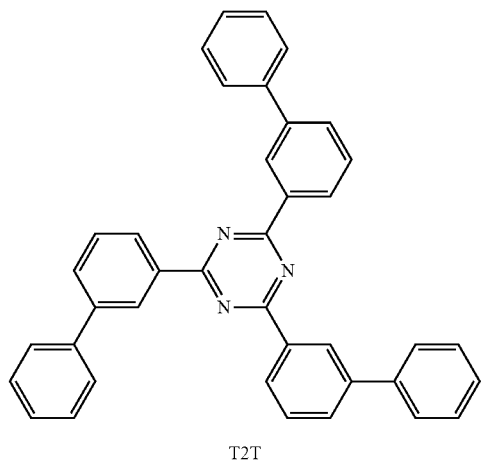
T2T (Donor Compound)

The donor compound to constitute the exciplex in the present invention is preferably a compound satisfying the requirements of the expressions (2) and (4). Specifically, it is preferable that the excited triplet energy ($T_1^D$) defined by the peak wavelength on the short wavelength side in the phosphorus spectrum of the donor compound is larger than the excited singlet energy ($S_1$) of the exciplex defined by the peak wavelength of the exciplex emission, and that the difference therebetween is 0.2 eV or more. The difference between the excited triplet energy ($T_1^D$) of the donor compound and the excited singlet energy ($S_1$) of the exciplex is preferably more than 0.3 eV, more preferably more than 0.4 eV. The energy level of HOMO ($|HOMO^D|$) of the donor compound need to be 5.3 eV or less, and is preferably less than 5.2 eV, more preferably less than 5.1 eV.

$$T_1^D - S_1 \geq 0.2 \text{ eV} \quad \text{Expression (2)}$$

$$|HOMO^D| \leq 5.3 \text{ eV} \quad \text{Expression (4)}$$

As preferred examples of the donor compound, compounds represented by the following general formulae [11] to [15] are exemplified.

3-position, and a mono-substituted form at the 4-position. When n51 is 2 or more, plural $R^{51}$'s existing in the molecule may be the same or different, but are preferably the same. When two of the plural $R^{51}$'s existing in the molecule bond to the neighboring carbon atoms of the benzene ring, the two $R^{51}$'s may bond to each other to form a linking group. When the two $R^{51}$'s bond to each other to form a linking group, a ring fused to the benzene ring is formed. The carbon number of the linking chain of the linking group formed by two $R^{51}$'s bonding to each other is preferably 3 to 5, more preferably 3 or 4. Examples of the linking group include an alkylene group and an alkenylene group. Preferred examples include —CH=CH—CH=CH—, and a liking group thereof where at least one of the four hydrogen atoms is substituted with a substituted or unsubstituted alkyl group or a substituted or unsubstituted alkoxy group. For the description and the preferred range of the substituted or unsubstituted alkyl group and the substituted or unsubstituted alkoxy group as referred to herein, the corresponding description given to the general formula [1] may be referred to. Regarding the description relating to n51, the same shall apply to n52, n53, n54, n55 and n56.

General Formula [11]

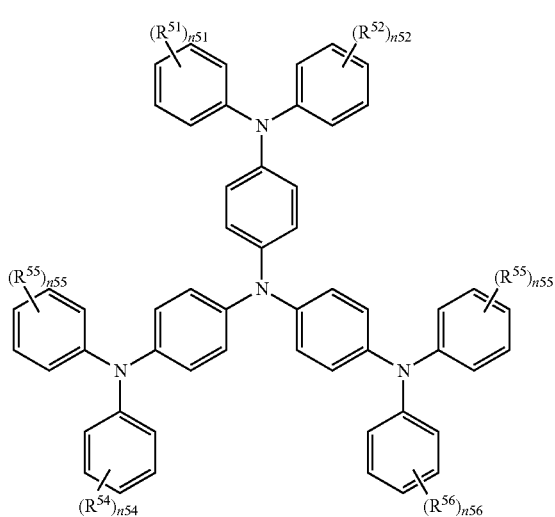

General Formula [12]

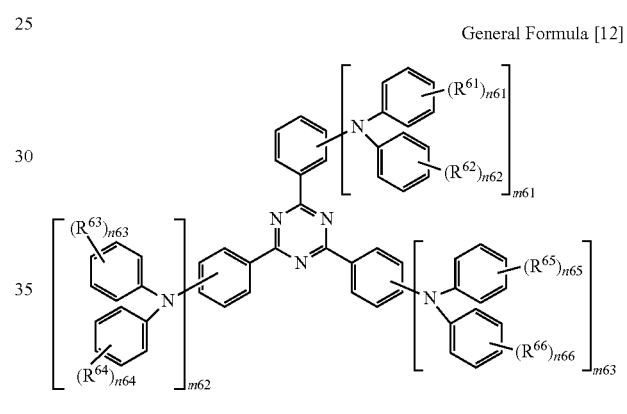

In the general formula [11], $R^{51}$, $R^{52}$, $R^{53}$, $R^{54}$, $R^{55}$ and $R^{56}$ each independently represent a substituted or unsubstituted alkyl group, or a substituted or unsubstituted alkoxy group. $R^{51}$, $R^{52}$, $R^{53}$, $R^{54}$, $R^{55}$ and $R^{56}$ may be the same or different, but are preferably the same. For the description and the preferred range of the substituted or unsubstituted alkyl group and the substituted or unsubstituted alkoxy group, the corresponding description given to the general formula [1] may be referred to.

In the general formula [11], n51, n52, n53, n54, n55 and n56 each independently represent an integer of 0 to 5, preferably an integer of 0 to 3, and more preferably an integer of 0 to 2. n51, n52, n53, n54, n55 and n56 may be the same or different, but preferably, n51, n53 and n55 are the same and n52, n54 and n56 are the same. For example, in a preferred example, n51, n53 and n55 are 1 or 2, and n52, n54 and n56 are 0. Examples of the substitution mode include a tri-substituted form at the 2,4 and 6-positions, a di-substituted form at the 3 and 5-positions, a mono-substituted form at the 2-position, a mono-substitute form at the In the general formula [12], $R^{61}$, $R^{62}$, $R^{63}$, $R^{64}$, $R^{65}$ and $R^{66}$ each independently represent a substituted or unsubstituted alkyl group, or a substituted or unsubstituted alkoxy group. $R^{61}$, $R^{62}$, $R^{63}$, $R^{64}$, $R^{65}$ and $R^{66}$ may be the same or different, but are preferably the same. For the description and the preferred range of the substituted or unsubstituted alkyl group and the substituted or unsubstituted alkoxy group, the corresponding description given to the general formula [1] may be referred to.

m61, m62 and m63 in the general formula [12] each independently represent 1 or 2. Examples include a di-substituted form at the 3 and 5-positions, a mono substituted form at the 3-position and a mono-substituted form at the 4-position. When m61 is 2 or more, plural groups of

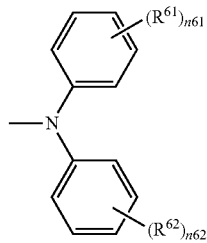

existing in the molecule may be the same as or different from each other, but are preferably the same. The same shall apply to m62 and m63. m61, m62 and m63 may be the same or different, but are preferably the same.

In the general formula [12], n61, n62, n63, n64, n65 and n66 each independently represent an integer of 0 to 5, preferably an integer of 0 to 3, more preferably an integer of 0 to 2. Examples include a tri-substituted form at the 2, 4 and 6-positions, a di-substituted form at the 3 and 5-positions, a mono-substituted form at the 2-position, a mono-substituted form at the 3-position, and a mono-substituted form at the 4-position. When n61 is 2 or more, plural $R^{61}$'s existing in the molecule may be the same as or different from each other, but are preferably the same. When two of the plural $R^{61}$'S existing in the molecule bond to the neighboring carbon atoms of the benzene ring, the two $R^{61}$'s may bond to each other to form a linking group. When the two $R^{61}$'s bond to each other to form a linking group, a ring fused to the benzene ring is formed. The carbon number of the linking chain of the linking group formed by two $R^{61}$'s bonding to each other is preferably 3 to 5, more preferably 3 or 4. Examples of the linking group include an alkylene group and an alkenylene group. Preferred examples include —CH=CH—CH=CH—, and a liking group thereof where at least one of the four hydrogen atoms is substituted with a substituted or unsubstituted alkyl group or a substituted or unsubstituted alkoxy group. For the description and the preferred range of the substituted or unsubstituted alkyl group and the substituted or unsubstituted alkoxy group as referred to herein, the corresponding description given to the general formula [1] may be referred to. Regarding the description relating to n61, the same shall apply to n62, n63, n64, n65 and n66. n61, n62, n63, n64, n65 and n66 may be the same or different, but are preferably the same.

General Formula [13]

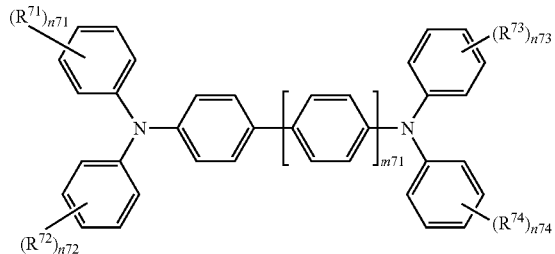

In the general formula [13], $R^{71}$, $R^{72}$, $R^{73}$ and $R^{74}$ each independently represent a substituted or unsubstituted alkyl group, a substituted or unsubstituted alkoxy group, or a group of the following:

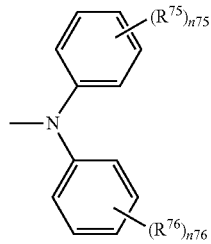

$R^{75}$ and $R^{76}$ each independently represent a substituted or unsubstituted alkyl group, or a substituted or unsubstituted alkoxy group. For the description and the preferred range of the substituted or unsubstituted alkyl group and the substituted or unsubstituted alkoxy group that $R^{71}$, $R^{72}$, $R^{73}$, $R^{74}$, $R^{75}$ and $R^{76}$ may represent, the corresponding description given to the general formula [1] may be referred to. $R^{71}$, $R^{72}$, $R^{73}$ and $R^{74}$ may be the same or different, but are preferably the same.

In the general formula [13], m71 represents 0 or 1, both of which are preferred.

In the general formula [13], n71, n72, n3, n74, n75 and n76 each independently represent an integer of 0 to 5, preferably an integer of 0 to 3, more preferably an integer of 0 to 2. Examples include a tri-substituted form at the 2, 4 and 6-positions, a di-substituted form at the 3 and 5-positions, a mono-substituted form at the 2-position, a mono-substituted form at the 3-position, and a mono-substituted form at the 4-position. When n71 is 2 or more, plural $R^{71}$'s existing in the molecule may be the same as or different from each other, but are preferably the same. When two of the plural $R^{71}$'s existing in the molecule bond to the neighboring carbon atoms of the benzene ring, the two $R^{71}$'s may bond to each other to form a linking group. When the two $R^{71}$'s bond to each other to form a linking group, a ring fused to the benzene ring is formed. The carbon number of the linking chain of the linking group formed by two $R^{71}$'s bonding to each other is preferably 3 to 5, more preferably 3 or 4. Examples of the linking group include an alkylene group and an alkenylene group. Preferred examples include —CH=CH—CH=CH—, and a liking group thereof where at least one of the four hydrogen atoms is substituted with a substituted or unsubstituted alkyl group or a substituted or unsubstituted alkoxy group. For the description and the preferred range of the substituted or unsubstituted alkyl group and the substituted or unsubstituted alkoxy group as referred to herein, the corresponding description given to the general formula [1] may be referred to. Regarding the description relating to n71, the same shall apply to n72, n73, n74, n75 and n76. n71, n72, n73 and n74 may be the same or different, but are preferably the same. n75 and n76 may be the same, but are preferably the same.

General Formula [14]

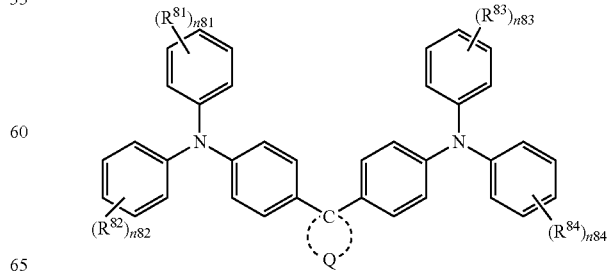

In the general formula [14], Q represents an atomic group necessary for forming a cyclic structure. Q is preferably a substituted or unsubstituted alkylene group, a substituted or unsubstituted alkenylene group, or a substituted or unsubstituted alkynylene group, more preferably a substituted or unsubstituted alkylene group or a substituted or unsubstituted alkenylene group, and even more preferably a substituted or unsubstituted alkylene group. The carbon number of Q is preferably 4 to 10, more preferably 5 to 8, even more preferably 5 to 7. Specific examples of Q include a butylene group, a pentylene group, a hexylene group and a butadienylene group. The substituent for the alkylene group, the alkenylene group and the alkynylene group that Q may represent includes an alkyl group, an alkoxy group, an aryl group and an aryloxy group. For the description and the preferred range of these substituents, the corresponding description given to the above-mentioned $R^1$, $R^2$ and $R^3$ may be referred to. Also preferably, the alkylene group, the alkenylene group and the alkynylene group that Q may represent are unsubstituted.

In the general formula [14], $R^{81}$, $R^{82}$, $R^{83}$ and $R^{84}$ each independently represent a substituted or unsubstituted alkyl group, or a substituted or unsubstituted alkoxy group. Regarding the description and the preferred range of the substituted or unsubstituted alkyl group and the substituted or unsubstituted alkoxy group that $R^{81}$, $R^{82}$, $R^{83}$ and $R^{84}$ may represent, the corresponding description given to the general formula [1] may be referred to.

In the general formula [14], n81, n82, n83 and n84 each independently represent an integer of 0 to 5, preferably an integer of 0 to 3, more preferably an integer of 0 to 2. Examples include a tri-substituted form at the 2, 4 and 6-positions, a di-substituted form at the 3 and 5-positions, a mono-substituted form at the 2-position, a mono-substituted form at the 1-position, and a mono-substituted form at the 4-position. When n81 is 2 or more, plural $R^{81}$'s existing in the molecule may be the same as or different from each other, but are preferably the same. When two of the plural $R^{81}$'s existing in the molecule bond to the neighboring carbon atoms of the benzene ring, the two $R^{81}$'s may bond to each other to form a linking group. When the two $R^{81}$'s bond to each other to form a linking group, a ring fused to the benzene ring is formed. The carbon number of the linking chain of the linking group formed by two $R^{81}$'s bonding to each other is preferably 3 to 5, more preferably 3 or 4. Examples of the linking group include an alkylene group and an alkenylene group. Preferred examples include —CH═CH—CH═CH—, and a liking group thereof where at least one of the four hydrogen atoms is substituted with a substituted or unsubstituted alkyl group or a substituted or unsubstituted alkoxy group. For the description and the preferred range of the substituted or unsubstituted alkyl group and the substituted or unsubstituted alkoxy group as referred to herein, the corresponding description given to the general formula [1] may be referred to. Regarding the description relating to n81, the same shall apply to n82, n83 and n84. n81, n82, n83 and n84 may be the same or different, but are preferably the same.

General Formula [15]

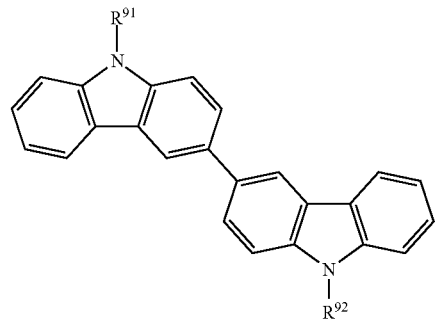

In the general formula [15], $R^{91}$ and $R^{92}$ each independently represent a substituted or unsubstituted alkyl group, or a substituted or unsubstituted aryl group. For the description and the preferred range of the alkyl group and the aryl group that $R^{91}$ and $R^{92}$ may represent, the corresponding description given to the general formula [1] may be referred to.

The donor compound for use in the present invention is commercially available, or may be synthesized by adequately combining known synthesis methods.

Hereinunder specific examples of compounds usable as the donor compound in the present invention are shown below (where Me represents a methyl group, and Et represents an ethyl group). Among the compounds exemplified below, the compound 11, the compound 12 and the compound 13 are more preferred, the compound 11 and the compound 12 are even more preferred, and the compound 12 is further more preferred.

The range of the donor compound for use in the present invention should not be limitatively interpreted by the following specific examples.

11.

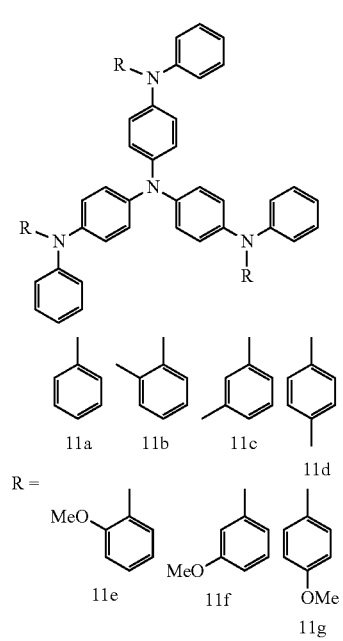

12.
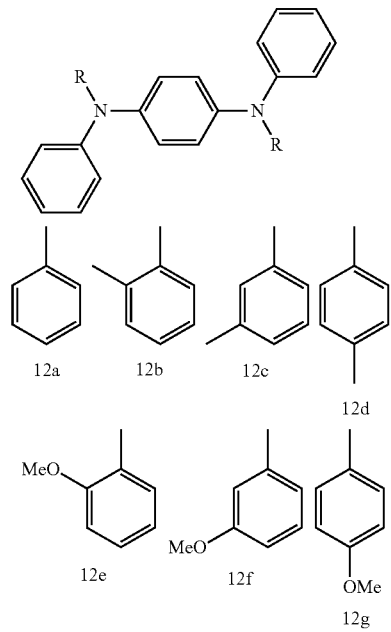
13.
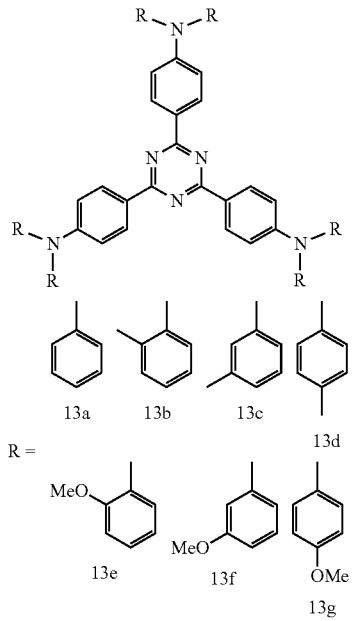
14.
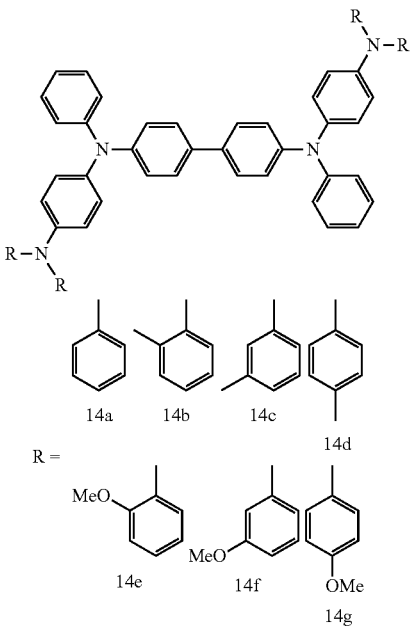
15.
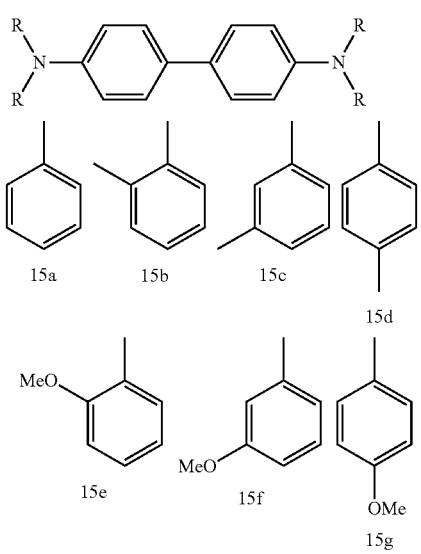

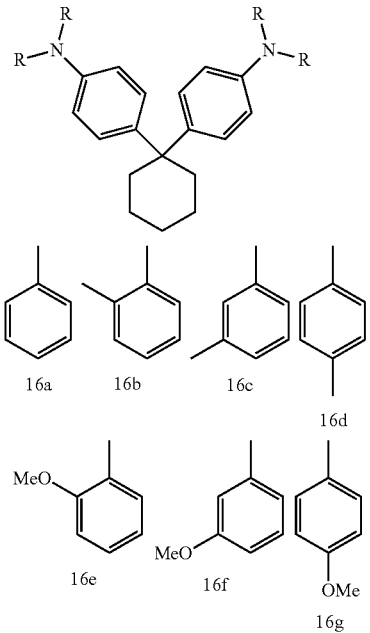

16.

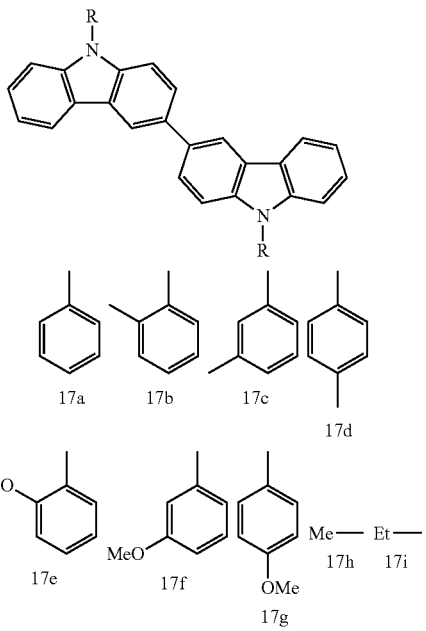

17.

As the donor compound, the following compound is also preferably used in addition to the compounds represented by the general formulae [11] to [15].

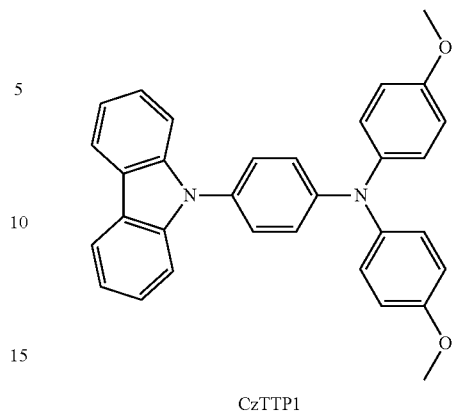

CzTTP1

(Combination of Acceptor Compound and Donor Compound)

The combination of the acceptor compound and the donor compound for use in the present invention is not specifically limited so far as it forms an exciplex to radiate delayed fluorescence. Preferred combinations of the acceptor compound and the donor compound are exemplified in the following Table. Especially preferred examples of the combination are the following 1, 3, 8, 11, 18, 37, and 38, and more preferred examples are 37 (donor compound: TTP, acceptor compound: PPT), and 38 (donor compound: dPT-BdA, acceptor compound: PPT). Further, a combination of the donor compound 11c (m-MTDATA) and the acceptor compound T2T, and a combination of the donor compound CzTTP1 and the acceptor compound PPT are also preferably used. The combination of 31 has a high singlet exciton generation efficiency of 65 to 100%, and the combination of 32 and the combination of CzTTP1 and PPT hardly undergo Dexter electron transfer of excited triplet energy, and therefore can secure high emission efficiency.

The difference between the excited singlet energy ($S_1$) and the excited triplet energy ($T_1$), $\Delta E_{st}$ (that is, $S_1$-$T_1$) of the donor compound and the acceptor compound is preferably 0.01 to 0.5 eV, more preferably 0.01 to 0.3 eV, even more preferably 0.01 to 0.2 eV. When $\Delta E_{st}$ of the exciplex falls within the above range, high emission efficiency can be attained.

TABLE 1

| Number of Exciplex | Acceptor Compound | Donor compound |
|---|---|---|
| 1 | 1b | 11a |
| 2 | 1b | 11b |
| 3 | 1b | 11c |
| 4 | 1b | 11d |
| 5 | 1b | 11e |
| 6 | 1b | 11f |
| 7 | 1b | 12a |
| 8 | 1b | 12c |
| 9 | 1b | 12d |
| 10 | 1b | 12f |
| 11 | 1b | 12g |
| 12 | 1b | 14c |
| 13 | 1b | 15g |
| 14 | 1a | 11c |
| 15 | 1c | 11c |

TABLE 1-continued

| Number of Exciplex | Acceptor Compound | Donor compound |
|---|---|---|
| 16 | 2a | 11a |
| 17 | 2a | 11b |
| 18 | 2a | 11c |
| 19 | 2a | 11d |
| 20 | 2a | 11e |
| 21 | 2a | 12c |
| 22 | 2a | 14c |
| 23 | 2a | 15g |
| 24 | 3b | 11a |
| 25 | 3b | 11b |
| 26 | 3b | 11c |
| 27 | 3b | 11d |
| 28 | 3b | 11e |
| 29 | 3b | 11f |
| 30 | 3b | 12a |
| 31 | 3b | 12c |
| 32 | 3b | 12d |
| 33 | 3b | 12f |
| 34 | 3b | 12g |
| 35 | 3b | 14c |
| 36 | 3b | 15g |
| 37 | 3'b | 12c |
| 38 | 3'b | 12d |

(Thickness of Donor Layer and Acceptor Layer)

The thickness of the donor layer and the acceptor layer is not specifically limited. Preferably, the thickness of the donor layer is 1 nm or more, more preferably 5 nm or more, even more preferably 10 nm or more. Also preferably, the thickness of fee donor layer is 100 nm or less, more preferably 75 nm or less, even more preferably 50 nm or less.

Preferably, the thickness of the acceptor layer is 1 nm or more, more preferably 5 nm or more, even more preferably 10 nm or more. Also preferably, the thickness of the acceptor layer is 100 nm or less, more preferably 75 nm or less, even more preferably 50 nm or less.

The thickness of the donor layer and the acceptor layer may be measured using an ellipsometer or a contact-type thickness meter.

[Spacer Layer]

The spacer layer is a layer containing a spacer compound.

The spacer compound is a compound having a higher excited triplet energy than the excited triplet energy ($T_1$) of the exciplex formed by the donor compound and the acceptor compound.

In the present invention, the "excited triplet energy of exciplex" means the excited triplet energy defined by the peak wavelength on the short wavelength side in the phosphorescence spectrum of exciplex emission observed in the layer containing the acceptor compound and the donor compound in a molar ratio of 1/1, and may be represented by "$T_1^S$".

In the present invention, the "excited triplet energy of spacer compound" means the excited triplet energy defined by the peak wavelength on the short wavelength side in the phosphorescence spectrum of the spacer compound, and may be represented by "$T_1^S$".

The excited triplet energy ($T_1^S$) of the spacer compound is higher titan the excited triplet energy ($T_1$) of the exciplex, and therefore the triplet exciton of the exciplex hardly moves toward the spacer layer so that the excited triplet energy can be efficiently utilized for delayed fluorescence radiation.

The difference between the excited triplet energy ($T_1^S$) of the spacer compound and the excited triplet energy ($T_1$) of the exciplex ($T_1^S-T_1$) is, from the viewpoint of attaining high emission efficiency, preferably 0.01 eV or more, more preferably 0.1 eV or more, even more preferably 0.2 eV or more. The excited triplet energy difference ($T_1^S-T_1$) may be defined, for example, within a range of 2.0 eV or less, or may be defined within a range of 1.0 eV or less, or may be defined within a range of 0.5 eV or less.

Also preferably, the HOMO level of the spacer compound is lower than the HOMO level of the donor compound, and the LUMO level thereof is higher than the LUMO level of the acceptor compound.

Specific examples of preferred compounds usable as the spacer compound in the present invention are shown below. The range of the spacer compound usable in the present invention should not be limitatively interpreted by the following examples.

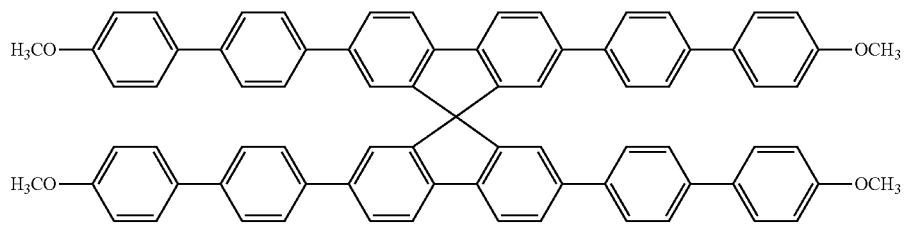

-continued
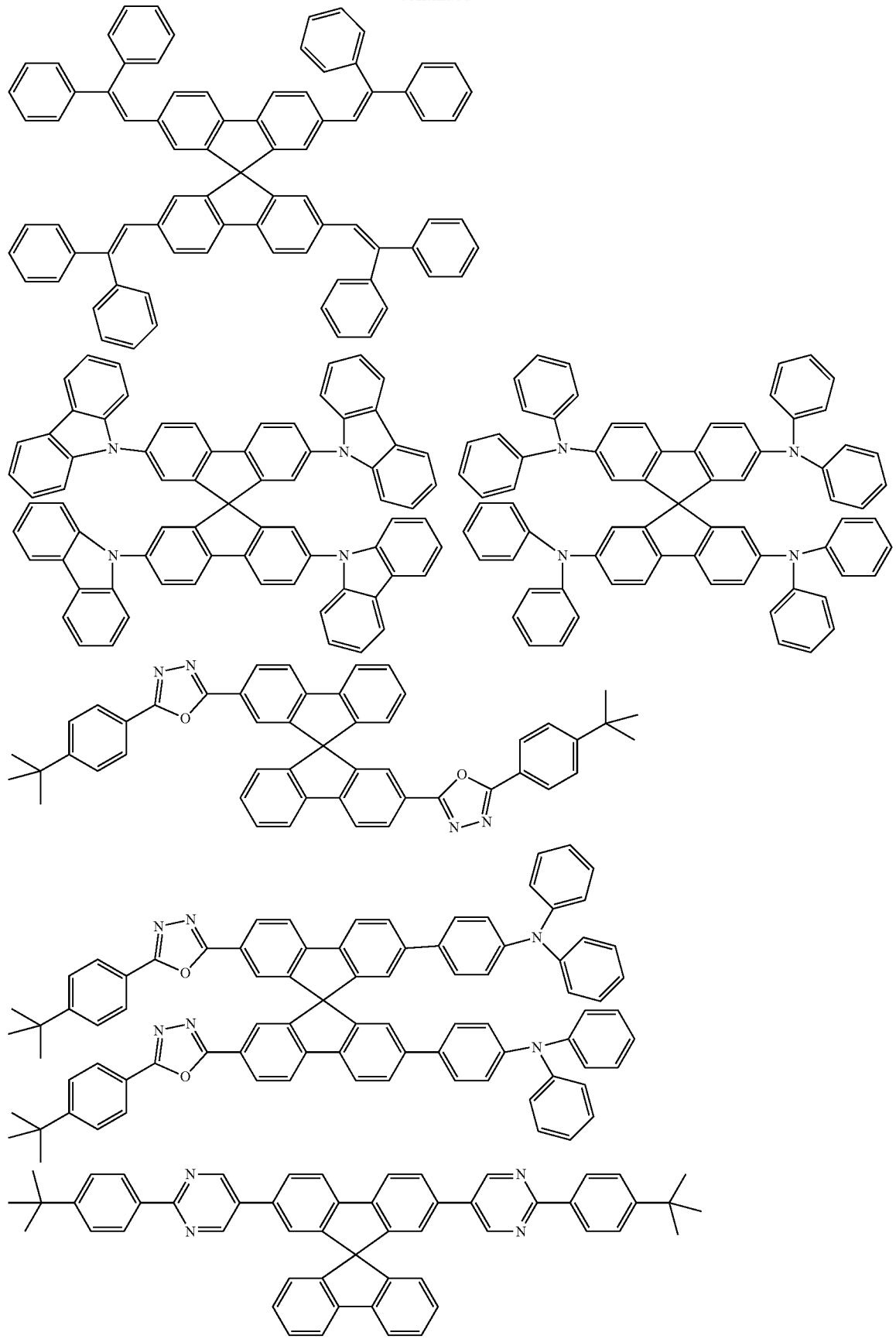

-continued
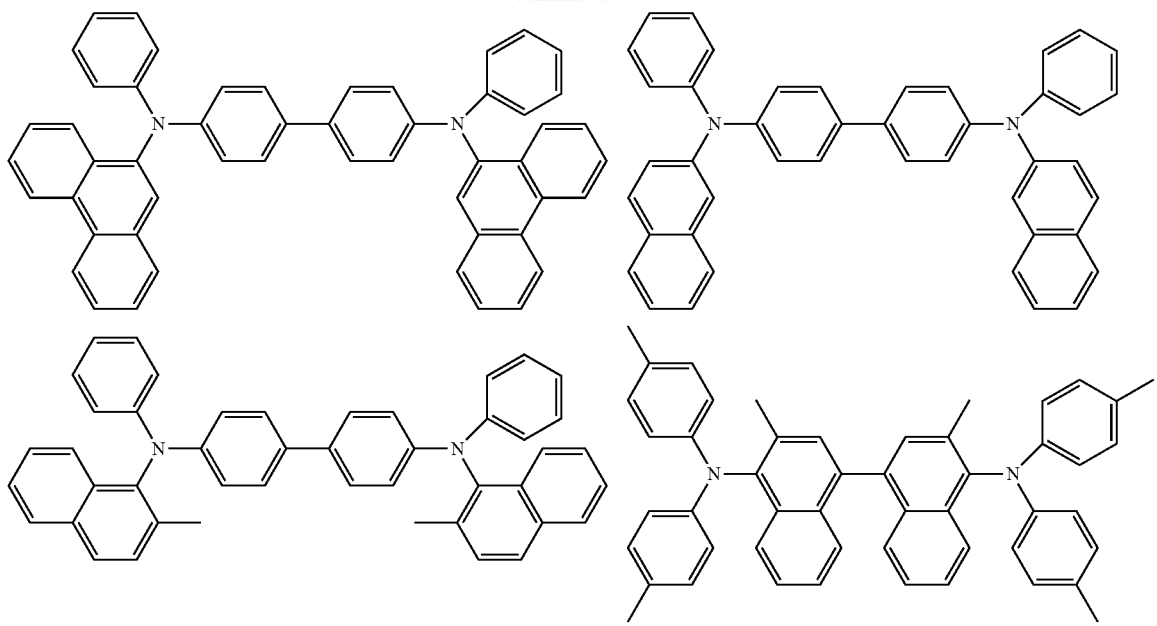
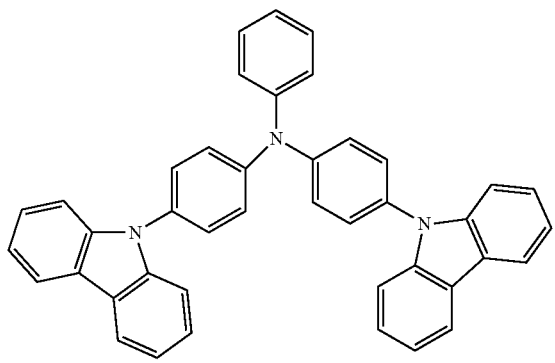
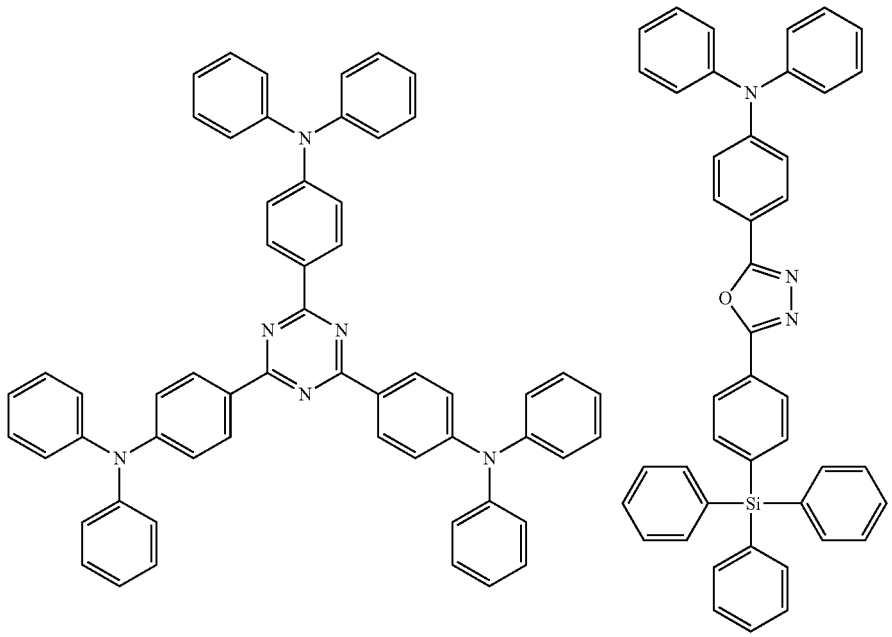

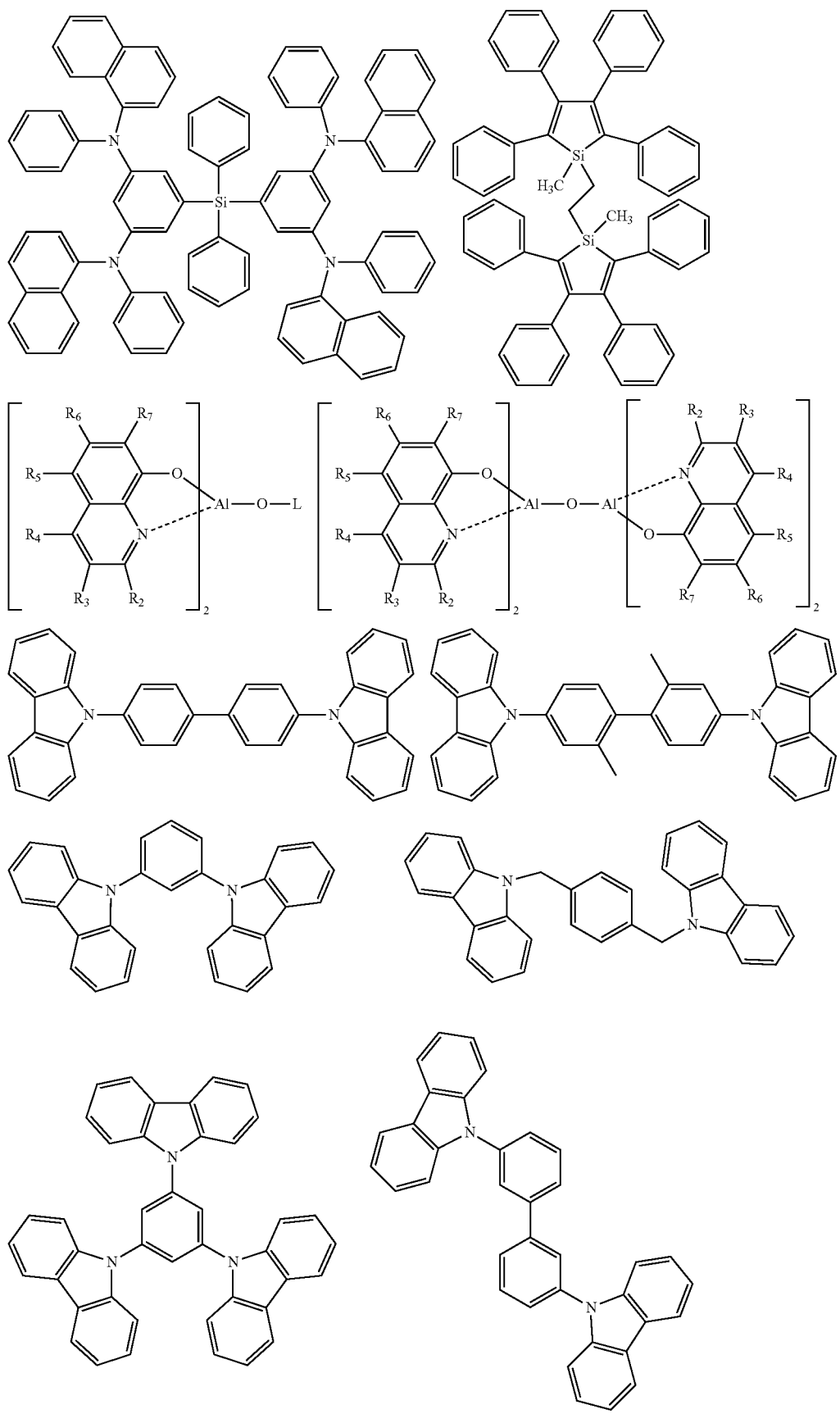

-continued
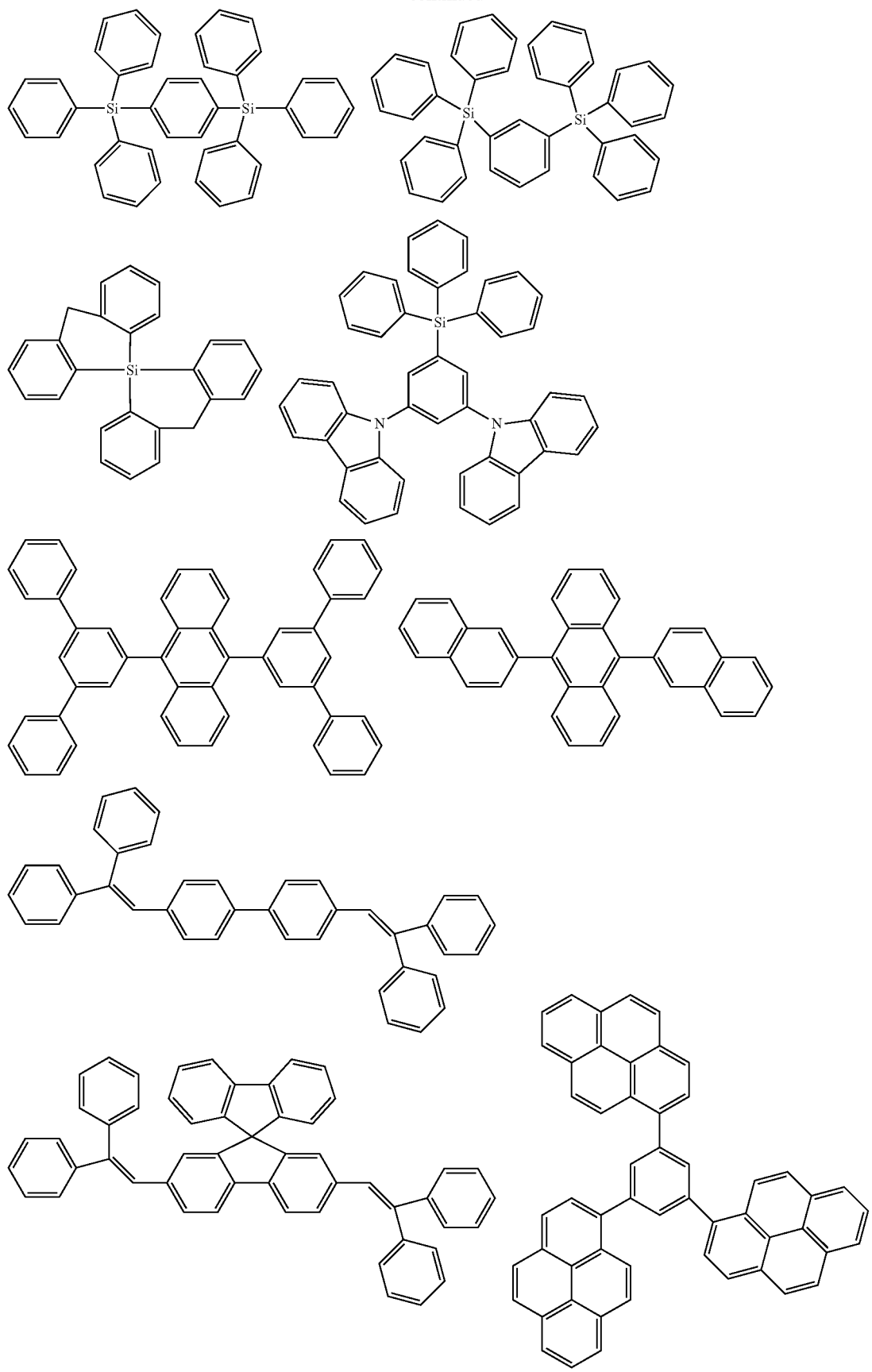

-continued

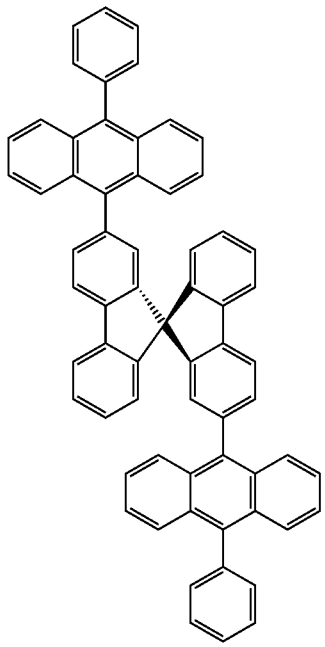
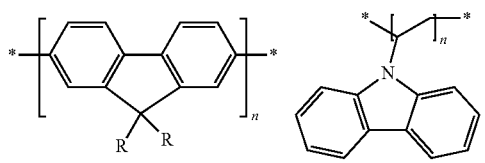
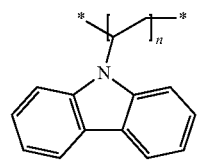
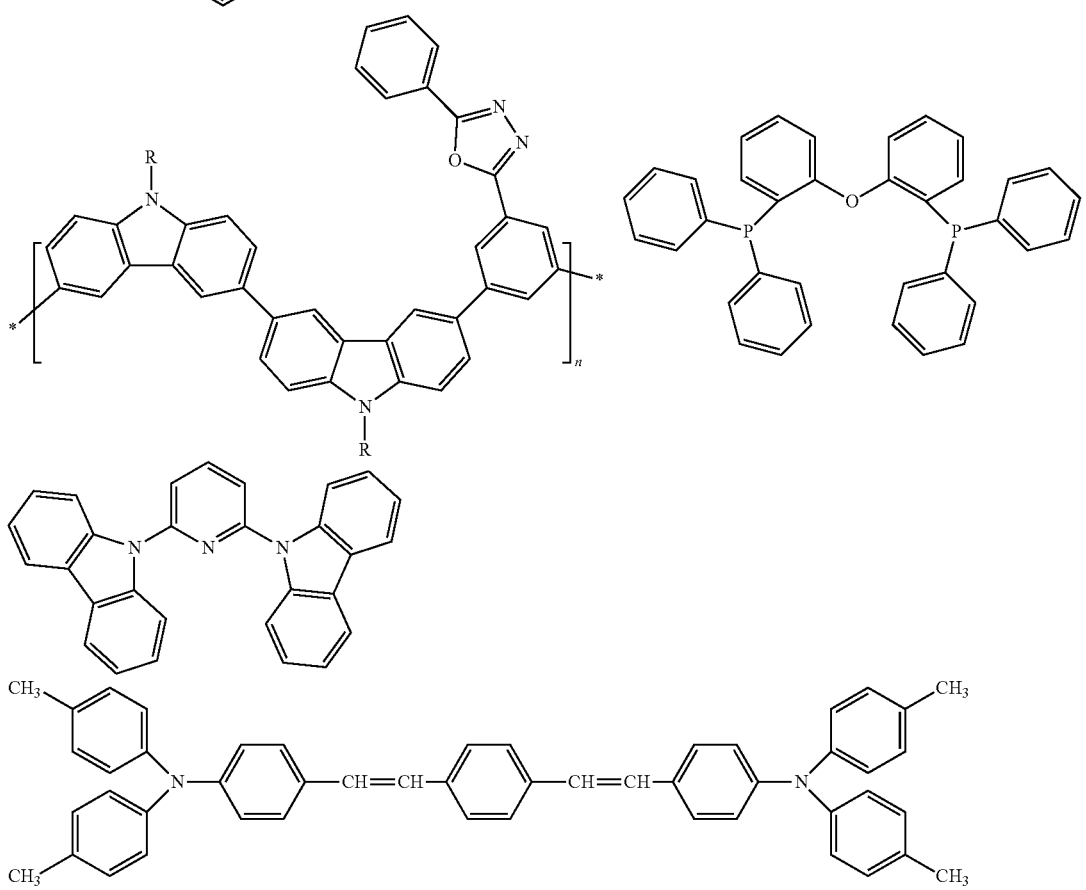

The thickness of the spacer layer is preferably 0.1 nm or more, more preferably 0.5 nm or more, even more preferably 1 nm or more. Also preferably, the thickness of the spacer layer is 10 nm or less. When the thickness of the spacer layer falls within the above range, higher mission efficiency can be attained. When the thickness of the spacer layer is controlled within the above range, the emission wavelength may vary within a suitable range with the change in the thickness of the spacer layer therefore facilitating emission wavelength control.

The thickness of the spacer layer may be measured with an ellipsometer or a contact-type thickness meter.

[Layer Configuration of Organic Electroluminescent Device]

Figure 2:
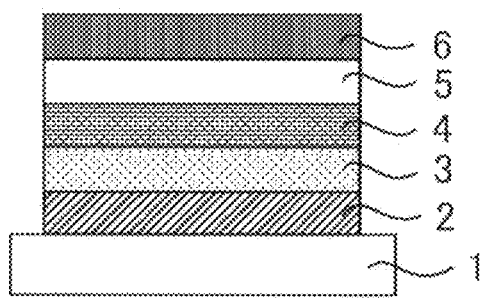
FIG. 2 This is a schematic cross-sectional view showing a layer configuration example of an organic electroluminescent device.
Figure 2:
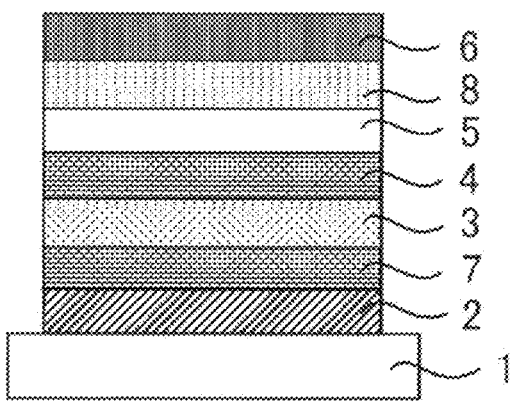

The organic electroluminescent device of the present invention has a layered structure of at least a donor layer, a spacer layer and an acceptor layer layered in that order. Further, the electroluminescent device of the present invention preferably has a pair of electrodes (anode and cathode) that supply holes to the donor layer and electrons to the acceptor layer, in which the layered structure is arranged between the anode and the cathode so as to have the donor layer on the anode side and to have the acceptor layer on the cathode side. Also the organic electroluminescent device of the present invention may have one or more organic layers in addition to the above. Such other organic layers include a hole transport layer, a hole injection layer, an electron blocking layer, a hole blocking layer, an electron injection layer, an electron transport layer, and an exciton blocking layer. The hole transport layer may be a hole injection and transport layer having a hole injection function, and the electron transport layer may be an electron injection and transport layer having an electron injection function. Specific configuration examples of the organic electroluminescent device of the present invention are shown in FIG. 2(a) and (b). In FIG. 2(a) and (b), 1 is a substrate, 2 is an anode, 3 is a donor layer, 4 is a spacer layer 5 is an acceptor layer, 6 is a cathode, 7 is a hole injection layer, and 8 is an electron injection layer.

In the following, the members and the layers to be used, as needed, in the organic electroluminescent device of the present invention are described. In the following description, in the organic electroluminescent device, the part of the three layers of the donor layer, the spacer layer and the acceptor layer may be referred to as a light-emitting part.

(Substrate)

The organic electroluminescent device of the present invention is preferably supported by a substrate. The substrate is not particularly limited and may be those that have been commonly used in an organic electroluminescent device, and examples thereof used include those formed of glass, transparent plastics, quartz and silicon.

(Anode)

The anode in the organic electroluminescent device is preferably formed of, as an electrode material, a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern maybe formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred ohm per square or less. The thickness thereof may be generally selected from a range of from 10 to 1,000 nm, and preferably from 10 to 200 nm, while depending on the material used.

(Cathode)

The cathode is preferably formed of, as an electrode material, a metal (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-copper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

(Injection Layer)

The injection layer is a layer that is provided between the electrode and the organic layer, for decreasing the driving voltage and enhancing the light emission luminance, and includes a hole injection layer and an electron injection layer, which may be provided between the anode and the light emitting layer or the hole transporting layer and between the cathode and the light emitting layer or the electron transport layer. The injection layer may be provided depending on necessity.

(Blocking Layer)

The blocking layer is a layer that is capable of inhibiting charges (electrons or holes) and/or excitons present in the light emitting layer from being diffused outside the light emitting layer. The electron blocking layer may be disposed between the light emitting layer and the hole transport layer, and inhibits electrons from passing through the light emit ting layer toward the hole transport layer. Similarly, the hole blocking layer may be disposed between the light emitting layer and the electron transport layer, and inhibits holes front passing through the light emitting layer toward the electron transport layer. The blocking layer may also be used for inhibiting excitons from being diffused outside the light emitting layer. Thus, the electron blocking layer and the hole blocking layer each may also have a function as an exciton blocking layer. The term the electron blocking layer or the exciton blocking layer referred to herein is intended to include a layer that has both the functions of an electron blocking layer and an exciton blocking layer by one layer.

(Hole Blocking Layer)

The hole blocking layer has the function of an electron transporting layer in a broad sense. The hole blocking layer has a function of inhibiting holes from reaching the electron transport layer while transporting electrons, and thereby enhances the recombination probability of electrons and holes in the light emitting layer. As the material for the hole blocking layer, the materials for the electron transport layer described later may be used depending on necessity.

(Electron Blocking Layer)

The electron blocking layer has the function of transporting holes in a broad sense. The electron blocking layer has a function of inhibiting electrons from reaching the hole transport layer while transporting holes, and thereby enhances the recombination probability of electrons and holes in the light emitting layer.

(Exciton Blocking Layer)

The exciton blocking layer is a layer for inhibiting excitons generated through recombination of holes and electrons in the light emitting layer from being diffused to the charge transport layer, and the use of the layer inserted enables effective confinement of excitons in the light emitting layer, and thereby enhances the light emission efficiency of the device. The exciton blocking layer may be inserted adjacent to the light emitting layer on any of the side of the anode and the side of the cathode, and on both the sides. Specifically, in the case where the exciton blocking layer is present on the side of the anode, the layer may be inserted between the hole transport layer and the light emitting layer and adjacent to the light emitting layer, and in the case where the layer is inserted on the side of the cathode, the layer may be inserted between the light emitting layer and the cathode and adjacent to the light emitting layer. Between the anode and the exciton blocking layer that is adjacent to the light emitting layer on the side of the anode, a hole injection layer, an electron blocking layer and the like may be provided, and between the cathode and the exciton blocking layer that is adjacent to the light emitting layer on the side of the cathode, an electron injection layer, an electron transport layer, a hole blocking layer and the like may be provided. In the case where the blocking layer is provided, the material used for the blocking layer preferably has excited singlet energy and excited triplet energy, at least one of which is higher than the excited singlet energy and the excited triplet energy of the light emitting material, respectively.

(Hole Transport Layer)

The hole transport layer is formed of a hole transporting material having a function of transporting holes, and the hole transport layer may be provided as a single layer or plural layers.

The hole transporting material has one of injection or transporting property of holes and blocking property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

(Electron Transport Layer)

The electron transporting layer is formed of a material having a function of transporting electrons, and the electron transporting layer may be provided as a single layer or plural layers.

The electron transporting material (which may also function as a hole blocking material in some cases) needs only to have a function of transporting electrons, which are injected from the cathode, to the light emitting layer. Examples of the electron transport layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and an oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attractive group. Furthermore, polymer materials having these materials introduced to the polymer chain or having these materials used as the main chain of the polymer may also be used.

Specific examples of preferred materials that may be used in the organic electroluminescent device are shown below, but the materials that may be used in the present invention are not construed as being limited to the example compounds. The compound that is shown as a material having a particular function may also be used as a material having another function. In the structural formulae of the example compounds, R, R' and $R_1$ to $R_{10}$ each independently represent a hydrogen atom or a substituent. X represents e carbon atom or a hetero atom to form the ring skeleton, n represents an integer of from 3 to 5, Y represents a substituent, and m represents an integer of 0 or more.

First, preferred examples of compounds that may be used as the hole injection material are shown below.

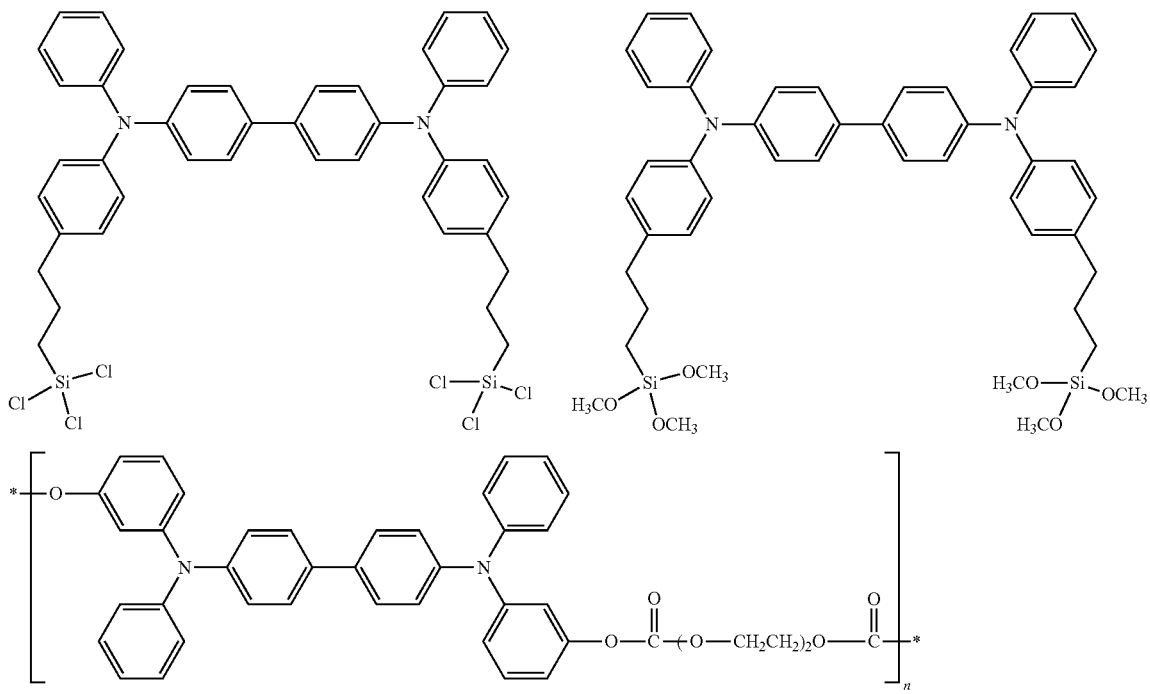
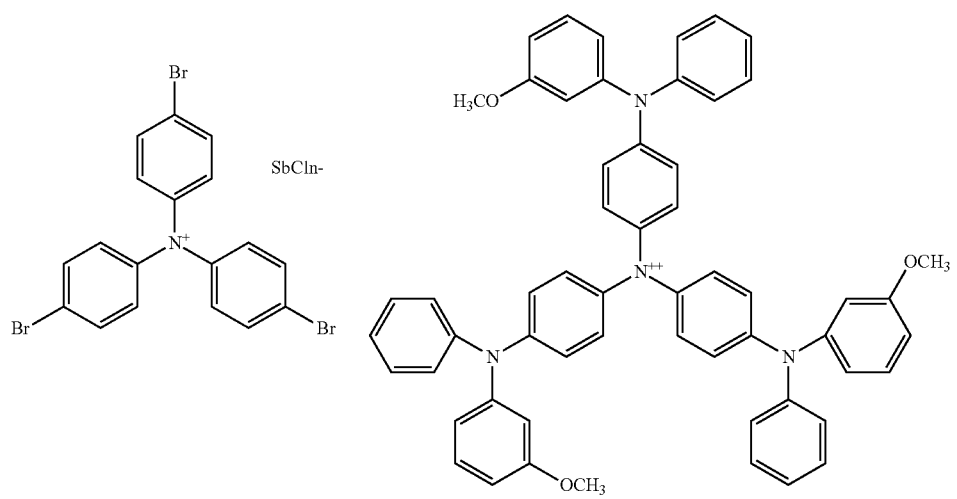
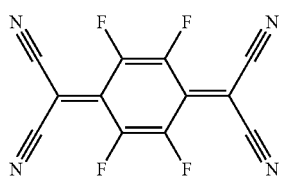
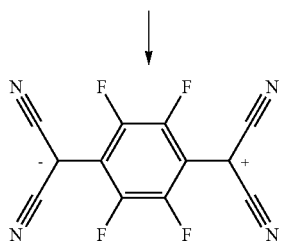

-continued
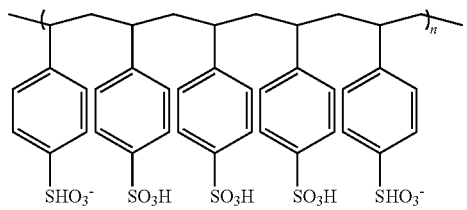
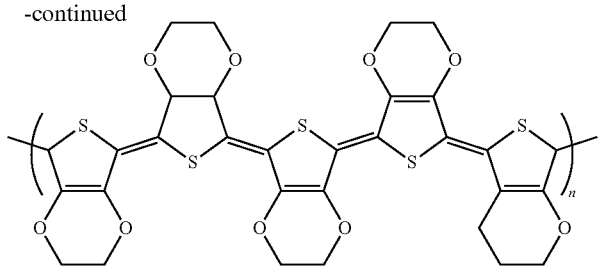
Next, preferred examples of compounds that may be used as the hole transporting material are shown below.
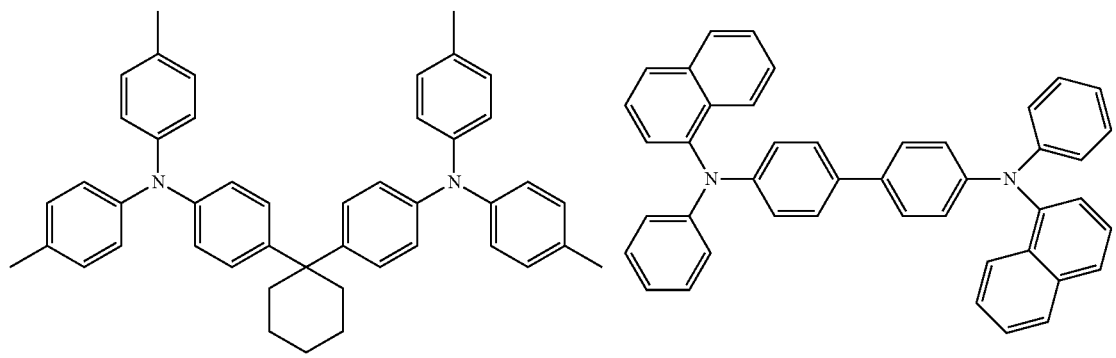
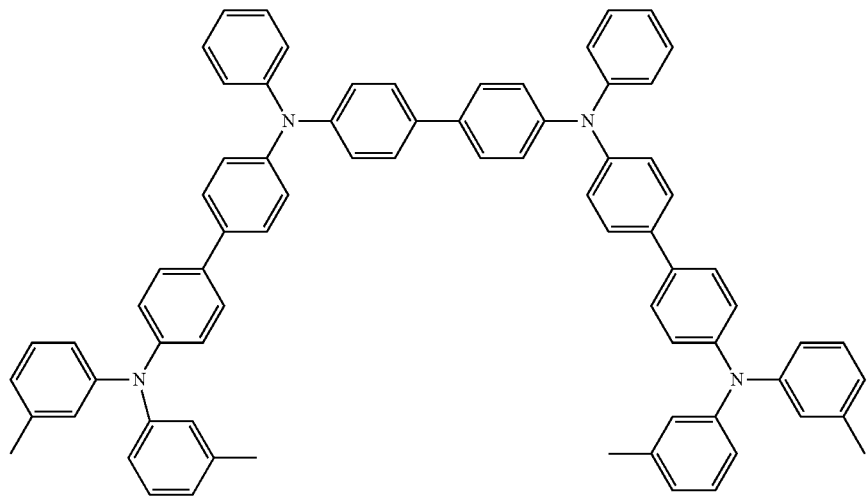
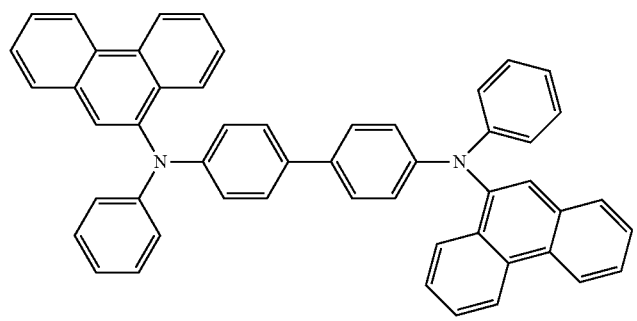

-continued
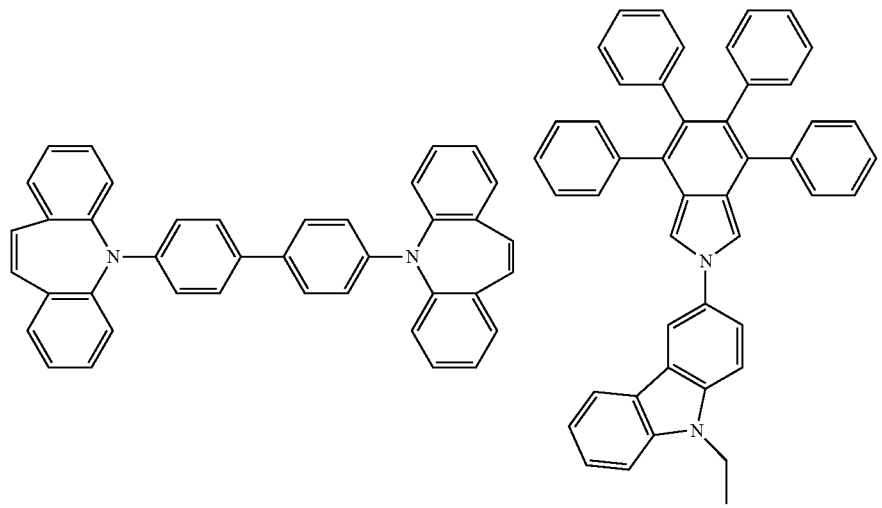
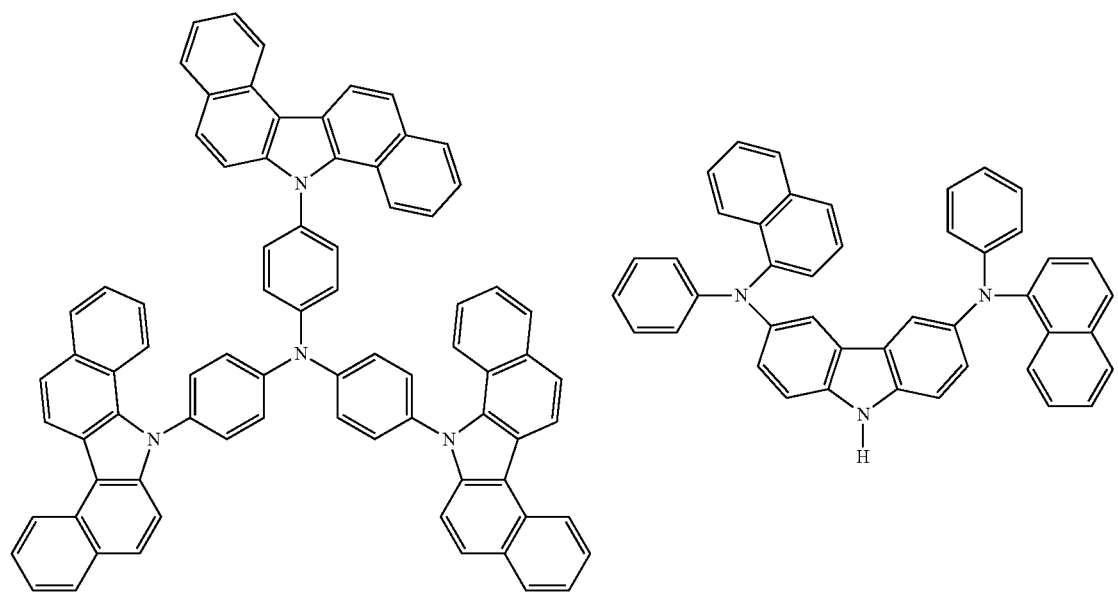
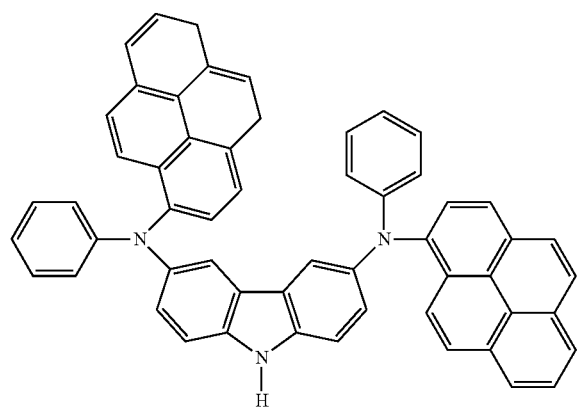

-continued
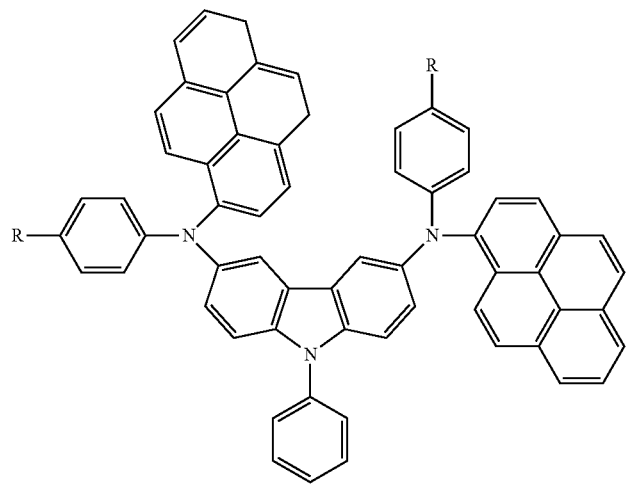
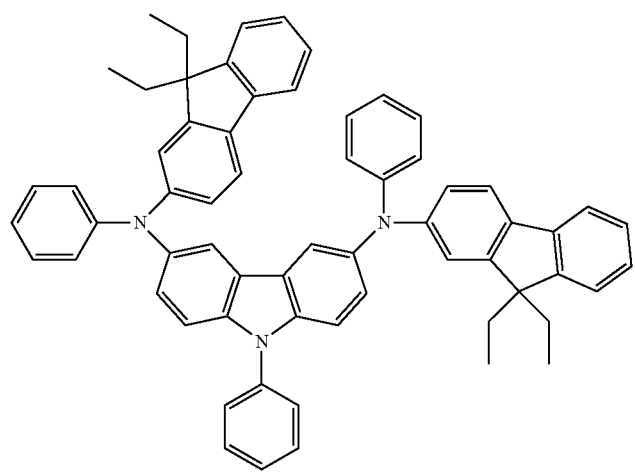
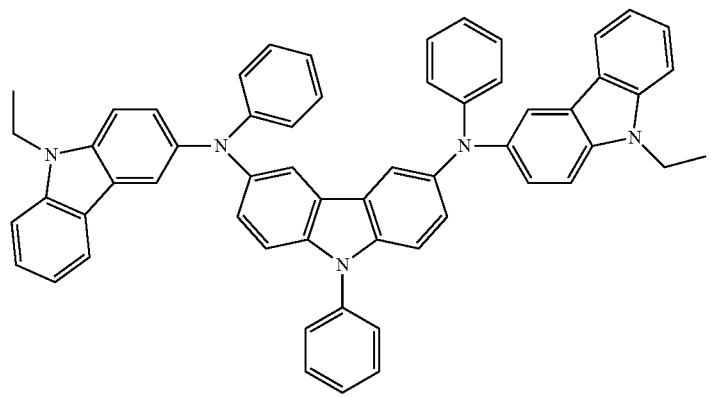

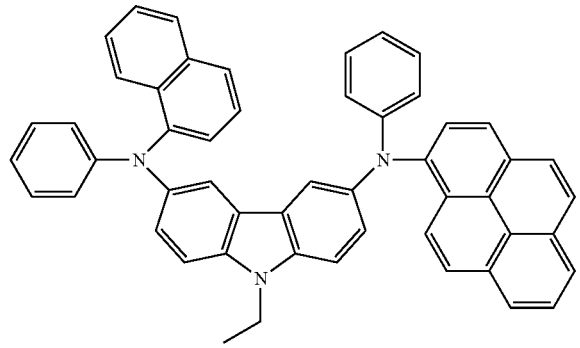
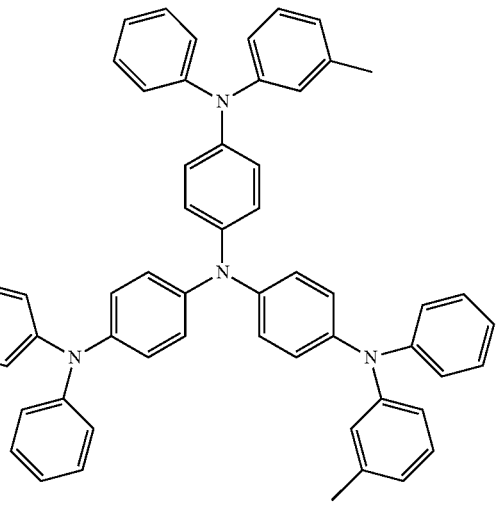
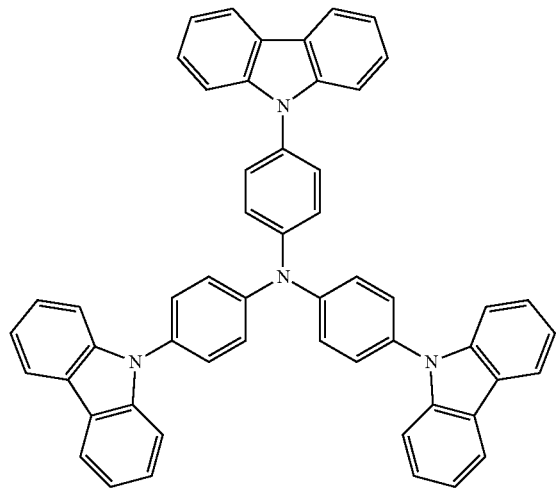
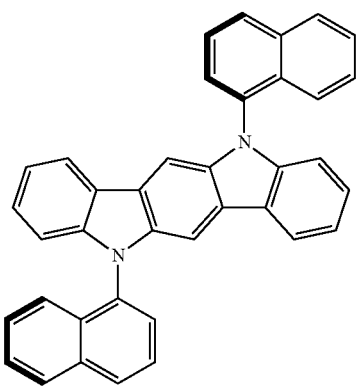
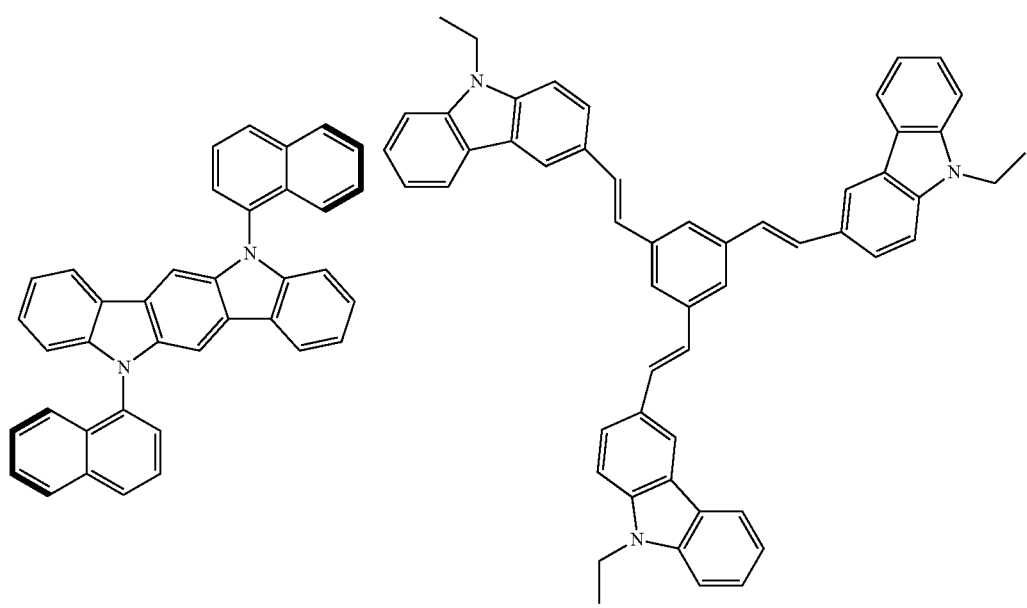

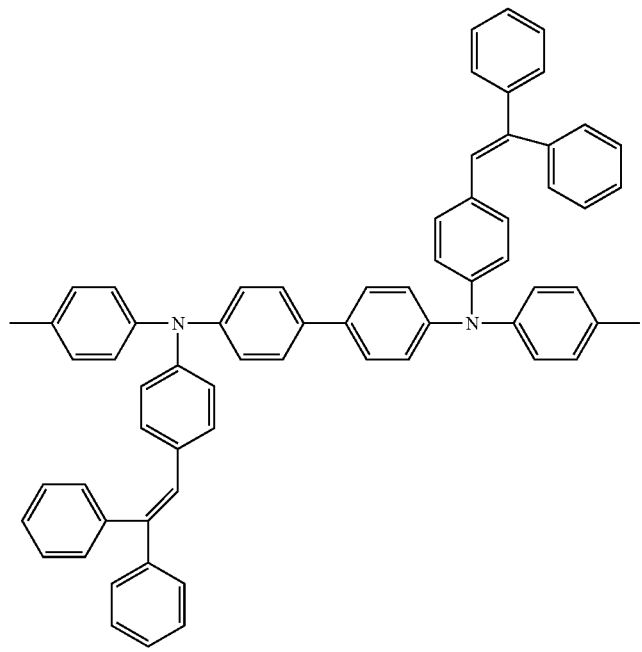
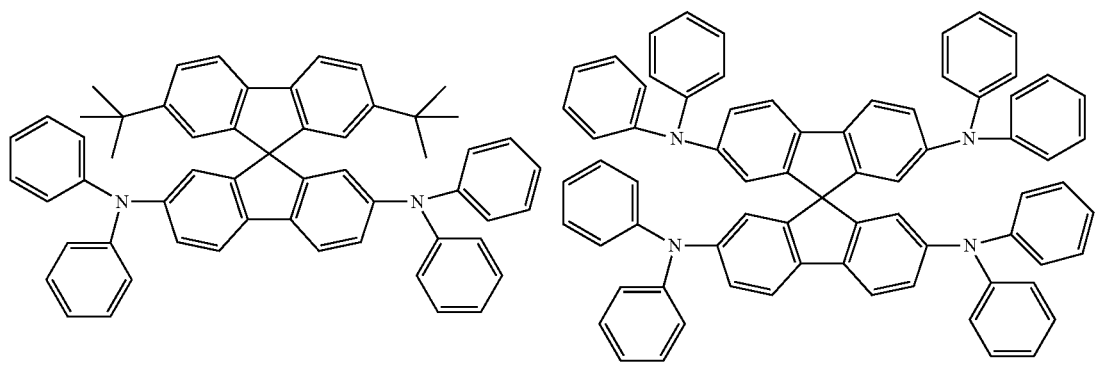
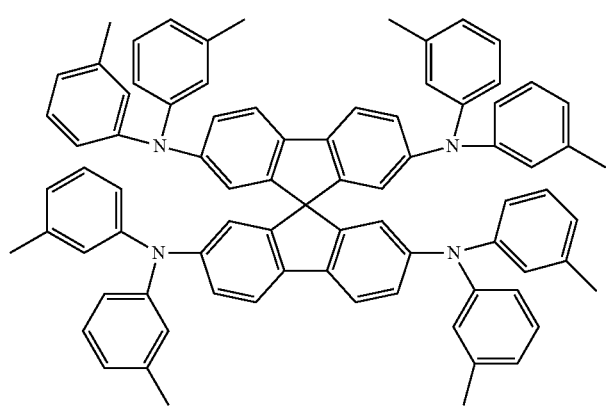

-continued
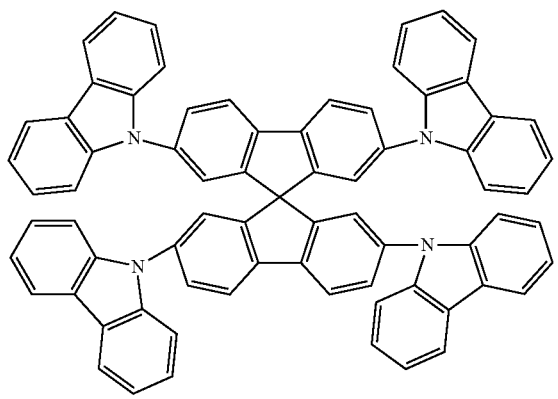
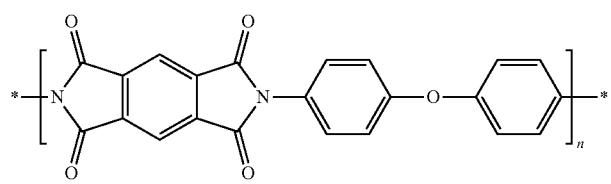
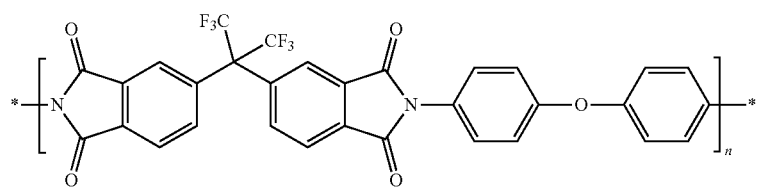
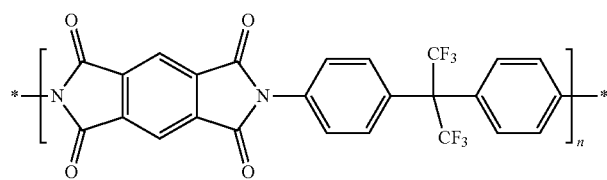
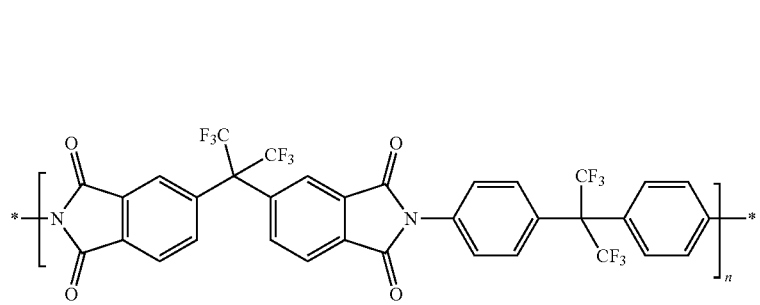
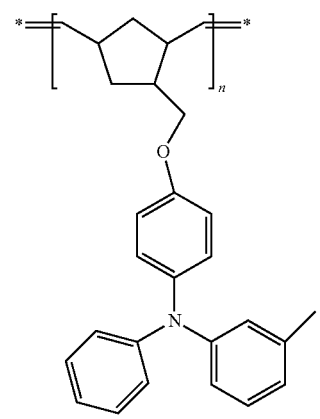

-continued
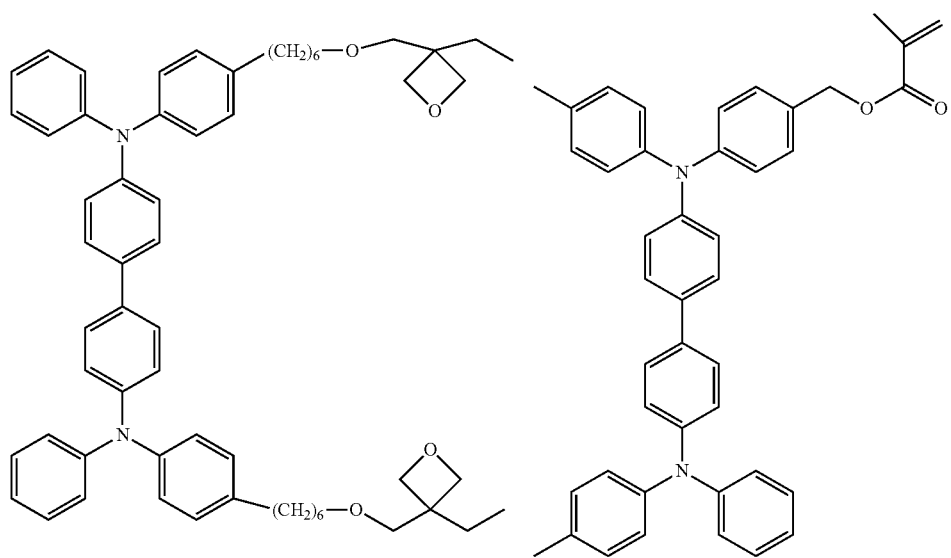
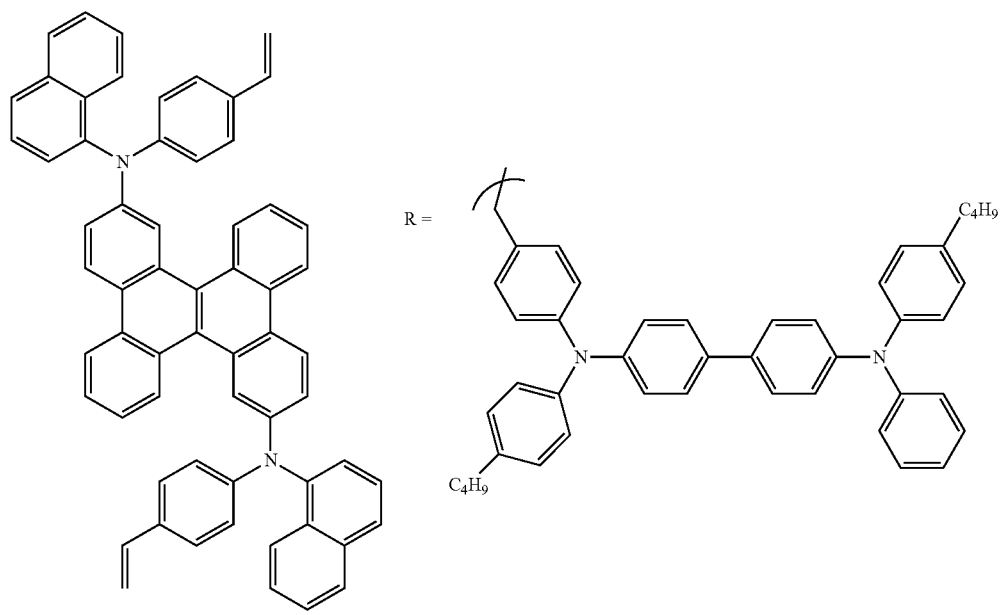
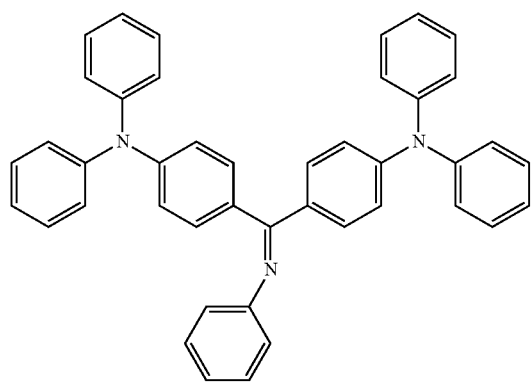

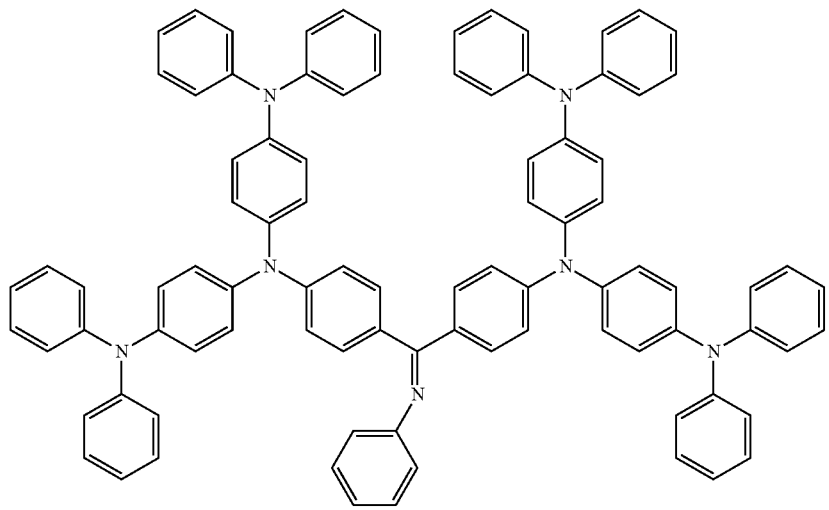
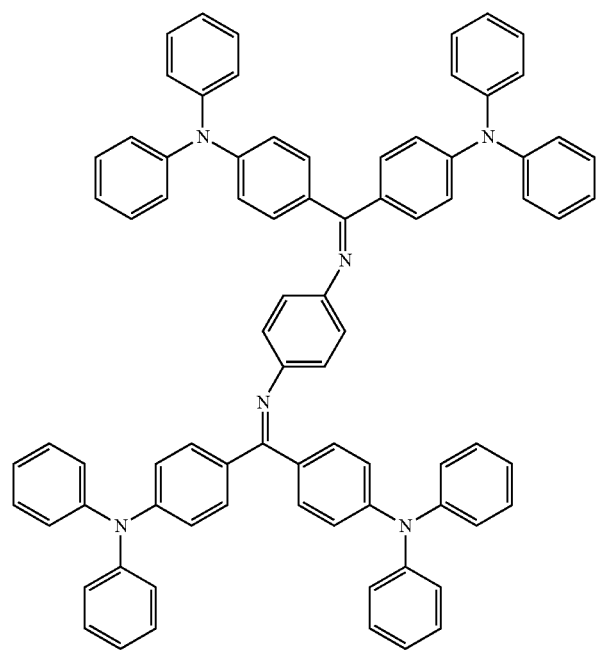

-continued
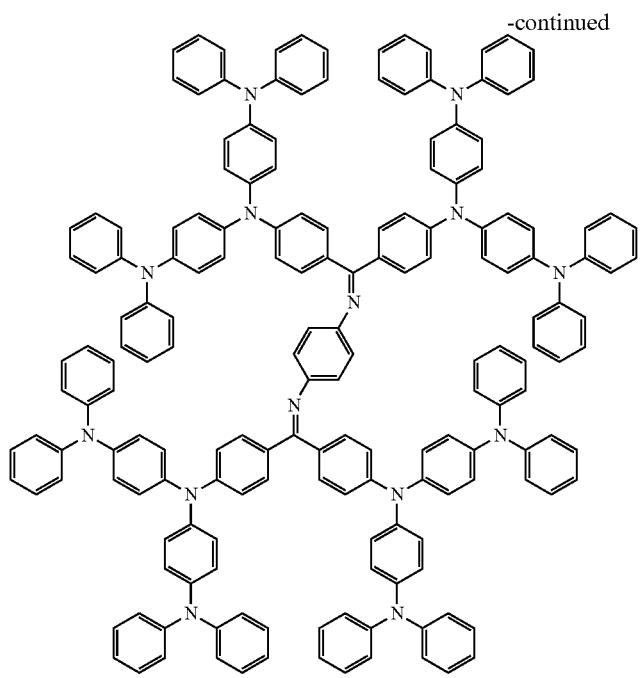
Next, preferred examples of compounds that may be used as the electron blocking material are shown below.
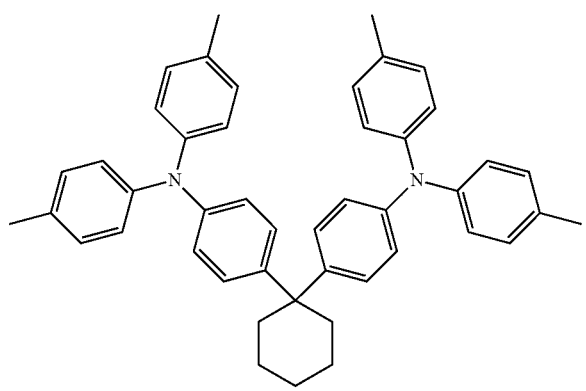
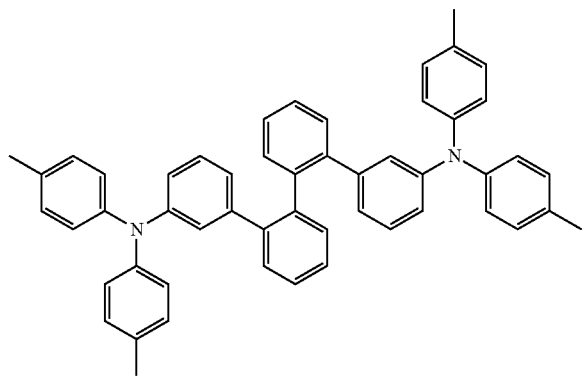
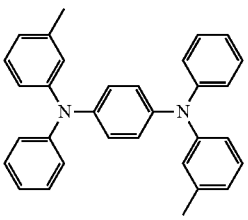
-continued

Next, preferred examples of compounds that may be used as the hole blocking material are shown below.
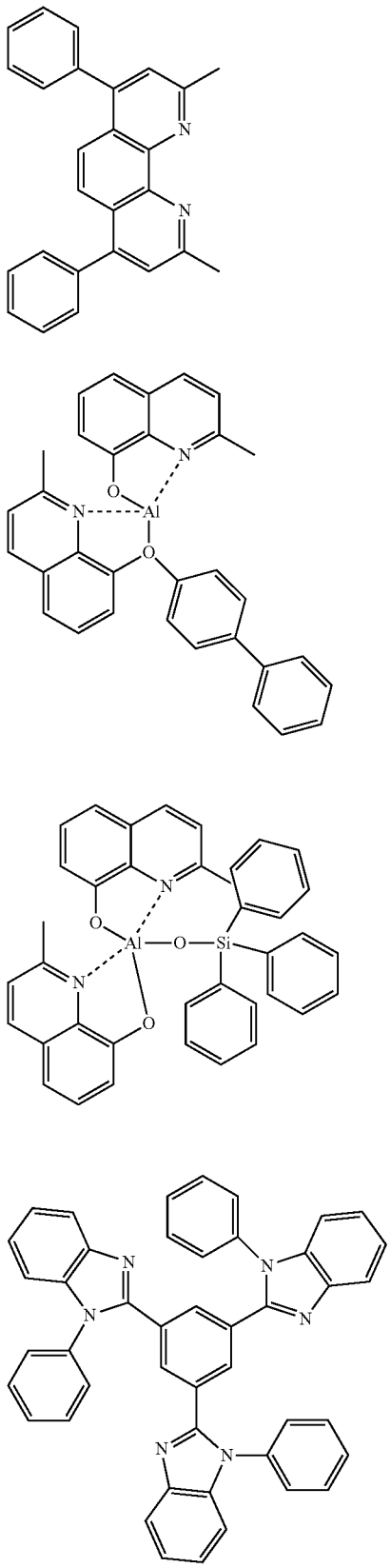
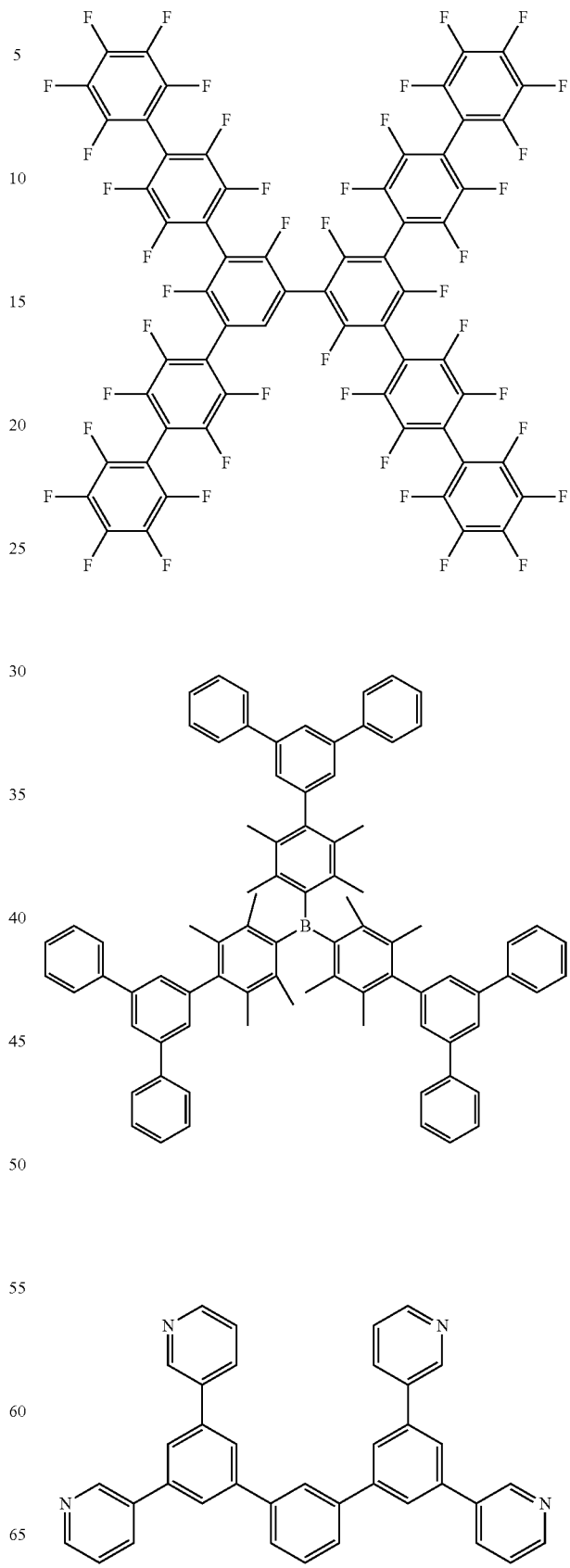

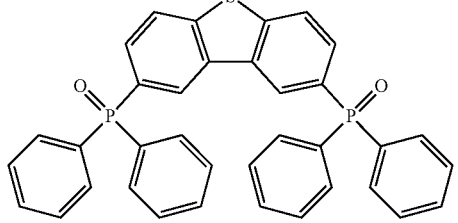
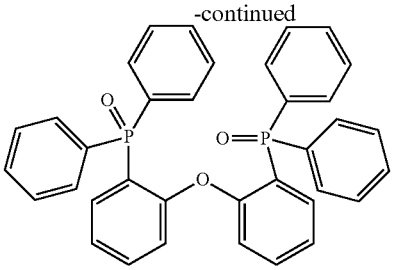
Next, preferred examples of compounds that may be used as the electron transporting material are shown below.
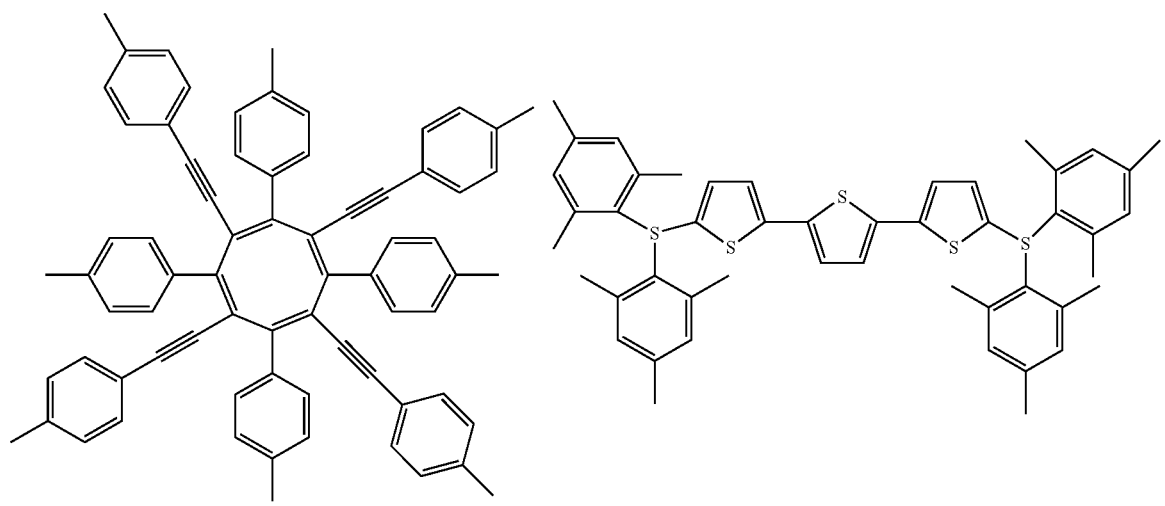
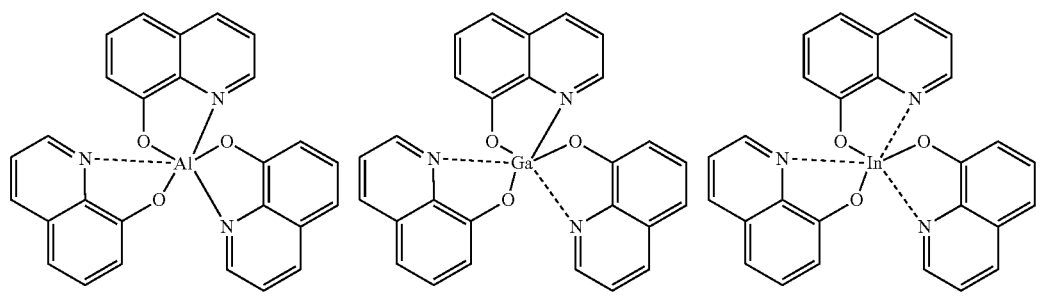
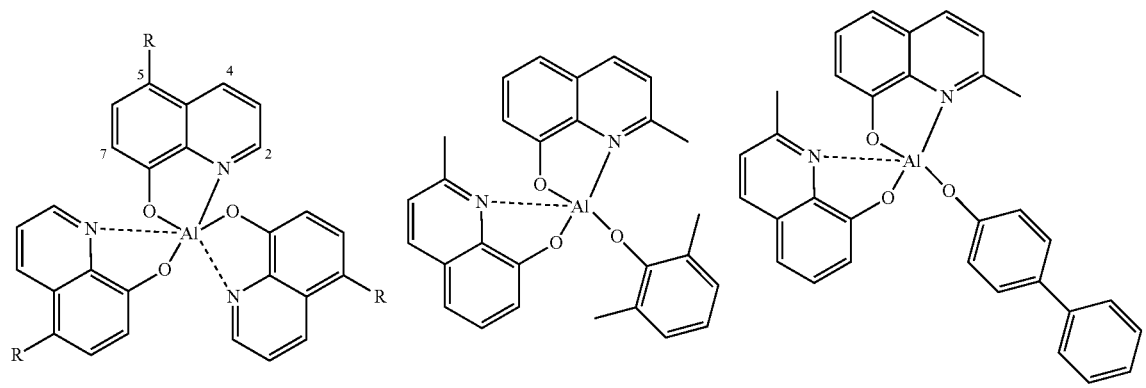

-continued
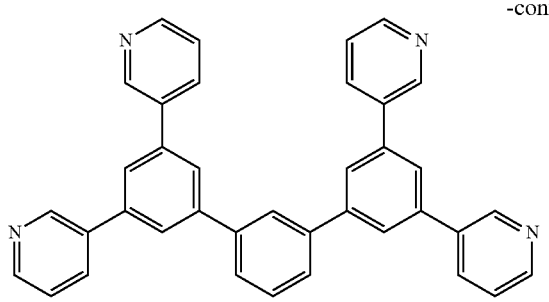
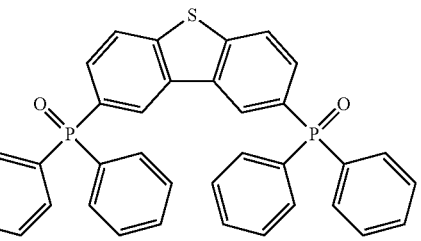
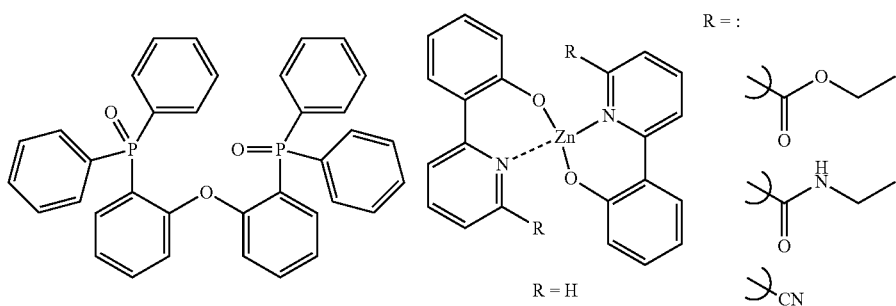
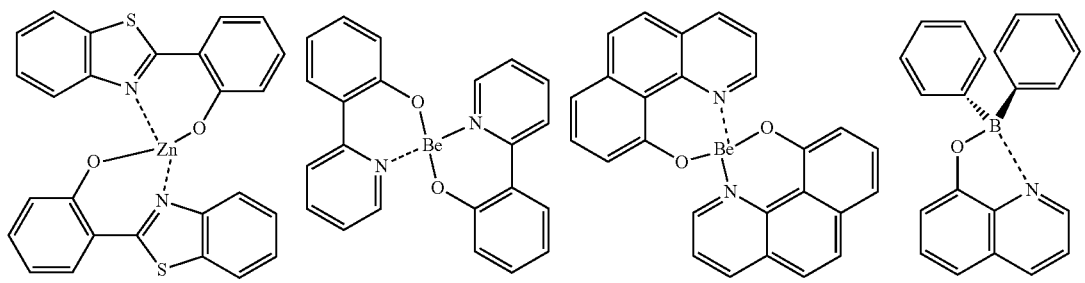
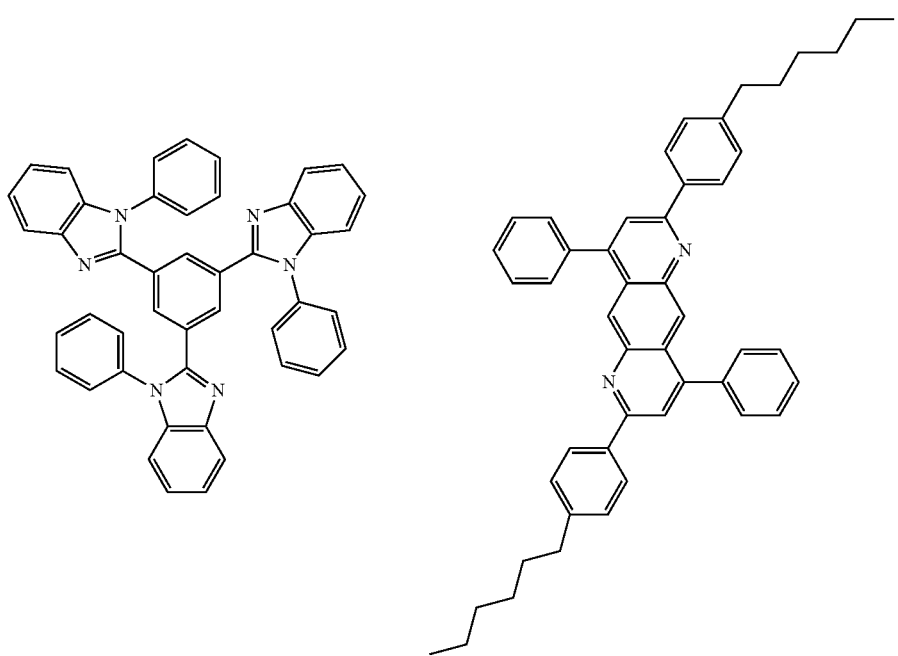

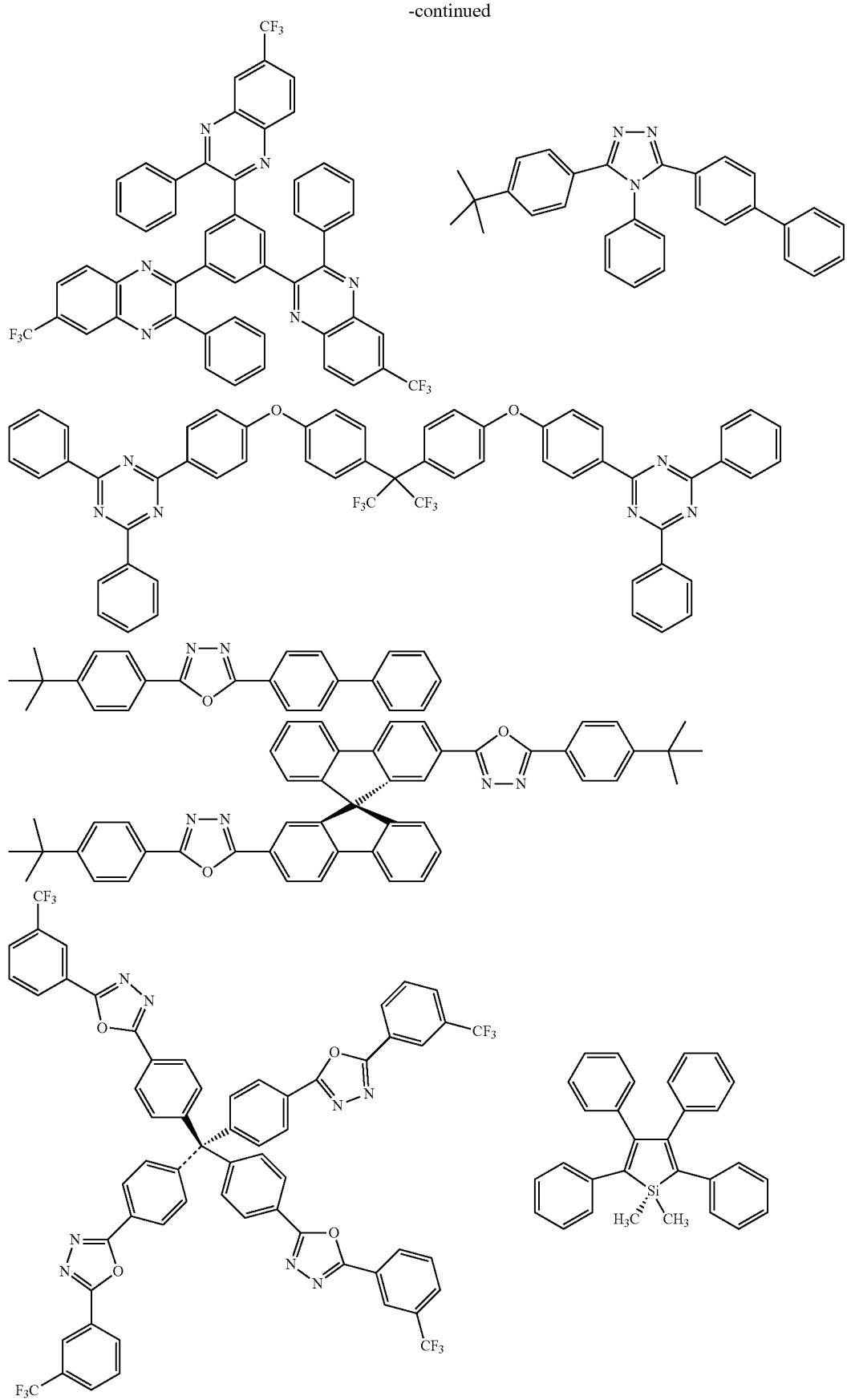

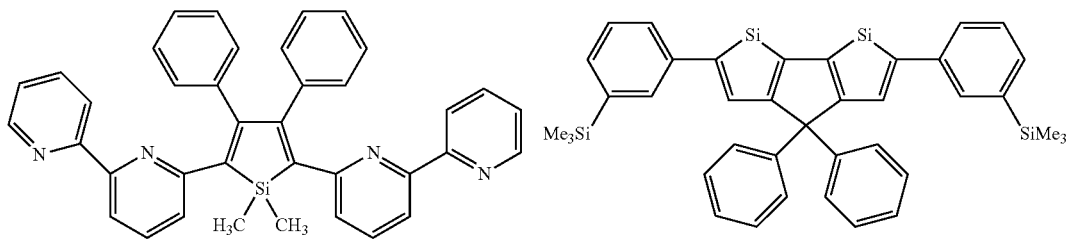
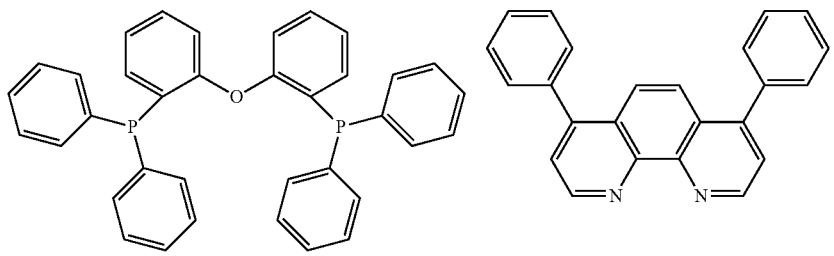
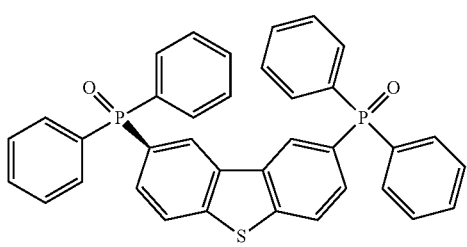
Next, preferred examples of compounds that may be used as the electron injection material are shown below.
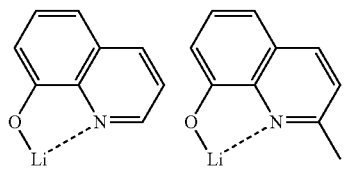
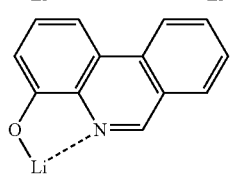
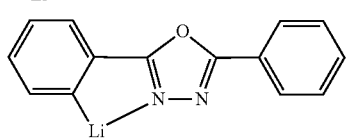
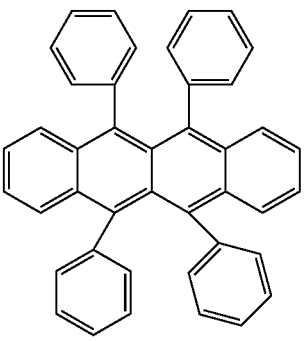
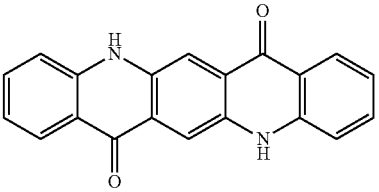
Preferred examples of compounds as a material that may be added are shown below. For example, the compound may be added as a stabilizing material.

-continued

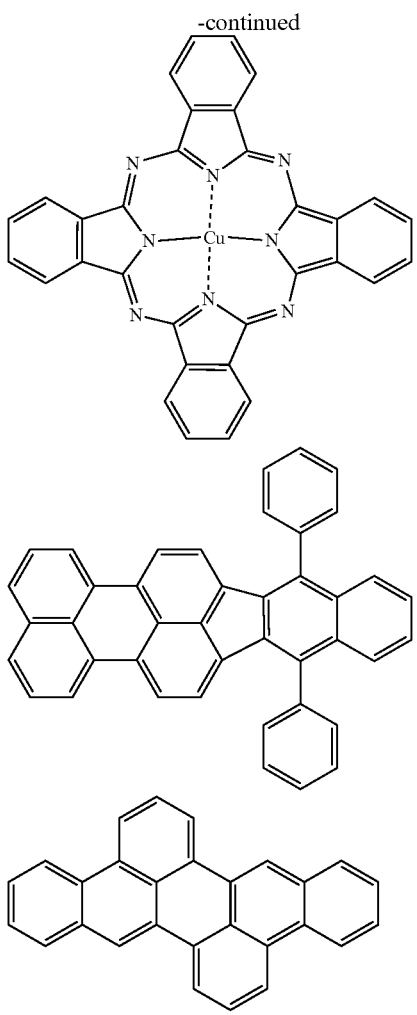

In the organic electroluminescent device having the configuration as above, when an electric field is applied between the anode and the cathode, holes are injected into HOMO of the donor compound that the donor layer contains and electrons are injected into LUMO of the acceptor compound that the acceptor compound contains. It is considered that the holes find the electrons injected to these compounds move toward the spacer layer side, and the holes accumulate in the interface between the donor layer and the spacer layer and the electrons accumulate in the interface between the acceptor layer and the spacer layer, and accordingly, the hole and the electron accumulated in the respective interfaces interact with each other to form an exciplex. The exciplex undergoes reverse intersystem crossing from the excited triplet state to the singlet excited state and is thereafter restored to the ground state to radiate delayed fluorescence. Accordingly, the energy of the excited triplet state having a high formation probability can be efficiently utilized for light emission, therefore providing a high emission efficiency. In addition, the emission wavelength of the organic electroluminescent device can vary in a broad wavelength range, depending on the thickness of the spacer layer therein, and accordingly, the emission wavelength of the device can be readily controlled by merely controlling the thickness of the spacer layer even though the combination of the donor compound and the acceptor compound therein is not change. Consequently, the device enables emission of various colors with ease. In addition, the organic electroluminescent device may radiate ordinary fluorescence and phosphorescence along with delayed fluorescence.

The organic electroluminescent device of the present invention described hereinabove may be produced according to a process of layering the donor layer containing a donor compound, the space layer containing a spacer compound and the acceptor layer containing an acceptor compound in that order. Further, for producing the organic electroluminescent device having any other members and organic layers titan the donor layer, the spacer layer and the acceptor layer, the other members and organic layers are layered above or below the donor layer or the acceptor layer in accordance with the layering order thereof. The film forming method for the organic layers is not specifically limited, and any of a dry process or a wet process may be employed.

In this case, preferably, the thickness of the spacer layer is controlled depending on the preset emission wavelength of the organic electroluminescent device. Regarding the description of the method for controlling the thickness of the spacer layer in accordance with the emission wavelength, the description given in the section of "Emission wavelength controlling method for organic electroluminescent device" given hereinunder may be referred to.

The organic electroluminescent device of the present invention may be applied to any of a single device, a device army having a structure configured in array, and a structure where an anode and a cathode are arranged in an X-Y matrix state. According to the present invention, an organic electroluminescent device cars be realized, which has a donor layer, a spacer layer and an acceptor layer in that order and in which the compounds contained in these layers satisfy specific, requirements, and which therefore attains a high emission efficiency and attains emission lights of various colors by changing the thickness of the spacer layer therein. The organic electroluminescent device of the present invention can be applied to various uses. For example, using the organic light-emitting device of the present invention, an organic electroluminescent display device can be produced, and for the details thereof, reference may be made to Seiji Tokito, Chiyaha Adachi and Hidejuki Murata, "Yuki EL Display" (Organic EL Display) (Ohmsha, Ltd.). In addition, particularly, the organic electroluminescent device of the present invention is also applicable to organic electroluminescent lighting devices and backlights.

<Device Array>

Next, the device array of the present invention is described.

The device array of the present invention contains two or more kinds of organic electroluminescent devices each having a donor layer containing a donor compound, a spacer layer containing a spacer compound, and an accepter layer containing an acceptor compound in that order, wherein the donor compound and the acceptor compound are compounds to form an exciplex to radiate delayed fluorescence, and the excited triplet energy of the spacer compound is higher than the excited triplet energy of the exciplex, and wherein the two or more kinds of organic electroluminescent devices differ from each other in the thickness of the spacer layer therein.

For the layer configuration of the organic electroluminescent device, and for the description and the preferred range and specific examples of the layers and the compounds, the section of the organic electroluminescent device given hereinabove may be referred to.

The device array of the present invention contains two or more kinds of such organic electroluminescent devices and is characterized in that the thickness of the spacer laser in each device differs from each other. As described above, the organic electroluminescent device having a donor layer, a spacer layer and an acceptor layer in that order in which the compounds contained in these layers satisfy specific requirements can vary the emission wavelength in a broad wavelength range depending on the thickness of the spacer layer. Accordingly, in the device array of the present invention, the two or more kinds of organic electroluminescent devices differ from each other in point of the thickness of the spacer layer therein, and consequently, the device array can radiate two or more kinds of lights differing in color tone and can therefore provide various emission colors.

The two or more kinds of organic electroluminescent devices may be the same as or different from each other in point of the configuration except the thickness of the spacer layer therein, but are preferably the same. In particular, when the organic electroluminescent devices are the same in point of the donor compound or the acceptor compound, or in point of both the donor compound and the acceptor compound, the kinds of the compounds to be used for producing the devices may be reduced and therefore the investigations for the optimum condition for the devices and the production process of the devices can be simplified. Accordingly, the two or more kinds of organic electroluminescent devices constituting the device array can be produced efficiently at low cost. In the case where between the constituent organic electroluminescent devices, all the constitutions of the donor layer, the spacer layer and the acceptor layer except for the thickness of the spacer layer are made to be the same, the factor to change the emission wavelength is only the thickness of the spacer layer, and therefore the case is advantageous in that the emission wavelength can be controlled in a simplified manner.

The device array of the present invention may have a configuration where two or more electroluminescent devices are arranged on one and the same substrate and are handled more integrally, or have a configuration where two or more organic electroluminescent devices are separated from each other and are handled individually. In addition, the device array may have a configuration where a part of two or more kinds of electroluminescent devices are handled integrally and the other thereof are handled individually.

The number of the kinds of the organic electroluminescent devices that the device array of the present invention is not specifically limited. For example, the device array may have, as combined, two kinds or three kinds of devices each emitting red color, green color or blue color, or may have, as combined, two or more kinds of devices of these devices and a device that emits another color, or may have, as combined, two or more kinds of devices that emit other colors.

<Emission Wavelength Controlling Method for Organic Electroluminescent Device>

Next, an emission wavelength controlling method for the organic electroluminescent device of the present invention is described.

The emission wavelength controlling method of the present invention is for controlling the emission wavelength of an organic electroluminescent device having a donor layer containing a donor compound, a spacer layer containing a spacer compound, and an acceptor layer containing an acceptor compound in that order, wherein the donor compound and the acceptor compound are compounds to form an exciplex to radiate delayed fluorescence, and the excited triplet energy of the spacer compound is higher than the excited triplet energy of the exciplex, and wherein the thickness of the spacer layer is adjusted to control the emission wavelength of the organic electroluminescent device.

For the layer configuration of the organic electroluminescent device, and for the description and the preferred range and specific examples of the layers and the compounds, the section of the organic electroluminescent device given hereinabove may be referred to.

In the emission wavelength controlling method for the organic electroluminescent device of the present invention, the thickness of the spacer layer in the organic electroluminescent device is adjusted to control the emission wavelength of the device. As described above, the organic electroluminescent device having a donor layer, a spacer layer and an acceptor layer in that order in which the compounds contained in these layers satisfy specific requirements changes the emission wavelength in a broad wavelength range depending on the thickness of the spacer layer. Accordingly, by adjusting the thickness of the spacer layer, the emission wavelength of the organic electroluminescent device can be controlled with ease. Here, when the emission wavelength is tried to be controlled by changing the donor compound and the acceptor compound, a large variety of compounds will have to be obtained or synthesized, and light-emitting devices will have to be produced under the condition suitable to the compounds, and investigations of measuring the emission wavelength of the resultant devices will have to be repeated, and in addition, since the combination of the compounds to form an exciplex is limited, it would be difficult to control the resultant device to emit a desired color. As opposed to this, according to the method of emission wavelength controlling method where the thickness of the spacer layer is adjusted, the thickness of the spacer layer may be merely changed, and the method is far easier than the method of changing the donor compound and the acceptor compound. In addition, the emission wavelength of the organic electroluminescent device for use in the present invention varies in a broad wavelength range depending on the thickness of the spacer layer therein as mentioned above, and therefore, by adjusting the thickness of the spacer layer, light having a desired emission wavelength (desired color) can be obtained with ease.

A concrete technique for the emission wavelength controlling method is not specifically defined, and one concrete method is described. Plural kinds of organic electroluminescent devices differing in the thickness of the spacer layer therein are produced, the emission spectra thereof are measured, a calibration curve is drawn on a coordinate system where the abscissa indicates the thickness of the spacer layer and the ordinate indicates the peak wavelength of the emission spectrum, and based on the calibration curve, the thickness of the spacer layer corresponding to the intended emission wavelength is selected.

<Energy Transfer from Exciplex to Light-Emitting Material>

The present invention is applicable to a constitution where the energy of an exciplex is transferred to a light-emitting material for emission from the light-emitting material.

For example, a light-emitting material is doped in a spacer layer and emission is made from the light-emitting material. In this case, the light-emitting material to be made to exist in the spacer layer may be uniformly and entirely doped in the spacer layer, or the spacer layers may have a multilayer configuration where the dope concentration differs between the layers. In the case of the multilayer configuration, the dope concentration may differ in every layer, or only a part of the layers may be doped while the other layers are not doped. A preferred embodiment is a multilayer configuration where a layer doped with a light-emitting material is sandwiched between layers not doped with a light-emitting material. The dope concentration of the layer doped with a light-emitting layer is preferably 0.01 to 50% by weight, more preferably 0.1 to 15% by weight, even more preferably 0.1 to 5% by weight. In the case where the spacer layer has a multilayer configuration, the thickness of each layer is preferably 0.1 nm or more, more preferably 0.3 nm or more, even more preferably 0.5 nm or more, and is also preferably 5 nm or less.

In the case where a light-emitting layer is doped and emission is made outside from the light-emitting layer, emission toward the outside from an exciplex may not be observed. Such an embodiment is also included as a part of the present invention. For example, by transferring the excited triplet energy of an exciplex to the excited singlet of a doped fluorescence-emitting material via reverse intersystem crossing, the emission efficiency from the fluorescence-emitting material can be improved. Namely, as compared with a case where a fluorescence-emitting material is doped in a system not forming an exciplex, the case where a fluorescence-emitting material is doped in the spacer layer of the present invention can improve the emission efficiency from the fluorescence-emitting material.

The kind of the light-emitting material that may be doped in the present invention is not specifically limited. Preferably, a light-emitting material that secures high energy transfer efficiency from the exciplex formed in the present invention is selected and used. Consequently, it is preferable that a light-emitting material having an excited singlet energy lower than the excited singlet energy of an exciplex is selected. In the case where the light-emitting material to be doped is previously determined, preferably, the thickness of the spacer layer in the present invention is so controlled that the energy transfer toward the light-emitting material could be attained efficiently.

EXAMPLES

The features of the present invention will be described more specifically with reference to examples below. The materials, processes, procedures and the like shown below may be appropriately modified unless they deviate from the substance of the present invention. Accordingly, the scope of the present invention is not construed as being limited to the specific examples shown below. The emission characteristics were evaluated using Spectrophotometer (FP-6500-A-51, manufactured by Nippon JASCO Corporation), Absolute PL Quantum Yield Measurement System (C11347-01, manufactured by Hamamatsu Photonics K.K.), Fluorescence Lifetime Measurement System (Quantaurus-Tau, manufactured by Hamamatsu Photonics K.K.), and Streak Camera (C4334 Mode, manufactured by Hamamatsu Photonics K.K.). The HOMO level was measured using Photoemission Spectrometer (AC-3, manufactured by Riken Keiki Co., Ltd.). Each organic layer was formed according to a vacuum evaporation method at a vacuum degree of $5*10^{-5}$ Pa or less.

[Measurement of Excited Triplet Energy]

The excited triplet energy of each compound was measured for the vapor-deposited film thereof formed through vacuum evaporation in a thickness of 100 nm on a silicon substrate. The excited triplet energy of exciplex was measured for the co-deposited film thereof formed through vacuum evaporation in a thickness of 100 nm in a molar ratio of m-MTDATA and T2T. Concretely, each vapor-deposited film was cooled to a temperature of 10 K using a cryostat, and the phosphorescence spectrum thereof was measured using a nitrogen gas laser having a wavelength of 337 nm as an excitation light source and suing a streak camera. In the measured phosphorescence spectrum, the energy at the peak wavelength measured on the shortest wavelength side was referred to as the triplet energy of the sample.

[Measurement and Result of Excited Singlet Energy of Exciplex]

For the co-deposited film formed under the same condition as that in measurement of the excited triplet energy mentioned above, the emission spectrum thereof was measured using a fluorescence spectrum meter, and from the peak wavelength thereof, the excited singlet energy of the exciplex was estimated.

[Measurement of HOMO and LUMO Energy Level]

For the co-deposited film formed under the same condition as that in measurement of the excited triplet energy mentioned above, the HOMO energy level was measured using a photoelectron spectrometer. In addition, using a spectrophotometer, the absorption end energy of each deposited film was measured, and this was defined as an energy gap. A position higher by the measured energy gap than the HOMO energy level was referred to as a LUMO energy level.

(Compounds Used in Examples)

In the Examples, m-MTDATA was used as a donor compound, mCBP was used as a spacer compound, and T2T was used as an acceptor compound. The structures of these compounds are shown below. The excited triplet energy of m-MTDATA measured according to the above-mentioned method was 2.67 eV, the excited triplet energy of T2T was 2.80 eV, and the excited triplet energy of the exciplex formed by m-MTDATA and T2T was 2.36 eV.

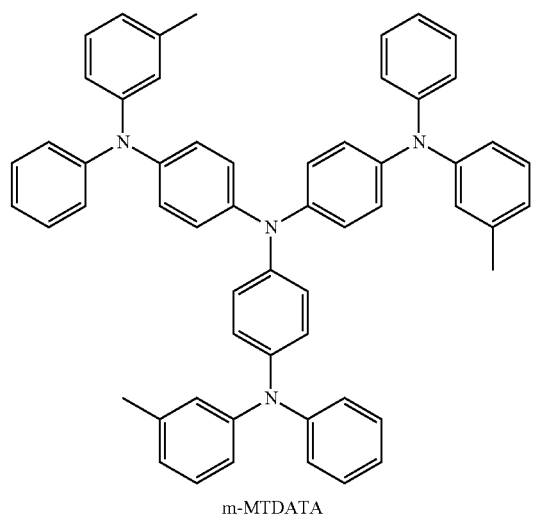

m-MTDATA

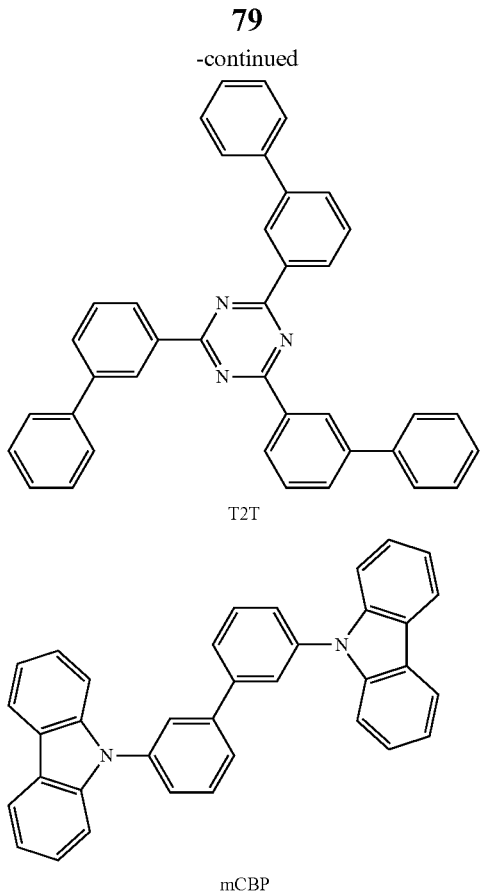

T2T

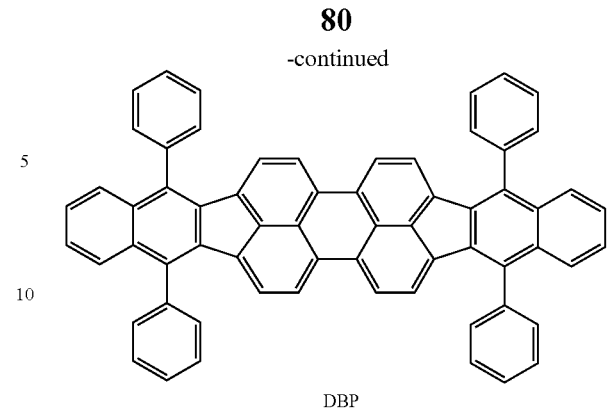

DBP

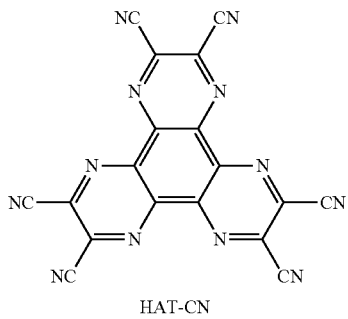

mCBP

Other compounds than the donor compound, the spacer compound and the acceptor compound used in the Examples are shown below.

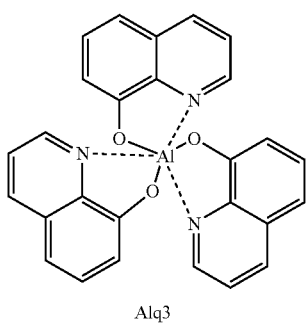

HAT-CN

Alq3

Experimental Example 1

Investigation of Photoluminescence Characteristic of Co-Deposited Film

On a quartz substrate, a co-deposited film of m-MTDATA and T2T in a molar ratio of 1/1 was formed to have a thickness of 50 nm according to a vacuum evaporation method from different evaporation sources of m-MTDATA and T2T under the condition of a vacuum degree of $5 \times 10^{-5}$ Pa or less.

Apart from this, a co-deposited film of m-MTDATA and mCBP in a molar ratio of 1/1 or a co-deposited film of mCBP and T2T in a molar ratio of 1/1 was formed to have a thickness of 50 nm on a silicon substrate according to a vacuum evaporation method under the condition of a vacuum degree of $5*10^{-5}$ Pa or less.

Figure 3:
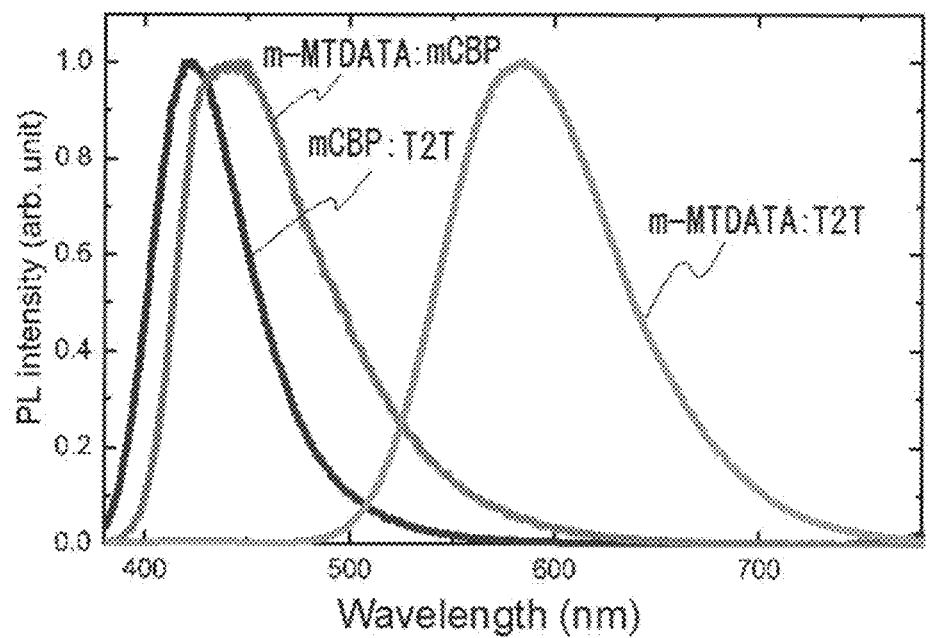
FIG. 3 This is a graph of emission spectra of a co-vapor-deposited film of m-MTDATA and T2T, a co-vapor-deposited film of m-MTDATA and mCBP, and a co-vapor-deposited film of mCBP and T2T.

The emission spectra of the resultant co-deposited films with an excitation light at 337 nm were measured, and the results are shown in FIG. 3. In the drawing, "m-MTDATA:T2T" indicates the co-deposited film of m-MTDATA and T2T, "m-MTDATA:mCBP" indicates the co-deposited Film of m-MTDATA and mCBP, and "mCBP:T2T" indicates the co-deposited film of mCBP and T2T. The photoluminescence quantum efficiency of the co-deposited film of m-MTDATA and T2T was 5%.

From FIG. 3, it is known that the emission peak of the co-deposited film of m-MTDATA and T2T is 585 nm and is on the red region side, as compared with the emission peak of the other co-deposited films. Emission spectra of a mono-deposited film of m-MTDATA and a mono-deposited film of T2T were measured, in which the emission peak was about 430 nm and about 500 nm, respectively, and as compared with these, the emission peak of the co-deposited film of m-MTDATA and T2T is shifted to the red region side. From these, it is confirmed that, through photoexcitation, an exciplex was formed in the co-deposited film of m-MTDATA and T2T.

Figure 4:
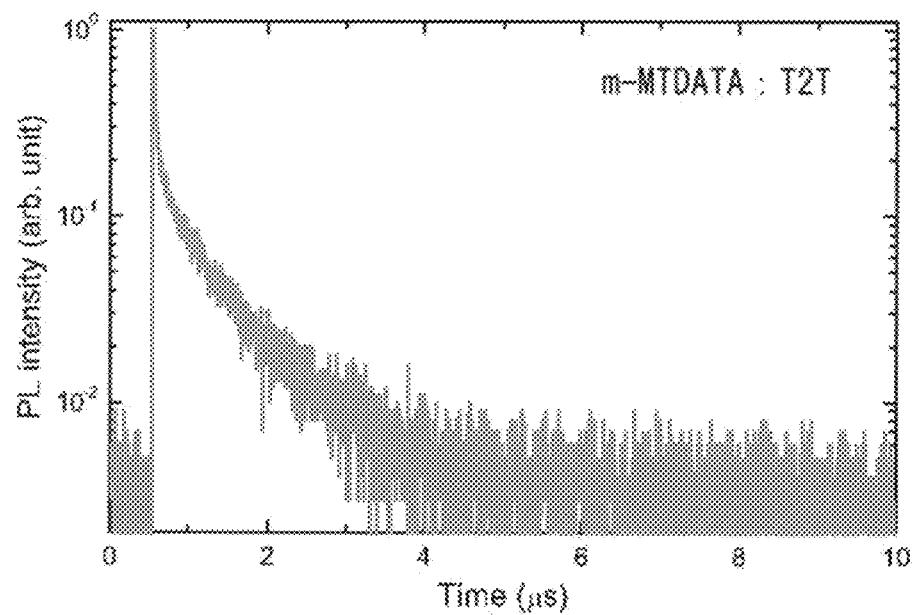
FIG. 4 This is a graph showing a transient decay curve of a co-vapor-deposited film of m-MTDATA and T2T.
Figure 5:
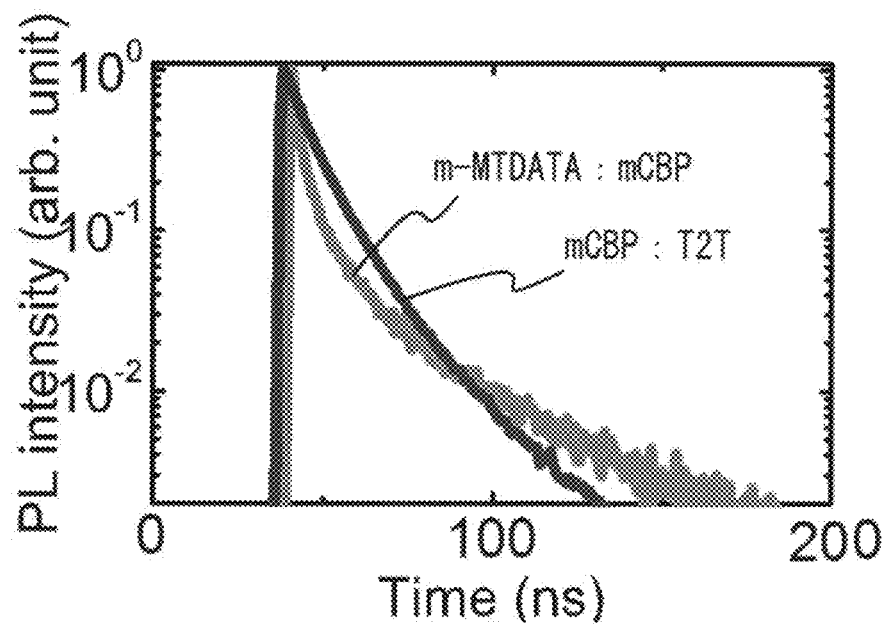
FIG. 5 This is a graph showing transient decay curves of a co-vapor-deposited film of m-MTDATA and mCBP and a co-vapor-deposited film of mCBP and T2T.

FIG. 4 shows the results of a transient decay curve of a co-deposited film of m-MTDATA and T2T measured with an excitation light at 337 nm at 300 K; and FIG. 5 shows the results of a transient decay curve of a co-deposited film of m-MTDATA and mCBP and a co-deposited film of mCBP and T2T measured under the same condition.

In the transient decay curve of the co-deposited film of m-MTDATA and T2T, a fluorescent component of rapid decay and a delayed fluorescent component of slow decay are observed, and the emission lifetime of the fluorescent component of rapid decay was 33 ns and that of the delayed fluorescent component was 0.7 μs. An emission spectrum of each fluorescent component was measured, and the emission spectrum of the delayed fluorescent component was nearly the same as the emission spectrum of the fluorescent component of rapid decay. From these, it is confirmed drat m-MTDATA and T2T are thermal activation-type delayed fluorescent materials to form art exciplex. The emission lifetime measured with the co-deposited film of m-MT-DATA and mCBP and the co-deposited film of mCBP and m-MTDATA was only less than 100 ns, and a delayed fluorescent component was not observed in these films.

Experimental Example 2

Investigation of Photoluminescence Characteristic of Laminate having Donor Layer of m-MTDATA, Spacer Layer of mCBP and Acceptor Layer of T2T in That Order On a quartz substrate, a donor layer was formed through vapor deposition of m*MTDATA to have a thickness of 10 nm according to a vacuum evaporation method under the condition of a vacuum degree of $5*10^{-5}$ Pa or less, and on this, a spacer layer of mCBP was formed through vapor deposition, and further an acceptor layer of m-MTDATA was formed to have a thickness of 20 nm through vapor deposition, thereby producing a laminate, in this case, the thickness of the spacer layer was varied within a range of 1 to 15 nm, and 7 kinds of laminates each having a different spacer layer thickness were produced.

Apart from this, a laminate having a donor layer and an acceptor layer was produced according to the same process as above except that a spacer layer was not formed.

Figure 6:
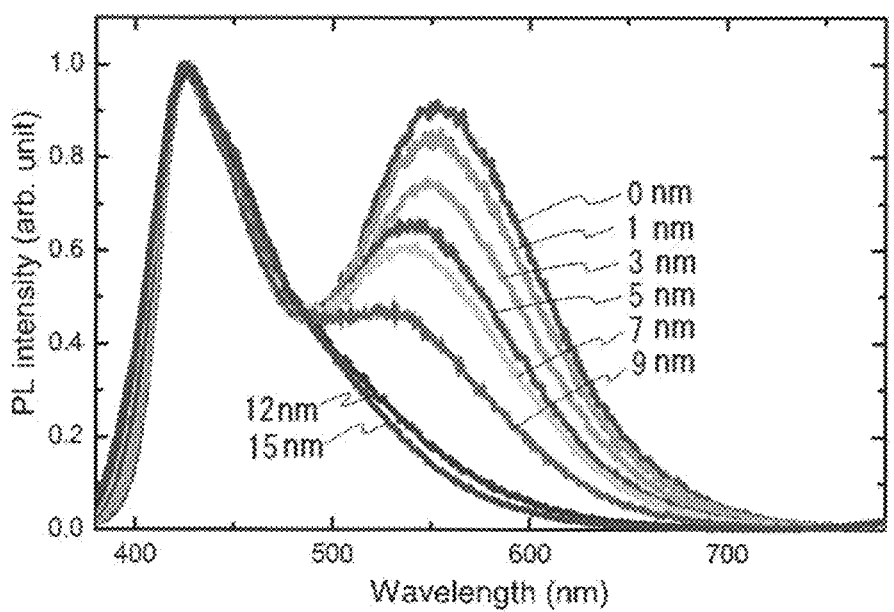
FIG. 6 This is a graph of emission spectra of various kinds of laminates each containing a donor layer of m-MTDATA, a spacer layer of mCBP, and an acceptor layer of T2T, and differing from each other in the thickness of the spacer layer.

The resultant laminates were irradiated with an excitation light at 337 nm from the donor side thereof, and the resultant, emission spectra are shown in FIG. 6.

From FIG. 6, it is known that the emission spectra of the laminate vary depending on the thickness of the spacer layer therein, and the emission peak shifts in a broad wavelength range of from about 560 nm to about 425 nm while the thickness of the spacer layer changed from 0 nm to 12 nm.

Example 1

Production and Evaluation of Organic Electroluminescent Device Having Donor Layer of m-MTDATA, Spacer Layer of mCBP and Acceptor Layer of T2T in That Order On a glass substrate having, formed thereon, an anode of indium-tin oxide (ITO) having a thickness of 100 nm, each thin film was layered according to a vacuum evaporation method at a vacuum degree of $5*10^{-5}$ Pa or less. First, on ITO, HAT-CN was formed to have a thickness of 10 nm. Next, m-MTDATA was vapor-deposited thereon to have a thickness of 10 nm, thereby forming a donor layer thereon. Further on this, mCBP was vapor-deposited to form a spacer layer, and then, T2T was vapor-deposited to have a thickness of 20 nm thereby forming an acceptor layer thereon. Next, Alq3 was formal to have a thickness of 30 nm, and further, lithium fluoride (LiF) was vapor-deposited to have a thickness of 5 nm, and then aluminum (Al) was vapor-deposited to have a thickness of 100 nm, thereby forming a cathode, and thus, an organic electroluminescent device (organic EL device) was produced. In this case, the thickness of the spacer layer was varied within a range of 1 to 15 nm, and 7 kinds of organic EL devices each having a different spacer layer thickness were thus produced.

In addition, an organic electroluminescent device (organic EL device) not having a spacer layer was produced according to the same process as above except that a spacer layer was not formed.

Figure 7:
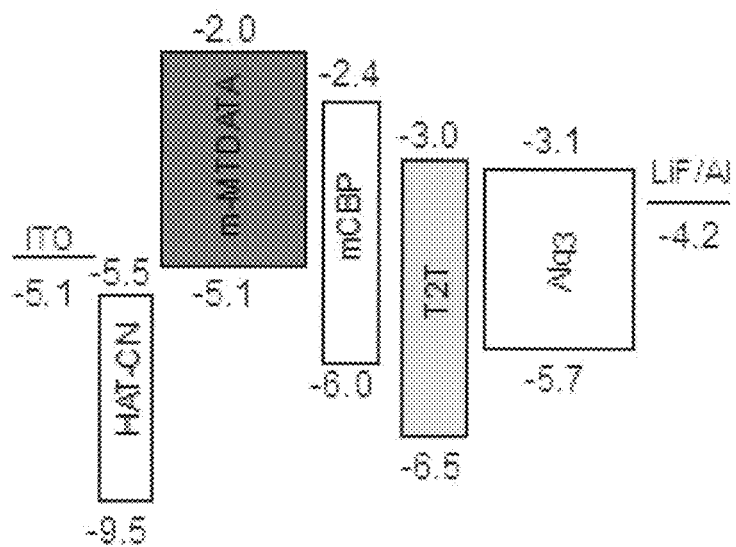
FIG. 7 This is an energy diagram of the organic electroluminescent devices produced in Example 1.

FIG. 7 shows an energy diagram of the resultant organic electroluminescent devices.

Figure 13:
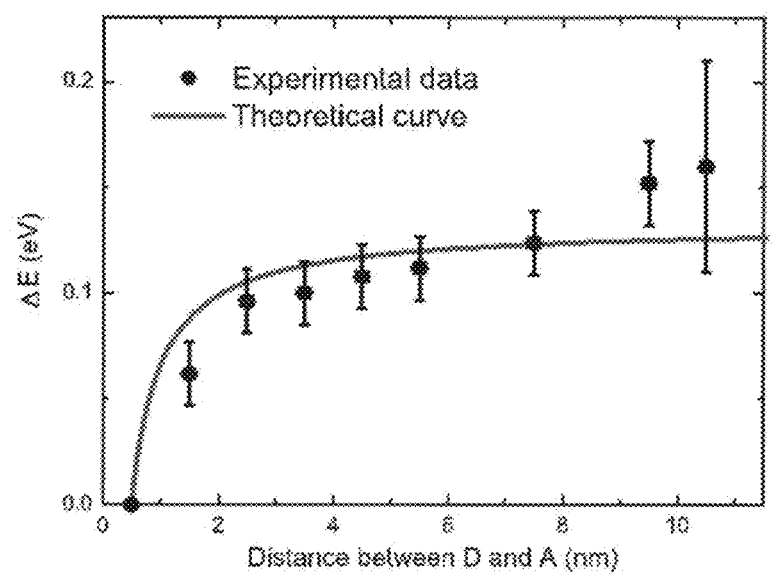
FIG. 13 This is a graph showing a relationship between a distance between the donor layer and the acceptor layer and an exciton energy in the organic electroluminescent device of Example 1 having a donor layer of m-MTDATA, a spacer layer of mCBP and an acceptor layer of T2T in that order.
Figure 14:
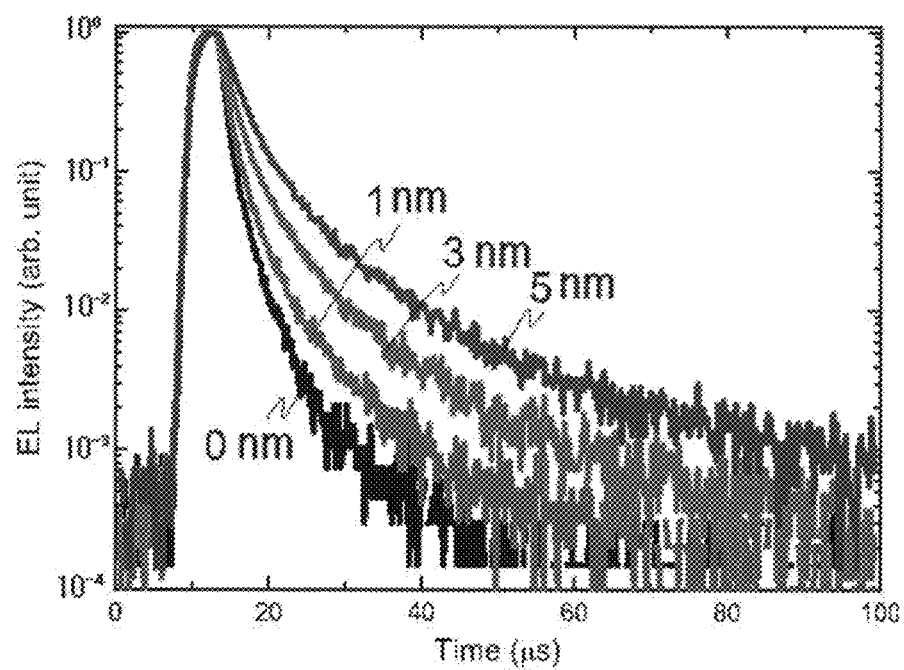
FIG. 14 This is a graph showing transient transient decay curves of various kinds of organic electroluminescence devices of Example 1 having a donor layer of m-MTDATA, a spacer layer of mCBP and an acceptor layer of T2T in that order and differing from each other in the thickness of the spacer layer, and an organic electroluminescent device not having a spacer layer.
Figure 15:
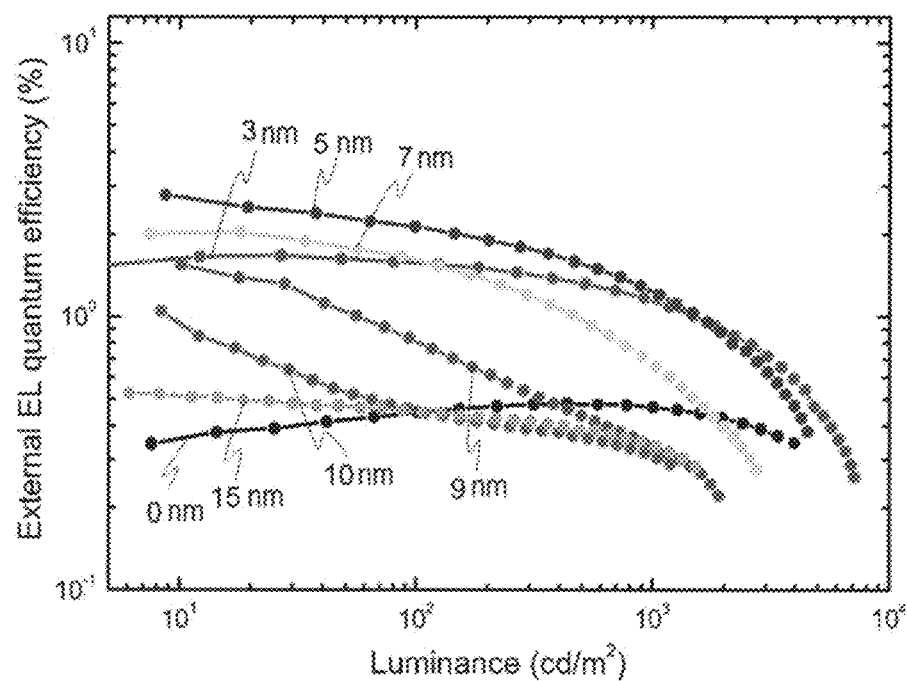
FIG. 15 This is a graph showing luminance-external quantum efficiency characteristic of various kinds of organic electroluminescence devices of Example 1 having a donor layer of m-MTDATA, a spacer layer of mCBP and an acceptor layer of T2T in that order and differing from each other in the thickness of the spacer layer, and an organic electroluminescent device not having a spacer layer.

FIGS. 8 to 12 show the emission spectra of the resultant organic electroluminescent devices; FIG. 13 shows a relationship between a distance between the donor layer and the acceptor layer and an exciton energy; FIG. 14 shows transient transient decay curves; and FIG. 15 shows luminance-external quantum efficiency characteristics. Among FIGS. 8 to 12, FIG. 8 shows emission spectra measured at a current density of 1000 $cd/m^2$, and FIGS. 9 to 12 shows emission spectra of organic EL devices having a spacer layer thickness of 0 nm, 5 nm, 9 nm or 10 nm measured at a different current density, in FIG. 13, "ΔE" means an energy difference between the exciton energy of each organic EL device and the exciton energy of the organic EL device having a spacer layer thickness of 5 nm. The exciton energy of each organic EL device was determined from the peak wavelength of the emission spectrum thereof.

Figure 8:
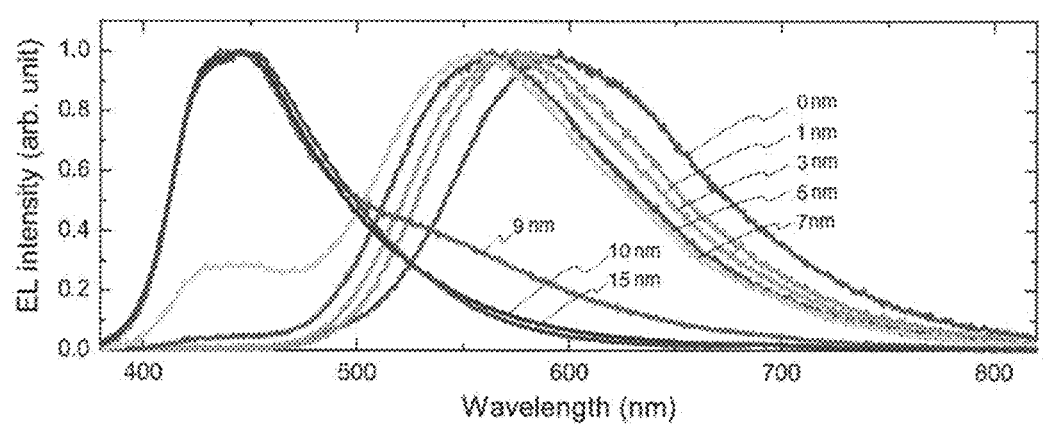
FIG. 8 This is a graph showing emission spectra of various kinds of organic electroluminescent devices of Example 1 having a donor layer of m-MTDATA, a spacer layer of mCBP and an acceptor layer of T2T in that order and differing from each other in the thickness of the spacer layer, and an organic electroluminescent device not having a spacer layer.
Figure 9:
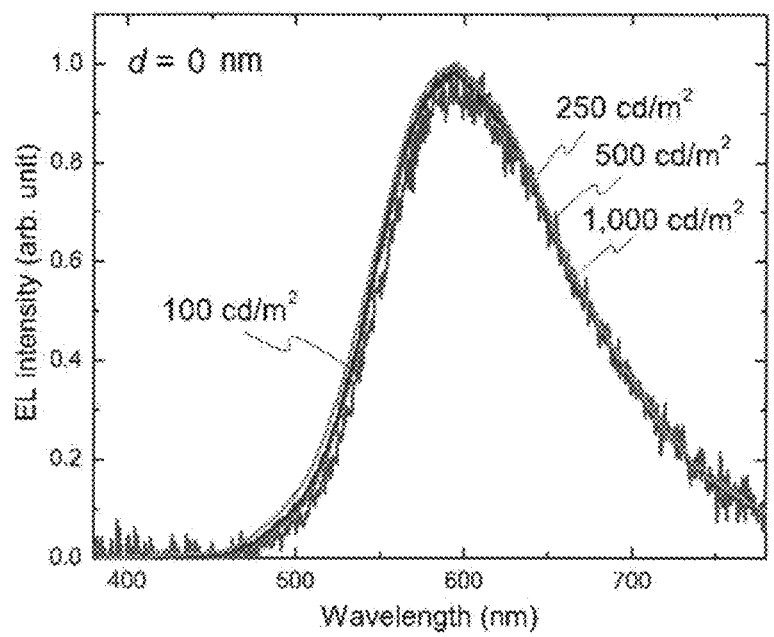
FIG. 9 This is a graph showing emission spectra of organic electroluminescent devices not having a spacer layer.
Figure 10:
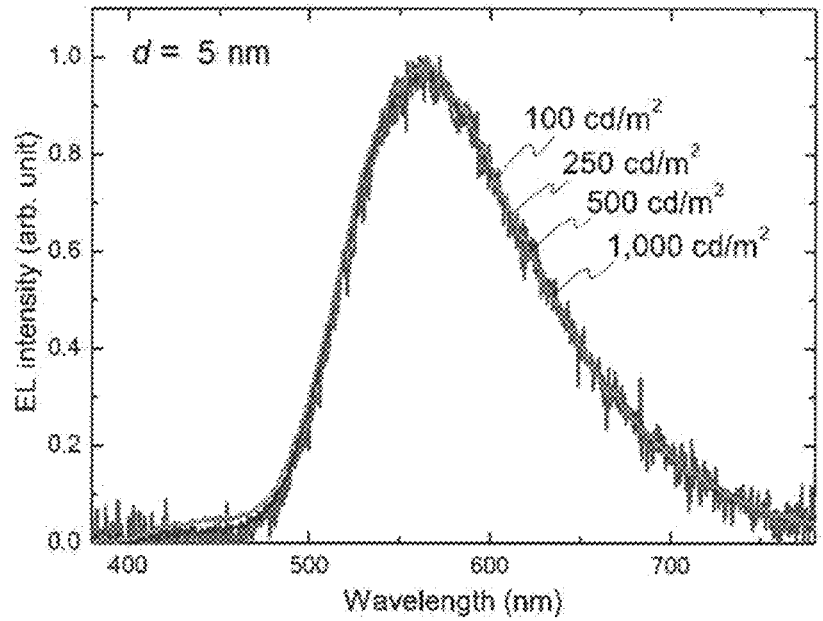
FIG. 10 This is a graph showing emission spectra of the organic electroluminescent device of Example 1, in which the thickness of the spacer layer is 5 nm.
Figure 11:
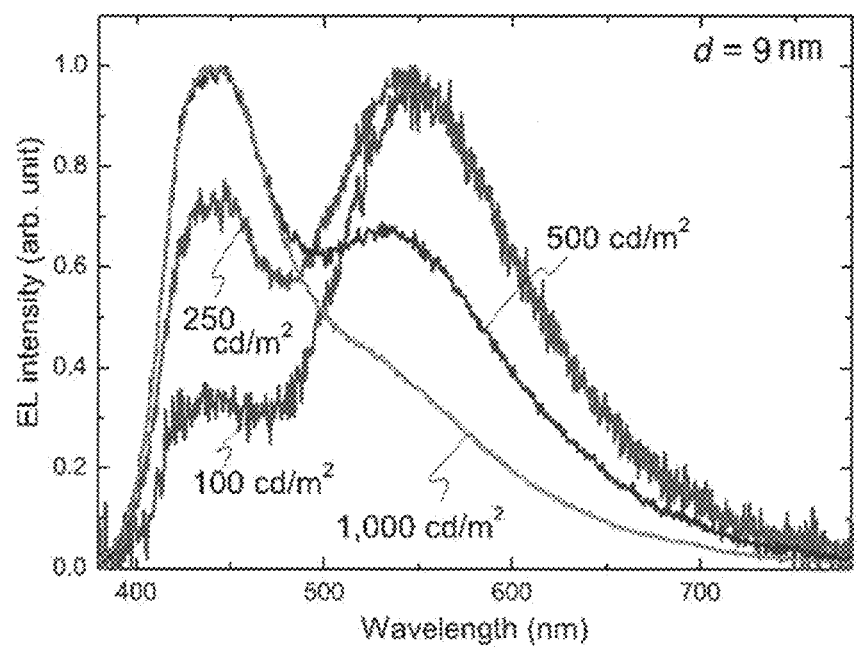
FIG. 11 This is a graph showing emission spectra of the organic electroluminescent device of Example 1, in which the thickness of the spacer layer is 9 nm.
Figure 12:
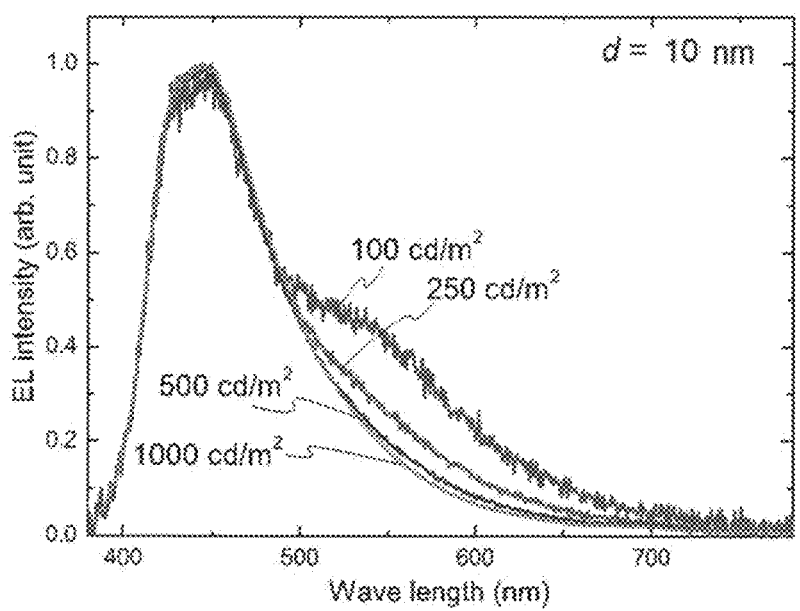
FIG. 12 This is a graph showing emission spectra of the organic electroluminescent device of Example 1, in which the thickness of the spacer layer is 10 nm.

From FIG. 8, it is known that the emission spectrum of the organic EL device varies depending on the thickness of the spacer layer therein, and that the emission spectrum shifts in a broad wavelength range of from about 600 nm to about 430 nm while the thickness of the spacer layer varies from 0 to 10 nm. From this, it is known that the emission color of the organic EL device can be controlled in a broad range by controlling the thickness of the spacer layer therein.

In the transient decay curves of FIG. 14, a fluorescent component of rapid decay and a delayed fluorescent component are observed, and the lifetime of the delayed fluorescent component was 4.3 μs when the thickness of the spacer layer was 0 nm, 8.1 μs when the thickness was 3 nm, and 13.2 μs when the thickness was 5 nm.

As in FIG. 15, the spacer layer formed therein increased the external quantum efficiency of the organic EL device, and in particular, in a range of the spacer layer thickness of 10 nm or less, a noticeable increase in the external quantum efficiency was recognized. In a range of the spacer layer thickness of 0 to 5 nm, the external quantum efficiency increased with the increase in the thickness, and the external quantum efficiency (2.8%) of the organic EL device having a spacer thickness of 5 nm was 8 times the external quantum efficiency of the organic EL device having a spacer layer thickness of 0 nm. The increase in the external quantum efficiency depending on the spacer layer thickness coordinates with the increase in the delayed fluorescent component shown in FIG. 15, and it is confirmed that the donor compound (m -MTDATA) and the acceptor compound (T2T) that are compounds to radiate delayed fluorescence greatly contribute toward improving the external quantum efficiency of the organic EL device.

Comparative Example 1

Production and Evaluation of Organic Electroluminescent Device Having Donor Layer, ADN Layer and Acceptor Layer in That Order An organic electroluminescent device (organic EL device) was produced in the same manner as in Example 1 except that ADN was vapor-deposited to form an ADN layer having a thickness of 5 nm in place of forming a spacer layer through vapor deposition of mCBP. Here, the excited triplet energy of ADN measured according to the measurement method mentioned above was 1.69 eV, and was lower than the excited triplet energy (2.36 eV) of the exciplex formed by m-MTDATA and T2T.

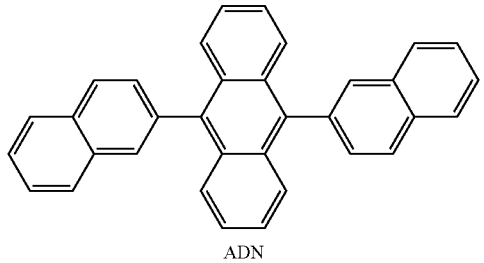 [SMILES: c1ccc2cc(-c3c4ccccc4c(-c4ccc5ccccc5c4)c4ccccc34)ccc2c1]

ADN

Figure 16:
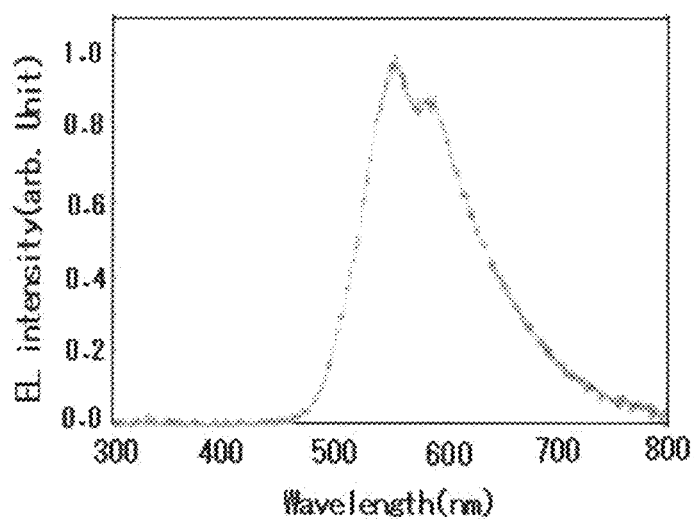
FIG. 16 This is an emission spectrum of the organic electroluminescent device of Comparative Example 1 having a donor layer of m-MTDATA, an ADN layer and an acceptor layer of T2T in that order.
Figure 17:
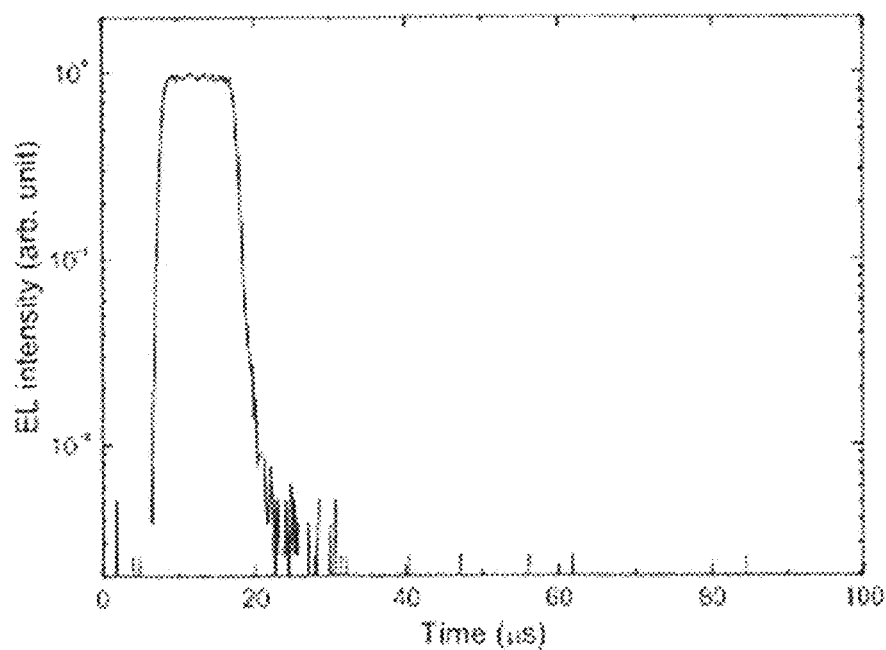
FIG. 17 This is a transient decay curve of the organic electroluminescent device of Comparative Example 1 having a donor layer of m-MTDATA, an ADN layer and an acceptor layer of T2T in that order.
Figure 18:
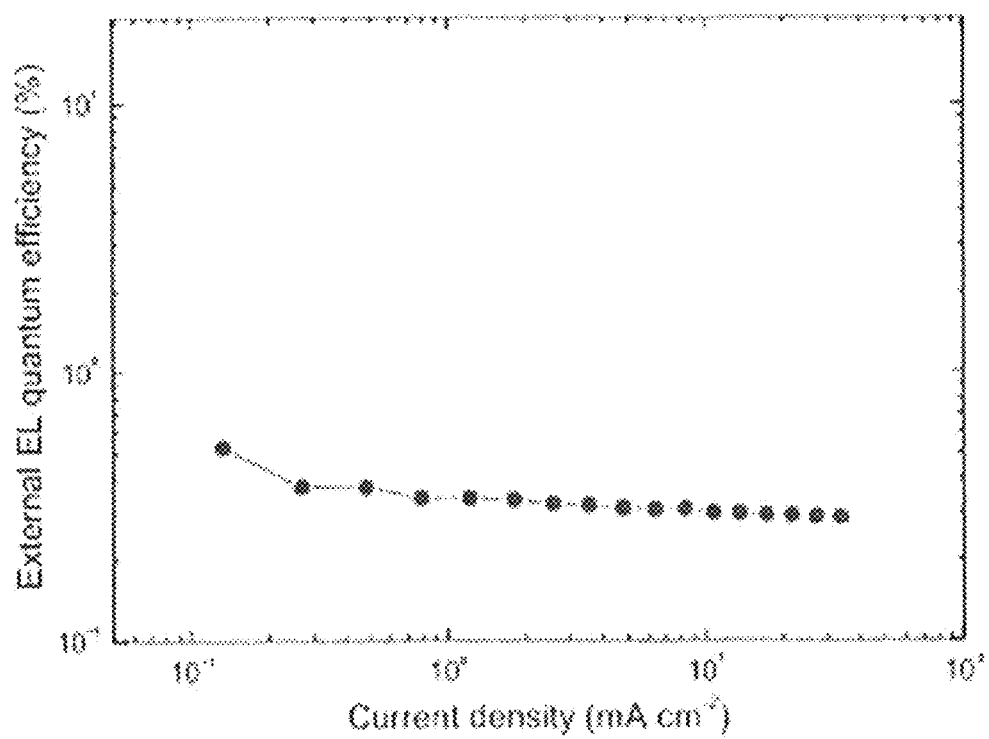
FIG. 18 This is a graph showing a current density-external quantum efficiency characteristic of the organic electroluminescent device of Comparative Example 1 having a donor layer of m-MTDATA, an ADN layer and an acceptor layer of T2T in that order.

FIG. 16 shows an emission spectrum of the resultant organic EL device, FIG. 17 shows a transient decay curve thereof, and FIG. 18 shows a current density -external quantum efficiency characteristic thereof.

From the transient decay curve of FIG. 17, a delayed fluorescent component is not recognized, and from FIG. 18, the external quantum efficiency of the organic EL device was less than 0.5%. In that manner, the organic EL device does not show any delayed fluorescent component and the external quantum efficiency thereof is low, and from this, it may be presumed that, since the excited triplet energy of ADN existing between the donor layer and the acceptor layer is smaller than the excited triplet energy of the exciplex, the triplet exciton of the exciplex would have moved to ADN disappeared. Accordingly, it is known that, for attaining a high emission efficiency, the compound of the spacer layer existing between the donor layer and the acceptor layer need to have a higher excited triplet energy than the excited triplet energy of the exciplex to be formed of the donor compound and the acceptor compound.

Example 2

Production and Evaluation of Organic Electroluminescent Device Having Spacer Layer Doped with Light-Emitting Material An organic electroluminescent device was produced in the same manner as in Example 1 except that the spacer layer of mCBP in Example 1 was changed to a three-layered spacer layer composed of a first layer of mCBP (1.5 nm thick), a second layer of mCBP and a fluorescent material DBP (2 nm thick) and a third layer of mCBP (1.5 nm thick). The mCBP concentration in the second layer was 2% by weight.

Figure 19:
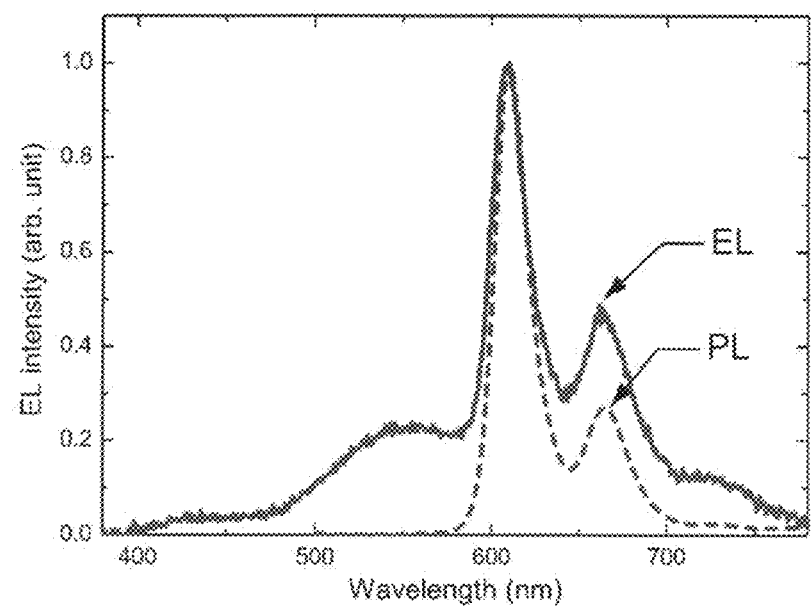
FIG. 19 This is a graph showing emission spectra of the organic electroluminescent device of Example 2 having a three-layer structure containing a second layer doped with DBP and having a spacer layer, and a thin film doped with DBP.

The emission spectrum of the resultant organic electroluminescent device is shown in FIG. 19 as "EL". In FIG. 19, a photoluminescence emission spectrum of a thin film formed by co-evaporation of 2 wt % DBP with mCBP is shown as "PL". The emission peak wavelength of EL and PL is the same, from which it is known that the emission from the organic electroluminescent device of Example 2 is the emission from the light-emitting material, DBP. The external quantum efficiency of the organic electroluminescent device of Example 2 was 2.4%.

Figure 20:
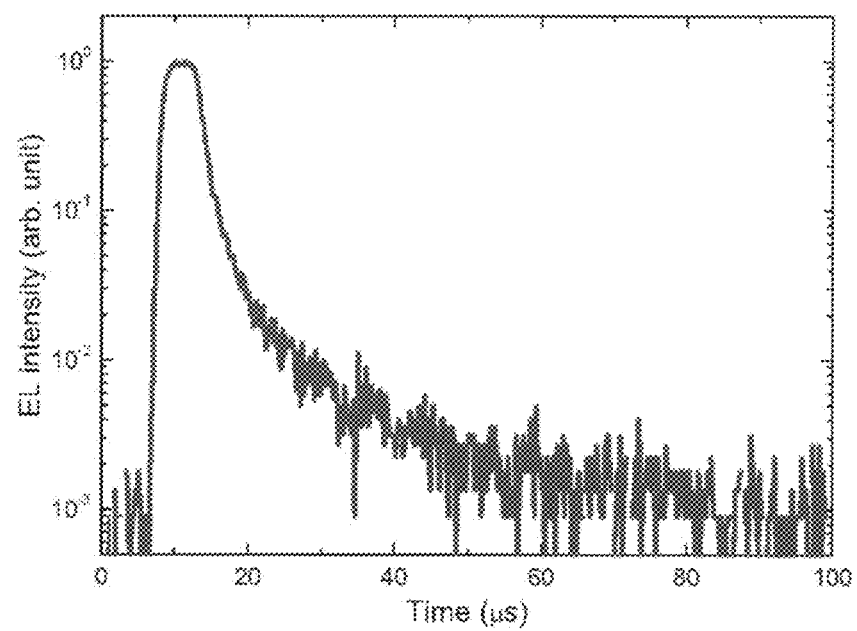
FIG. 20 This is a transient decay curve of the organic electroluminescent device of Example 2 having a three-layer structure containing a second layer doped with DBF and having a spacer layer.

FIG. 20 shows a transient decay curve of the organic electroluminescent device of Example 2. The lifetime of the delayed fluorescent component was 5 µs. The organic electroluminescent device of Example 2 contained a fluorescent component of rapid decay and a delayed fluorescent component of slow decay, and the emission spectrum of the two was the same. This indicates excited triplet energy transfer of exciplex to excited singlet of DBP via reverse intersystem crossing.

INDUSTRIAL APPLICABILITY

The organic electroluminescent device of the present invention can readily control emission wavelength. Consequently, the organic electroluminescent device of the present invention can radiate various colors, and is therefore useful for various devices such as image display devices and lighting devices. Accordingly, the industrial applicability of the present invention is high.

REFERENCE SIGNS LIST

1 Substrate
2 Anode
3 Donor Layer
4 Spacer Layer
5 Acceptor Layer
6 Cathode
7 Hole Injection Layer
8 Electron Injection Layer

The invention claimed is:

1. An organic electroluminescent device having a donor layer containing a donor compound, a spacer layer containing a spacer compound, and an acceptor layer containing an acceptor compound in that order, wherein:
  the donor compound and the acceptor compound are compounds to form an exciplex to radiate delayed fluorescence, and
  the excited triplet energy of the spacer compound is higher than the excited triplet energy of the exciplex.

2. The organic electroluminescent device according to claim 1, wherein the spacer layer has a thickness of 10 nm or less.

3. The organic electroluminescent device according to claim 1, wherein the acceptor compound and the donor compound satisfy the requirements represented by the following expressions (1) to (4):

$T_1^A - S_1 > 0.2$ eV                 Expression (1)

$T_1^D - S_1 \geq 0.2$ eV               Expression (2)

$|LUMO^A| > 2.0$ eV                    Expression (3)

$|HOMO^D| \leq 5.3$ eV                 Expression (4)

wherein $T_1^A$ represents an excited triplet energy defined by the peak wavelength on the short wavelength side in the phosphorescence spectrum of the acceptor compound; $T_1^D$ represents an excited triplet energy defined by the peak wavelength on the short wavelength side in the phosphorescence spectrum of the donor compound; $S_1$ represents an excited singlet energy of the exciplex defined by the peak wavelength in exciplex emission observed in the layer containing the acceptor compound and the donor compound in a molar ratio of 1/1; $LUMO^A$ represents an energy level of LUMO of the acceptor compound; and $HOMO^D$ represents an energy level of HOMO of the donor compound.

4. The organic electroluminescent device according to claim 1, wherein, when the excited triplet energy of the exciplex defined by the peak wavelength on the short wavelength side in the phosphorescence spectrum of exciplex emission observed in the layer containing the acceptor compound and the donor compound in a molar ratio of 1/1 is represented by $T_1$, and when the excited triplet energy defined by the peak wavelength on the short wavelength side in the phosphorescence spectrum of the spacer compound is represented by $T_1^s$, the excited triplet energy difference $(T_1-T_1^s)$ is −0.01 to −0.5 eV.

5. The organic electroluminescent device according to claim 1, wherein the difference between the excited singlet energy $S_1$ and the excited triplet energy $T_1$ of the exciplex, $\Delta E_{st}$ is 0.01 to 0.3 eV.

6. The organic electroluminescent device according to claim 1, wherein the HOMO level of the spacer compound is lower than the HOMO level of the donor compound, and the LUMO level of the spacer compound is higher than the LUMO level of the acceptor compound.

7. The organic electroluminescent device according to claim 1, wherein the donor compound is a compound represented by the following formula (1) or a derivative of the compound represented by the following formula (1), and the acceptor compound is a compound represented by the following formula (2) or a derivative of the compound represented by the following formula (2):

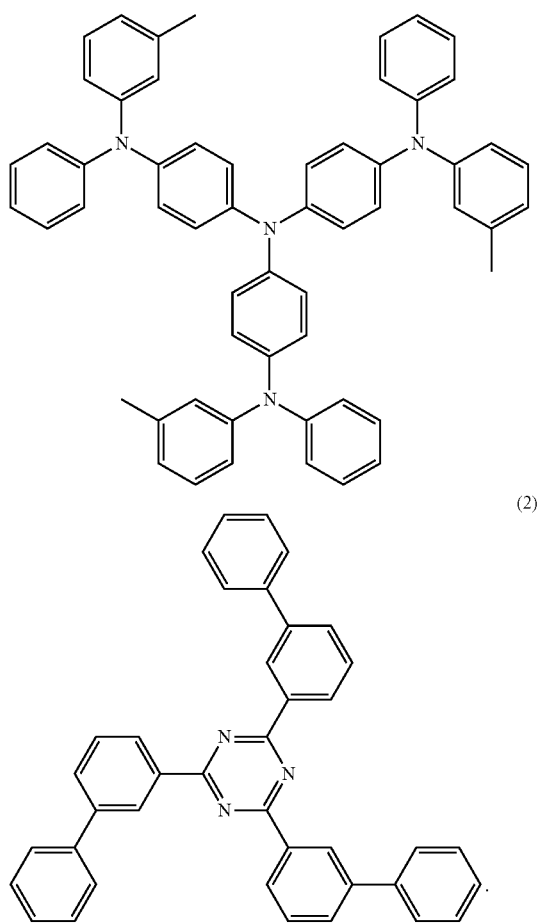

(1)

(2)

8. The organic electroluminescent device according to claim 1, wherein the spacer compound is a compound represented by the following formula (3) or a derivative of the compound represented by the following formula (3):

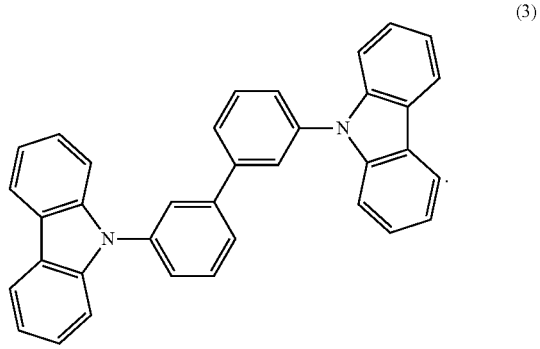 [SMILES: c1cc(-c2cccc(-n3c4ccccc4c4ccccc43)c2)cc(-n2c3ccccc3c3ccccc32)c1]

(3)

9. The organic electroluminescent device according to claim 1, wherein the spacer layer has a multilayer structure.

10. The organic electroluminescent device according to claim 1, wherein the spacer layer contains a light-emitting layer, and the light-emitting layer emits light.

11. The organic electroluminescent device according to claim 1, wherein, by changing the thickness of the spacer layer, the emission wavelength varies.

12. The organic electroluminescent device according to claim 1, wherein, by changing the thickness of the spacer layer, the emission wavelength varies at least within a range of 5 to 100 nm.

13. The organic electroluminescent device according to claim 1, wherein the external quantum efficiency at 50 cd/m² is larger than that of an organic electroluminescent device having the same configuration but not having a spacer layer.

14. A device array containing two or more kinds of organic electroluminescent devices each having a donor layer containing a donor compound, a spacer layer containing a spacer compound, and an acceptor layer containing an acceptor compound in that order, wherein:
the donor compound and the acceptor compound are compounds to form an exciplex to radiate delayed fluorescence, and
the excited triplet energy of the spacer compound is higher than the excited triplet energy of the exciplex, and wherein:
the two or more kinds of organic electroluminescent devices differ from each other in the thickness of the spacer layer therein.

15. The device array according to claim 14, wherein the donor compounds used in the two or more kinds of electroluminescent devices are the same.

16. The device array according to claim 14, wherein the acceptor compounds used in the two or more kinds of electroluminescent devices are the same.

17. The device array according to claim 14, wherein the spacer compounds used in the two or more kinds of electroluminescent devices are the same.

18. The device array according to claim 14, wherein the two or more kinds of electroluminescent devices are entirely the same in the configuration of the donor layer, the spacer layer and the acceptor layer except for the thickness of the spacer layer.

19. The device array according to claim 14, wherein the two or more kinds of organic electroluminescent devices differ from each other in the emission wavelength.

20. The device array according to claim 14, further having a substrate to support the two or more kinds of organic electroluminescent devices and wherein the two or more kinds of organic electroluminescent devices are arranged on the same substrate.

21. The device array according to claim 14, wherein the two or more kinds of organic electroluminescent devices each are individualized.

* * * * *